US012810365B2

(12) United States Patent
Cella et al.

(10) Patent No.: US 12,810,365 B2
(45) Date of Patent: Nov. 24, 2026

(54) PROCESS-AWARE AI PLATFORM FOR ORCHESTRATION AND MANAGEMENT OF POWER AND ENERGY

(71) Applicant: Strong Force EE Portfolio 2022, LLC, Fort Lauderdale, FL (US)

(72) Inventors: Charles H. Cella, Pembroke, MA (US); Andrew Cardno, San Diego, CA (US)

(73) Assignee: Strong Force EE Portfolio 2022, LLC, Fort Lauderdale, FL (US)

( * ) Notice: Subject to any disclaimer, the term of this patent is extended or adjusted under 35 U.S.C. 154(b) by 0 days.

(21) Appl. No.: 18/180,249

(22) Filed: Mar. 8, 2023

(65) Prior Publication Data

US 2023/0251291 A1 Aug. 10, 2023

Related U.S. Application Data

(63) Continuation-in-part of application No. PCT/US2022/050932, filed on Nov. 23, 2022, and a (Continued)

(51) Int. Cl.
*G05B 19/00* (2006.01)
*G01R 21/133* (2006.01)
(Continued)

(52) U.S. Cl.
CPC ........... *G06Q 50/06* (2013.01); *G01R 21/133* (2013.01); *G05B 13/0265* (2013.01); (Continued)

(58) Field of Classification Search
None
See application file for complete search history.

(56) References Cited

U.S. PATENT DOCUMENTS 6,591,255 B1 7/2003 Tatum
8,401,708 B2 3/2013 Nagata
(Continued)

FOREIGN PATENT DOCUMENTS

CN 107742900 A 2/2018
CN 111799840 A 10/2020
(Continued)

OTHER PUBLICATIONS

Siemens, Interactive Grid Edge, https://new.siemens.com/content/dam/internet/siemens-com/global/company/topic-areas/smart-infrastructure/grid-edge/application-pages/8794_grid-edge-interactive_201113/, accessed on Oct. 2, 2023.
(Continued)

*Primary Examiner* — Paul B Yanchus, III
(74) *Attorney, Agent, or Firm* — Miller Johnson

(57) ABSTRACT

An AI-based platform for enabling intelligent orchestration and management of power and energy is disclosed. The AI-based platform includes an artificial intelligence system that is configured to perform an analysis of a pattern of energy associated with an operating process that involves a set of resources, the resources being at least partially independent of an electrical grid, and output a set of operating parameters to provision energy generation, storage, and/or consumption to enable the operating process, wherein the set of operating parameters is based on the analysis. In some embodiments, at least one operating parameter in the set of operating parameters is a generation output level for a distributed energy generation resource, a target storage level for a distributed energy storage resource, and/or a delivery timing for a distributed energy delivery resource.

24 Claims, 21 Drawing Sheets

Related U.S. Application Data continuation of application No. PCT/US2022/050924, filed on Nov. 23, 2022.

(60) Provisional application No. 63/375,225, filed on Sep. 10, 2022, provisional application No. 63/302,016, filed on Jan. 21, 2022, provisional application No. 63/299,727, filed on Jan. 14, 2022, provisional application No. 63/291,311, filed on Dec. 17, 2021, provisional application No. 63/282,510, filed on Nov. 23, 2021.

(51) Int. Cl.

| | |
|---|---|
| ***G05B 13/02*** | (2006.01) |
| ***G05B 13/04*** | (2006.01) |
| ***G05B 19/042*** | (2006.01) |
| ***G06F 1/26*** | (2006.01) |
| ***G06N 3/08*** | (2023.01) |
| ***G06N 5/043*** | (2023.01) |
| ***G06N 10/00*** | (2022.01) |
| ***G06N 20/00*** | (2019.01) |
| ***G06Q 10/067*** | (2023.01) |
| ***G06Q 30/018*** | (2023.01) |
| ***G06Q 50/02*** | (2012.01) |
| ***G06Q 50/06*** | (2012.01) |
| ***G06Q 50/26*** | (2012.01) |
| ***H02J 3/00*** | (2006.01) |
| ***H02J 3/32*** | (2006.01) |
| ***H02J 3/38*** | (2006.01) |
| ***H02J 13/10*** | (2026.01) |
| ***H02J 13/12*** | (2026.01) |
| ***H04L 41/0833*** | (2022.01) |
| ***H04L 41/14*** | (2022.01) |
| ***H04L 41/16*** | (2022.01) |
| *G06F 30/27* | (2020.01) |
| *H02J 101/40* | (2026.01) |
| *H02J 103/30* | (2026.01) |
| *H02J 103/35* | (2026.01) |

(52) U.S. Cl.

CPC .......... *G05B 13/04* (2013.01); *G05B 13/042* (2013.01); *G05B 19/042* (2013.01); *G06F 1/26* (2013.01); *G06N 3/08* (2013.01); *G06N 5/043* (2013.01); *G06N 10/00* (2019.01); *G06N 20/00* (2019.01); *G06Q 10/067* (2013.01); *G06Q 30/018* (2013.01); *G06Q 50/02* (2013.01); *G06Q 50/26* (2013.01); *H02J 3/003* (2020.01); *H02J 3/004* (2020.01); *H02J 3/32* (2013.01); *H02J 3/381* (2013.01); *H02J 13/10* (2026.01); *H02J 13/12* (2026.01); *H04L 41/0833* (2013.01); *H04L 41/145* (2013.01); *H04L 41/16* (2013.01); *G05B 2219/2639* (2013.01); *G06F 30/27* (2020.01); *G06Q 2220/00* (2013.01); *H02J 2101/40* (2026.01); *H02J 2103/30* (2026.01); *H02J 2103/35* (2026.01)

(56) References Cited

U.S. PATENT DOCUMENTS

| | | | | |
|---|---|---|---|---|
| 10,938,634 | B1 | 3/2021 | Cruise | |
| 11,007,891 | B1 * | 5/2021 | Kamal | H02J 13/00002 |
| 11,431,170 | B1 | 8/2022 | Guo | |
| 11,481,711 | B2 | 10/2022 | Hodges | |
| 11,676,219 | B2 | 6/2023 | Cella | |
| 11,816,540 | B2 | 11/2023 | Stadler | |
| 2002/0073086 | A1 | 6/2002 | Thompson | |
| 2004/0225648 | A1 | 11/2004 | Ransom | |
| 2005/0143953 | A1 | 6/2005 | Retsina | |
| 2009/0281674 | A1 | 11/2009 | Taft | |
| 2010/0238003 | A1 | 9/2010 | Chan | |
| 2010/0305889 | A1 | 12/2010 | Tomlinson, Jr. | |
| 2011/0046798 | A1 | 2/2011 | Imes | |
| 2011/0166889 | A1 | 7/2011 | Bain | |
| 2011/0172841 | A1 | 7/2011 | Forbes, Jr. | |
| 2011/0205033 | A1 | 8/2011 | Bandyopadhyay | |
| 2011/0231028 | A1 | 9/2011 | Ozog | |
| 2012/0029897 | A1 | 2/2012 | Cherian et al. | |
| 2013/0030581 | A1 * | 1/2013 | Luke | B60L 7/06 705/14.1 |
| 2013/0238266 | A1 | 9/2013 | Savvides | |
| 2013/0274936 | A1 | 10/2013 | Donahue et al. | |
| 2014/0277599 | A1 * | 9/2014 | Pande | H02J 3/32 700/22 |
| 2014/0277788 | A1 | 9/2014 | Forbes, Jr. et al. | |
| 2015/0268674 | A1 | 9/2015 | Mucignat | |
| 2015/0294308 | A1 | 10/2015 | Pauker | |
| 2015/0301548 | A1 | 10/2015 | Goparaju | |
| 2016/0190805 | A1 | 6/2016 | Steven | |
| 2016/0204606 | A1 | 7/2016 | Matan | |
| 2016/0333854 | A1 | 11/2016 | Lund | |
| 2017/0005515 | A1 | 1/2017 | Sanders | |
| 2017/0263111 | A1 | 9/2017 | Deluliis | |
| 2017/0279834 | A1 | 9/2017 | Vasseur et al. | |
| 2017/0358041 | A1 | 12/2017 | Forbes, Jr. et al. | |
| 2018/0052431 | A1 | 2/2018 | Shaikh et al. | |
| 2018/0284758 | A1 | 10/2018 | Cella et al. | |
| 2018/0299852 | A1 | 10/2018 | Orsini | |
| 2019/0005165 | A1 | 1/2019 | Meagher | |
| 2019/0026359 | A1 | 1/2019 | Park | |
| 2019/0033845 | A1 | 1/2019 | Cella | |
| 2019/0041842 | A1 | 2/2019 | Cella et al. | |
| 2019/0074693 | A1 | 3/2019 | Kudo | |
| 2019/0109891 | A1 | 4/2019 | Paruchuri | |
| 2019/0138662 | A1 | 5/2019 | Deutsch et al. | |
| 2019/0158309 | A1 | 5/2019 | Park | |
| 2019/0202414 | A1 * | 7/2019 | Shih | B60L 53/665 |
| 2019/0313024 | A1 | 10/2019 | Sellinger et al. | |
| 2019/0340645 | A1 | 11/2019 | Cella | |
| 2019/0347358 | A1 | 11/2019 | Mishra et al. | |
| 2019/0372345 | A1 | 12/2019 | Bain et al. | |
| 2020/0012966 | A1 | 1/2020 | Nagaraju | |
| 2020/0027096 | A1 | 1/2020 | Cooner | |
| 2020/0050612 | A1 | 2/2020 | Bhattacharjee | |
| 2020/0133257 | A1 | 4/2020 | Cella et al. | |
| 2020/0175551 | A1 * | 6/2020 | Penilla | B60L 53/80 |
| 2020/0257253 | A1 | 8/2020 | Yamaguchi | |
| 2020/0272664 | A1 | 8/2020 | Aggour | |
| 2020/0272899 | A1 | 8/2020 | Dunne | |
| 2020/0274389 | A1 | 8/2020 | Islam | |
| 2020/0334609 | A1 * | 10/2020 | Pecenak | H02J 3/003 |
| 2020/0372104 | A1 | 11/2020 | Calix | |
| 2020/0372588 | A1 | 11/2020 | Shi | |
| 2021/0018205 | A1 | 1/2021 | Ellis | |
| 2021/0021126 | A1 | 1/2021 | Hall | |
| 2021/0090185 | A1 | 3/2021 | Forbes, Jr. | |
| 2021/0109584 | A1 | 4/2021 | Bernat et al. | |
| 2021/0110262 | A1 | 4/2021 | Sebastian | |
| 2021/0110310 | A1 | 4/2021 | Bernat et al. | |
| 2021/0118067 | A1 | 4/2021 | Muenz | |
| 2021/0157312 | A1 | 5/2021 | Cella | |
| 2021/0334914 | A1 | 10/2021 | Sadot | |
| 2021/0342339 | A1 | 11/2021 | Renner | |
| 2021/0342836 | A1 | 11/2021 | Cella | |
| 2021/0383468 | A1 | 12/2021 | Faye | |
| 2022/0044117 | A1 | 2/2022 | Song | |
| 2022/0172206 | A1 | 6/2022 | Cella | |
| 2022/0198562 | A1 | 6/2022 | Cella | |
| 2022/0294217 | A1 | 9/2022 | Spalt | |
| 2022/0366494 | A1 | 11/2022 | Cella | |
| 2022/0410750 | A1 | 12/2022 | Mangal | |
| 2023/0006444 | A1 | 1/2023 | Bain | |
| 2023/0162123 | A1 | 5/2023 | Kagan | |
| 2023/0251291 | A1 | 8/2023 | Cella | |
| 2023/0275438 | A1 | 8/2023 | Douglas | |
| 2023/0289901 | A1 | 9/2023 | Gray | |

(56) References Cited

U.S. PATENT DOCUMENTS

| | | | |
|---|---|---|---|
| 2024/0106233 | A1 | 3/2024 | Cella |
| 2024/0106268 | A1 | 3/2024 | Cella |
| 2024/0141787 | A1 | 5/2024 | Lewis |

FOREIGN PATENT DOCUMENTS

| | | | |
|---|---|---|---|
| CN | 112685472 | A | 4/2021 |
| CN | 113221456 | A | 8/2021 |
| EP | 3879421 | A1 | 9/2021 |
| WO | 2020018421 | A1 | 1/2020 |

OTHER PUBLICATIONS

Thompson, Rick, "The Grid Edge: How Will Utilities, Vendors and Energy Service Providers Adapt?", Greentech Media, Oct. 7, 2013.

CB Insights, State of Engergy Global 2021 Report.

World Economic Forum, "The Future of Electricity: New Technologies Transforming the Grid Edge", Mar. 2017.

Deloitte Center for Energy Solutions, "Supercharged: Challenges and opportunities in global battery storage markets", 2018.

Accenture, "Digital Transformation", https://www.accenture.com/us-en/insights/digital-transformation-index accessed on Oct. 2, 2023.

Urazayev Damir, et al., "Distributed Energy Management System with the Use of Digital Twin," 2019 International Multi-Conference on Engineering, Computer and Information Sciences (Sibircon), IEEE, (20191021), doi: 10.1109/SIBIRCON48586.2019.8958118, pp. 0685-0689, XP033689318.

Zekić-Suac Marijana, et al., "Machine learning based system for managing energy efficiency of public sector as an approach towards smart cities," International Journal of Information Management, Elsevier Science Ltd., GB, vol. 58, doi:10.1016/j.ijinfomgt.2020.102074, ISSN 0268-4012, p. 102074, XP093082038, 2021.

Widodo D A, et al., "Renewable energy power generation forecasting using deep learning method," IOP Conference Series: Earth and Environmental Science, vol. 700, No. 1, doi: 10.1088/1755-1315/700/1/012026, ISSN 1755-1307, p. 012026, XP093082039, 2021.

Nammouchi A, et al., "Integration of Al, IoT and Edge-Computing for Smart Microgrid Energy Management," IEEE International Conference on Environment and Electrical Engineering and 2021 IEEE Industrial and Commercial Power Systems Europe (EEEIC / I&CPS Europe ), Bari, Italy, doi: 10.1109/EEEIC/ICPSEurope51590.2021.9584756, pp. 1-6, XP034023849, Sep. 2021.

Chen A, et al., "Distributed Cooperative Energy Management in Smart Microgrids with Solar Energy Prediction," IEEE International Conference on Communications, Control, and Computing Technologies for Smart Grids (SmartGridComm), Aalborg, Denmark, doi:10.1109/SmartGridComm.2018.8587524, pp. 1-6, XP033478177, Oct. 2018.

Rossi, et al., "Embedded smart sensor device in construction site machinery," Computers in industry 108 (2019): 12-20, Jun. 2019, Retrieved on Jan. 31, 2023 from <https://www.sciencedirect.com/science/article/abs/pii/ S0166361518303944>.

WIPO, International Search Report and Written Opinion for PCT/US2022/050932, dated Feb. 27, 2023, 12 pages.

WIPO, International Search Report for PCT/US2022/050924, dated Jun. 23, 2023.

WIPO, Writen Opinion for PCT/US2022/050924, dated Jun. 23, 2023.

"EcoStruxure Microgrid Solutions for Small & Medium Buildings—Technical Specification (TEC01)," Schneider Electric, V1.0, Sep. 2020.

"EcoStruxure Microgrid Solution for Small &Medium Buildings," Schneider Electric, 2018.

Zaouali et al., "Smart Home Resource Management based on Multi-Agent System Modeling Combined with SVM Machine Learning for Prediction and Decision-Making", 2018, ACHI, pp. 1-8 (Year: 2018).

Nammouchi et al., "Integration of Al, IoT and Edge-Computing for Smart Microgrid Energy Management", Sep. 2021, IEEE International Conference, pp. 1-6 (Year: 2021).

* cited by examiner

PROCESS-AWARE AI PLATFORM FOR ORCHESTRATION AND MANAGEMENT OF POWER AND ENERGY

CROSS-REFERENCE TO RELATED APPLICATIONS

This application is a continuation-in-part of PCT Application No. PCT/US22/50932 filed Nov. 23, 2022, which claims the benefit of U.S. Provisional Application Nos. 63/375,225 filed Sep. 10, 2022, 63/302,016 filed Jan. 21, 2022, 63/299,727 filed Jan. 14, 2022, 63/291,311 filed Dec. 17, 2021, and 63/282,510 filed Nov. 23, 2021.

This application is a continuation of PCT Application No. PCT/US22/50924 filed Nov. 23, 2022, which claims the benefit of U.S. Provisional Application Nos. 63/375,225 filed Sep. 10, 2022, 63/302,016 filed Jan. 21, 2022, 63/299,727 filed Jan. 14, 2022, 63/291,311 filed Dec. 17, 2021, and 63/282,510 filed Nov. 23, 2021.

The entire disclosures of the above applications are incorporated by reference.

BACKGROUND

Energy remains a critical factor in the world economy and is undergoing an evolution and transformation, involving changes in energy generation, storage, planning, demand management, consumption and delivery systems and processes. These changes are enabled by the development and convergence of numerous diverse technologies, including more distributed, modular, mobile and/or portable energy generation and storage technologies that will make the energy market much more decentralized and localized, as well as a range of technologies that will facilitate management of energy in a more decentralized system, including edge and Internet of Things networking technologies, advanced computation and artificial intelligence technologies, transaction enablement technologies (such as blockchains, distributed ledgers and smart contracts) and others. The convergence of these more decentralized energy technologies with these networking, computation and intelligence technologies is referred to herein as the "energy edge."

The energy market is expected to evolve and transform over the next few decades from a highly centralized model that relies on fossil fuels and a managed electrical grid to a much more distributed and decentralized model that involves many more localized generation, storage, and consumption systems. During that transition, a hybrid system will likely persist for many years in which the conventional grid becomes more intelligent, and in which distributed systems will play a growing role. A need exists for a platform that facilitates management and improvement of legacy infrastructure in coordination with distributed systems.

SUMMARY

An AI-based energy edge platform is provided herein with a wide range of features, components and capabilities for management and improvement of legacy infrastructure and coordination with distributed systems to support important use cases for a range of enterprises. The platform may incorporate emerging technologies to enable ecosystem and individual energy edge node efficiencies, agility, engagement, and profitability. Embodiments may be guided by, and in some cases integrated with, methodologies and systems that are used to forecast, plan for, and manage the demand and utilization of energy in greater distributed environments. Embodiments may use AI, and AI enablers such as IoT, which may be deployed in vastly denser data environments (reflecting the proliferation of smart energy systems and of sensors in the IoT), as well as technologies that filter, process, and move data more effectively across communication networks. Embodiments of the platform may leverage energy market connection, communication, and transaction enablement platforms. Embodiments may employ intelligent provisioning, data aggregation, and analytics. Among many use cases the platform may enable improvements in the optimization of energy generation, storage, delivery and/or enterprise consumption in operations (e.g., buildings, data centers, and factories, among many others), the integration and use of new power generation and energy storage technologies and assets (distributed energy resources, or "DERs"), the optimization of energy utilization across existing networks and the digitalization of existing infrastructure and supporting systems.

BRIEF DESCRIPTION OF THE DRAWINGS

The present disclosure will become more fully understood from the detailed description and the accompanying drawings.

DETAILED DESCRIPTION

Figure 1:
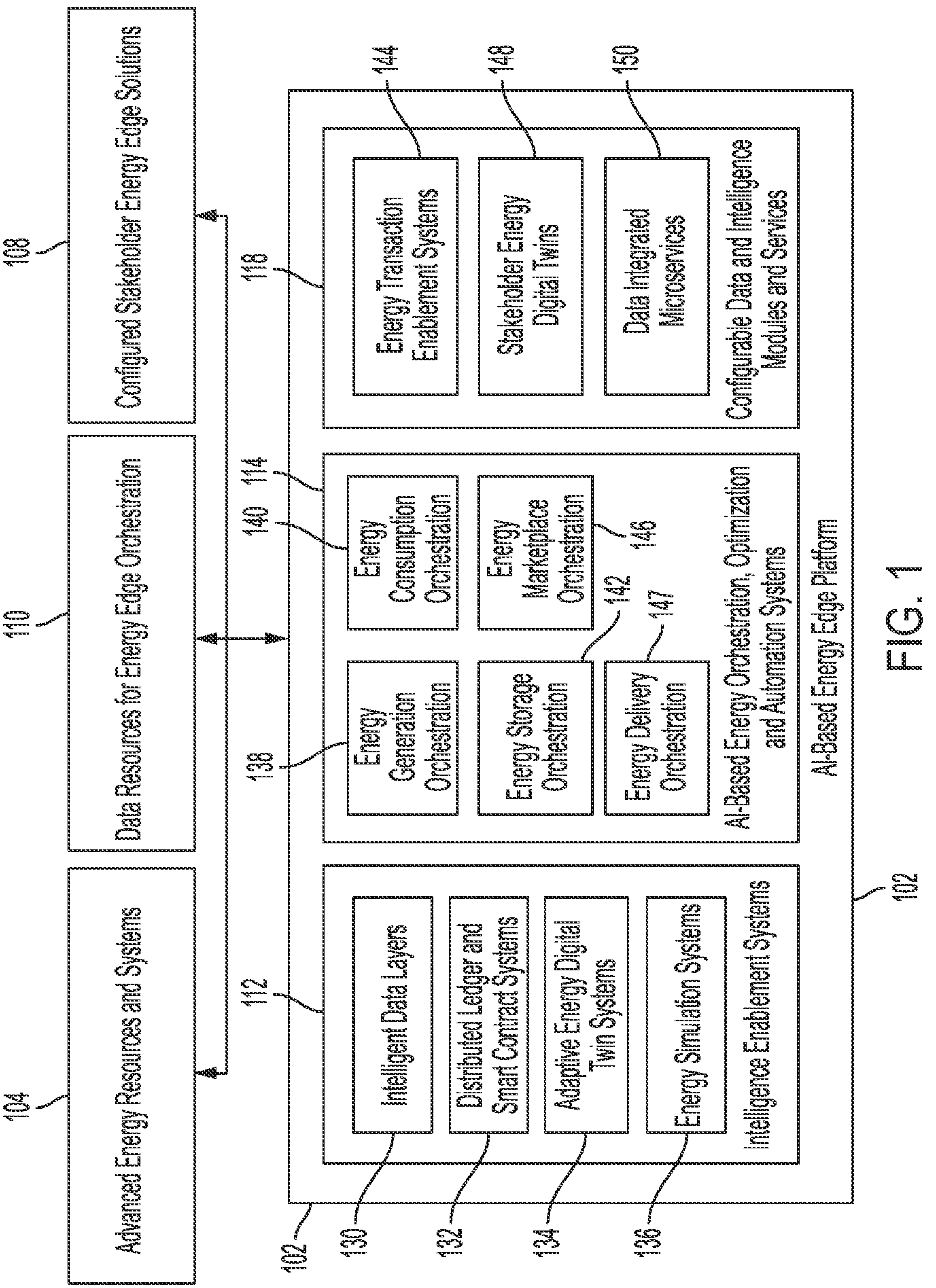
FIG. 1 is a schematic diagram that presents an introduction of platform and main elements, according to some embodiments.

FIG. 1: Introduction of Platform and Main Elements

In embodiments, provided herein is an AI-based energy edge platform 102, referred to herein for convenience in some cases as simply the platform 102, including a set of systems, subsystems, applications, processes, methods, modules, services, layers, devices, components, machines, products, sub-systems, interfaces, connections, and other elements working in coordination to enable intelligent, and in some cases autonomous or semi-autonomous, orchestration and management of power and energy in a variety of ecosystems and environments that include distributed entities (referred to herein in some cases as "distributed energy resources" or "DERs") and other energy resources and systems that generate, store, consume, and/or transport energy and that include IoT, edge and other devices and systems that process data in connection with the DERs and other energy resources and that can be used to inform, analyze, control, optimize, forecast, and otherwise assist in the orchestration of the distributed energy resources and other energy resources.

In embodiments, the platform 102 enables a set of configured stakeholder energy edge solutions 108, with a wide range of functions, applications, capabilities, and uses that may be accomplished, without limitation, by using or orchestrating a set of advanced energy resources and systems 104, including DERs and others. The configured stakeholder energy edge solution 108 may integrate, for example, domain-specific stakeholder data, such as proprietary data sets that are generated in connection with enterprise operations, analysis and/or strategy, real-time data from stakeholder assets (such as collected by IoT and edge devices located in proximity to the assets and operations of the stakeholder), stakeholder-specific energy resources and systems 104 (such as available energy generation, storage, or distribution systems that may be positioned at stakeholder locations to augment or substitute for an electrical grid), and the like into a solution that meets the stakeholder's energy needs and capabilities, including baseline, period, and peak energy needs to conduct operations such as large-scale data processing, transportation, production of goods and materials, resource extraction and processing, heating and cooling, and many others.

In embodiments, the AI-based energy edge platform 102 (and/or elements thereof) and/or the set of configured stakeholder energy edge solutions 108 may take data from, provide data to and/or exchange data with a set of data resources for energy edge orchestration 110.

The AI-based energy edge platform 102 may include, integrate with, exchange data with and/or otherwise link to a set of intelligence enablement systems 112, a set of AI-based energy orchestration, optimization, and automation systems 114 and a set of configurable data and intelligence modules and services 118.

The set of intelligence enablement systems 112 may include a set of intelligent data layers 130, a set of distributed ledger and smart contract systems 132, a set of adaptive energy digital twin systems 134, and/or a set of energy simulation systems 136.

The set of AI-based energy orchestration, optimization, and automation systems 114 may include a set of energy generation orchestration systems 138, a set of energy consumption orchestration systems 140, a set of energy marketplace orchestration systems 146, a set of energy delivery orchestration systems 147, and a set of energy storage orchestration systems 142.

The set of configurable data and intelligence modules and services 118 may include a set of energy transaction enablement systems 144, a set of stakeholder energy digital twins 148 and a set of data integrated microservices 150 that may enable or contribute to enablement of the set of configured stakeholder energy edge solutions 108.

The AI-based energy edge platform 102 may include, integrate with, link to, exchange data with, be governed by, take inputs from, and/or provide outputs to one or more artificial intelligence (AI) systems, which may include models, rule-based systems, expert systems, neural networks, deep learning systems, supervised learning systems, robotic process automation systems, natural language processing systems, intelligent agent systems, self-optimizing and self-organizing systems, and others as described throughout this disclosure and in the documents incorporated by reference herein. Except where context specifically indicates otherwise, references to AI, or to one or more examples of AI, should be understood to encompass these various alternative methods and systems; for example, without limitation, an AI system described for enabling any of a wide variety of functions, capabilities and solutions described herein (such as optimization, autonomous operation, prediction, control, orchestration, or the like) should be understood to be capable of implementation by operation on a model or rule set; by training on a training data set of human tag, labels, or the like; by training on a training data set of human interactions (e.g., human interactions with software interfaces or hardware systems); by training on a training data set of outcomes; by training on an AI-generated training data set (e.g., where a full training data set is generated by AI from a seed training data set); by supervised learning; by semi-supervised learning; by deep learning; or the like. For any given function or capability that is described herein, neural networks of various types may be used, including any of the types described herein or in the documents incorporated by reference, and, in embodiments, a hybrid set of neural networks may be selected such that within the set a neural network type that is more favorable for performing each element of a multi-function or multi-capability system or method is implemented. As one example among many, a deep learning, or black box, system may use a gated recurrent neural network for a function like language translation for an intelligent agent, where the underlying mechanisms of AI operation need not be understood as long as outcomes are favorably perceived by users, while a more transparent model or system and a simpler neural network may be used for a system for automated governance, where a greater understanding of how inputs are translated to outputs may be needed to comply with regulations or policies.

AI-Based Energy Orchestration, Optimization and Automation Systems

In embodiments, the platform may employ demand forecasting, including automated forecasting by artificial intelligence or by taking a data stream of forecast information from a third party. Among other things, forecasting demand helps inform site selection and intelligently planned network expansion. In embodiments, machine learning algorithms may generate multiple forecasts—such as about weather, prices, solar generation, energy demand, and other factors—and analyze how energy assets can best capture or generate value at different times and/or locations.

In embodiments, AI-based energy orchestration, optimization, and automation systems 114 may enable energy pattern optimization, such as by analyzing building or other operational energy usage and seeking to reshape patterns for optimization (e.g., by modeling demand response to various stimuli).

The AI-based energy orchestration, optimization, and automation systems 114 may be enabled by the set of intelligence enablement systems 112 that provide functions and capabilities that support a range of applications and use cases.

Subsystems and Modules of Intelligence Enablement Systems

Intelligent Data Layers

The intelligence enablement systems 112 may include a set of intelligent data layers 130, such as a set of services (including microservices), APIs, interfaces, modules, applications, programs, and the like which may consume any of the data entities and types described throughout this disclosure and undertake a wide range of processing functions, such as extraction, cleansing, normalization, calculation, transformation, loading, batch processing, streaming, filtering, routing, parsing, converting, pattern recognition, content recognition, object recognition, and others. Through a set of interfaces, a user of the platform 102 may configure the intelligent data layers 130 or outputs thereof to meet internal platform needs and/or to enable further configuration, such as for the stakeholder energy edge solutions 108. The intelligent data layers 130, intelligence enablement systems 112 more generally, and/or the configurable data and intelligence modules and services 118 may access data from various sources throughout the platform 102 and, in embodiments, may operate from the set of shared data resources 130, which may be contained in a centralized database and/or in a set of distributed databases, or which may consist of a set of distributed or decentralized data sources, such as IoT or edge devices that produce energy-relevant event logs or streams. The intelligent data layers 130 may be configured for a wide range of energy-relevant tasks, such as prediction/forecasting of energy consumption, generation, storage or distribution parameters (e.g., at the level of individual devices, subsystems, systems, machines, or fleets); optimization of energy generation, storage, distribution or consumption (also at various levels of optimization); automated discovery, configuration and/or execution of energy transactions (including microtransactions and/or larger transactions in spot and futures markets as well as in peer-to-peer groups or single counterparty transactions); monitoring and tracking of parameters and attributes of energy consumption, generation, distribution and/or storage (e.g., baseline levels, volatility, periodic patterns, episodic events, peak levels, and the like); monitoring and tracking of energy-related parameters and attributes (e.g., pollution, carbon production, renewable energy credits, production of waste heat, and others); automated generation of energy-related alerts, recommendations and other content (e.g., messaging to prompt or promote favorable user behavior); and many others.

Distributed Ledger and Smart Contract Systems

Energy edge intelligence enablement systems 112 may include a smart contract system 132 for handling a set of smart contracts, each of which may optionally operate on a set of blockchain-based distributed ledgers. Each of the smart contracts may operate on data stored in the set of distributed ledgers or blockchains, such as to record energy-related transactional events, such as energy purchases and sales (in spot, forward and peer-to-peer markets, as well as direct counterparty transactions), relevant service charges and the like; transaction relevant energy events, such as consumption, generation, distribution and/or storage events, and other transaction-relevant events often associated with energy, such as carbon production or abatement events, renewable energy credit events, pollution production or abatement events, and the like. The set of smart contracts handled by the smart contract system 132 may consume as a set of inputs any of the data types and entities described throughout this disclosure, undertake a set of calculations (optionally configured in a flow that takes inputs from disparate systems in a multi-step transaction), and provide a set of outputs that enable completion of a transaction, reporting (optionally recorded on a set of distributed ledgers), and the like. Energy transactional enablement systems 144 may be enabled or augmented by artificial intelligence, including to autonomously discover, configure, and execute transactions according to a strategy and/or to provide automation or semi-automation of transactions based on training and/or supervision by a set of transaction experts. In embodiments, the smart contract systems 132 may be used by the energy transactional enablement systems 144 (described elsewhere in this disclosure) to configure transactional solutions.

Adaptive Energy Digital Twin Systems

Any entity, analytic results, output of artificial intelligence, state, operating condition, or other feature noted throughout this disclosure may, in embodiments, be presented in a digital twin, such as the adaptive energy digital twin 134, which is widely applicable, and/or the stakeholder energy digital twin 148, which is configured for the needs of a particular stakeholder or stakeholder solution. The adaptive energy digital twin 134 may, for example, provide a visual or analytic indicator of energy consumption by a set of machines, a group of factories, a fleet of vehicles, or the like; a subset of the same (e.g., to compare energy parameters by each of a set of similar machines to identify out-of-range behavior); and many other aspects. A digital twin may be adaptive, such as to filter, highlight, or otherwise adjust data presented based on real-time conditions, such as changes in energy costs, changes in operating behavior, or the like.

Energy Simulation Systems

In embodiments, a set of energy simulation systems 136 is provided, such as to develop and evaluate detailed simulations of energy generation, demand response and charge management, including a simulation environment that simulates the outcomes of use of various algorithms that may govern generation across various generations assets, consumption by devices and systems that demand energy, and storage of energy. Data can be used to simulate the interaction of non-controllable loads and optimized charging processes, among other use cases. The simulation environment may provide output to, integrate with, or share data with the set of advanced energy digital twin systems 134.

In embodiments, as more enterprises embrace hybrid infrastructure, uptime is becoming more complex, requiring backup and failover strategies that span cloud, colocation, on-premises facilities, and edge infrastructure. This may include AI-based algorithms for automatically managing energy for devices and systems in such devices. For example, artificial intelligence may enable autonomous data center cooling and industrial control. In embodiments, DERs 128 may be integrated into or with, for example, AI-driven computing infrastructure, smart PDUs, UPS systems, energy-enabled air flow management systems, and HVAC systems, among others.

Introduction of Main Subsystems and Modules of AI-Based Energy Orchestration, Optimization, and Automation Systems The set of AI-based energy orchestration, optimization, and automation systems 114 may include the set of energy generation orchestration systems 138, the set of energy consumption orchestration systems 140, the set of energy storage orchestration systems 142, the set of energy marketplace orchestration systems 146 and the set of energy delivery orchestration systems 147, among others. For example, the energy delivery orchestration systems 147 may enable orchestration of the delivery of energy to a point of consumption, such as by fixed transmission lines, wireless energy transmission, delivery of fuel, delivery of stored energy (e.g., chemical or nuclear batteries), or the like, and may involve autonomously optimizing the mix of energy types among the foregoing available resources based on various factors, such as location (e.g., based on distance from the grid), purpose or type of consumption (e.g., whether there is a need for very high peak energy delivery, such as for power-intensive production processes), and the like.

Configurable Data and Intelligence Modules and Services

In embodiments, the platform 102 may include a set of configurable data and intelligence modules and services 118. These may include energy transaction enablement systems 144, stakeholder energy digital twins 148, energy-related data integrated microservices 150, and others. Each module or service (optionally configured in a microservices architecture) may exchange data with the various data resources 110 in order to provide a relevant output, such as to support a set of internal functions or capabilities of the platform 102 and/or to support a set of functions or capabilities of one or more of the configured stakeholder energy edge solutions 108. As one example among many, a service may be configured to take event data from an IoT device that has cameras or sensors that monitor a generator and integrate it with weather data from a public data resource 162 to provide a weather-correlated timeline of energy generation data for the generator, which in turn may be consumed by a stakeholder energy edge solution 108, such as to assist with forecasting day-ahead energy generation by the generator based on a day-ahead weather forecast. A wide range of such configured data and intelligence modules and services 118 may be enabled by the platform 102, representing, for example, various outputs that consist of the fusion or combination of the wide range of energy edge data sources handled by the platform, higher-level analytic outputs resulting from expert analysis of data, forecasts and predictions based on patterns of data, automation and control outputs, and many others.

Energy Transaction Enablement Systems

Configurable data and intelligence modules and services 118 may include energy transaction enablement systems 144. Transaction enablement systems 144 may include a set of smart contracts, which may operate on data stored in a set of distributed ledgers or blockchains, such as to record energy-related transactional events, such as energy purchases and sales (in spot, forward and peer-to-peer markets, as well as direct counterparty transactions) and relevant service charges; transaction relevant energy events, such as consumption, generation, distribution and/or storage events, and other transaction-relevant events often associated with energy, such as carbon production or abatement events, renewable energy credit events, pollution production or abatement events, and the like. The set of smart contracts may consume as a set of inputs any of the data types and entities described throughout this disclosure, undertake a set of calculations (optionally configured in a flow that takes inputs from disparate systems in a multi-step transaction), and provide a set of outputs that enable completion of a transaction, reporting (optionally recorded on a set of distributed ledgers), and the like. Energy transactional enablement systems 144 may be enabled or augmented by artificial intelligence, including to autonomously discover, configure, and execute transactions according to a strategy and/or to provide automation or semi-automation of transactions based on training and/or supervision by a set of transaction experts. Autonomy and/or automation (supervised or semi-supervised) may be enabled by robotic process automation, such as by training a set of intelligent agents on transactional discovery, configuration, or execution interactions of a set of transactional experts with transaction-enabling systems (such as software systems used to configure and execute energy trading activities).

As energy is increasingly produced and consumed in local, decentralized markets, the energy market is likely to follow patterns of other peer-to-peer or shared economy markets, such as ride sharing, apartment sharing and used goods markets. Technology enables the bypassing of top-down or centralized energy supply and enables operators to create platforms that can manage and monetize spare capacity, such as through the leasing and trading of assets and outputs.

As more distributed or peer-to-peer transactive energy markets develop, the platform 102 may include systems or link to, integrate with, or enable other platforms that facilitate P2P trading, wholesale contracts, renewable energy certificate (REC) tracking, and broader distributed energy provisioning, payment management and other transaction elements. In embodiments, the foregoing may use blockchain, distributed ledger and/or smart contract systems 132.

In embodiments, with increased transparency, choice, and flexibility, consumers will be able to participate actively in energy markets, by generating, storing, and selling, as well as consuming electricity.

In embodiments, transactional elements may be configured by energy transaction enablement systems 144 to optimize energy generation, storage, or consumption, such as utility time of use charges. Shifting energy demand away from high-priced time periods with IoT-based platforms that can identify periods where energy costs are the least expensive.

Stakeholder Energy Digital Twins

The configurable data and intelligence modules and services 118 may include one or more stakeholder energy digital twins 148, which may, in embodiments, include set of digital twins that are configured to represent a set of stakeholder entities that are relevant to energy, including stakeholder-owned and stakeholder-operated energy generation resources, energy distribution resources, and/or energy distribution resources (including representing them by type, such as indicating renewable energy systems, carbon-producing systems, and others); stakeholder information technology and networking infrastructure entities (e.g., edge and IoT devices and systems, networking systems, data centers, cloud data systems, on premises information technology systems, and the like); energy-intensive stakeholder production facilities, such as machines and systems used in manufacturing; stakeholder transportation systems; market conditions (e.g., relating to current and forward market pricing for energy, for the stakeholder's supply chain, for the stakeholders product and services, and the like), and others. The digital twins 148 may provide real-time information, such as provided sensor data from IoT and edge devices, event logs, and other information streams, about status, operating conditions, and the like, particularly relating to energy consumption, generation, storage, and or distribution.

The stakeholder energy digital twin 148 may provide a visual, real-time view of the impact of energy on all aspects of an enterprise. A digital twin may be role-based, such as providing visual and analytic indicators that are suitable for the role of the user, such as financial reporting information for a CFO; operating parameter information for a power plant manager; and energy market information for an energy trader.

Data Integrated Microservices

The configurable data and intelligence modules and services 118 may include configurable data integrated microservices 150, such as organized in a service-oriented architecture, such that various microservices can be grouped in series, in parallel, or in more complex flows to create higher-level, more complex services that each provide a defined set of outputs by processing a defined set of outputs, such as to enable a particular stakeholder solution 108 or to facilitate AI-based orchestration, optimization and/or automation systems 114. The configurable data and intelligence modules and services 118 may, without limitation, be configured from various functions and capabilities of the intelligent data layers 130, which in turn operate on various data resources for energy edge orchestration 110 and/or internal event logs, outputs, data streams and the like of the platform 102.

Figure 2A:
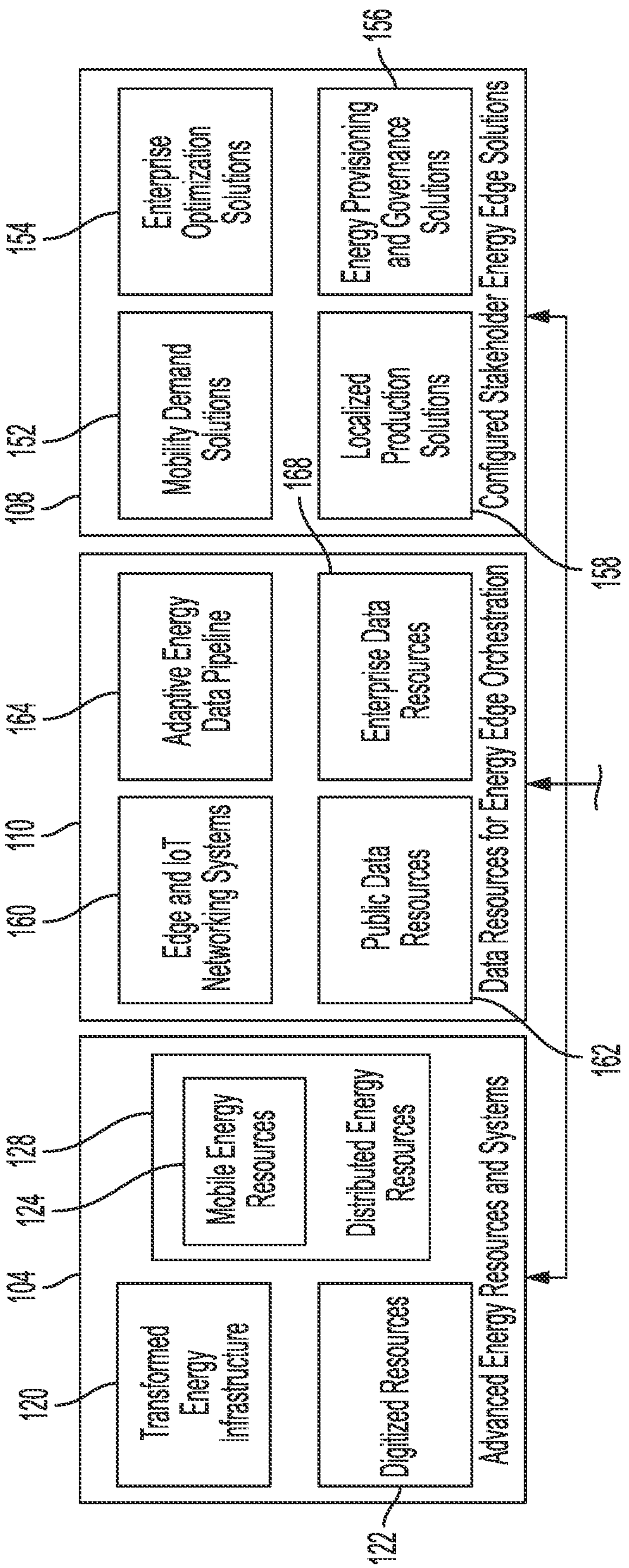
FIGS. 2A and 2B are schematic diagrams that present an introduction of main subsystems of a major ecosystem, according to some embodiments.
Figure 2B:
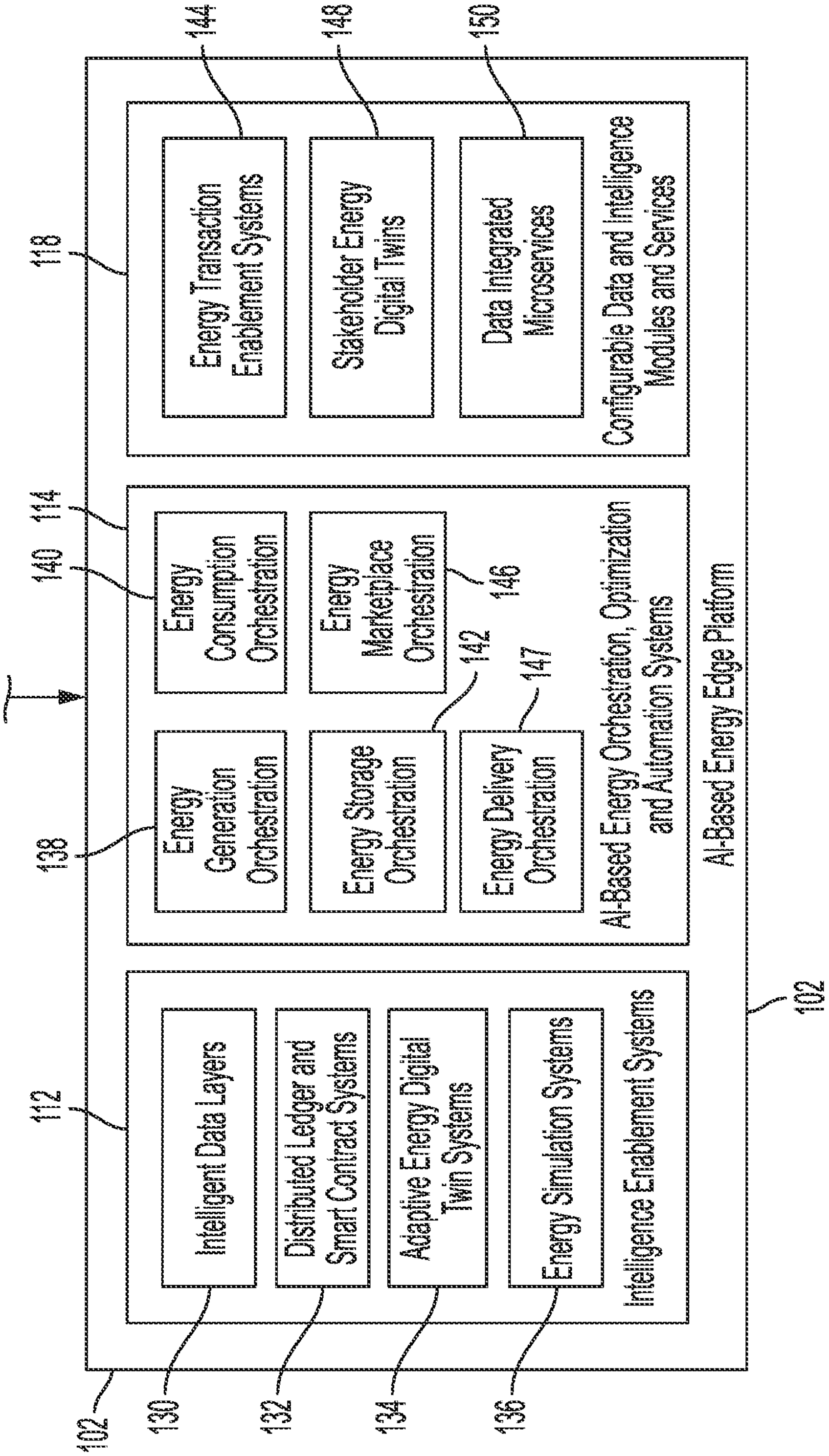

FIGS. 2A-2B: Introduction of Main Subsystems of Major Ecosystem Components Data Resources for Energy Edge Orchestration Referring to FIG. 2A, the data resources for energy edge orchestration 110 may include a set of Edge and IoT Networking Systems 160, a set of Public data resources 162, and/or a set of Enterprise data resources 168, which in embodiments may use or be enabled by an Adaptive Energy Data Pipeline 164 that automatically handles data processing, filtering, compression, storage, routing, transport, error correction, security, extraction, transformation, loading, normalization, cleansing and/or other data handling capabilities involved in the transport of data over a network or communication system. This may include adapting one or more of these aspects of data handling based on data content (e.g., by packet inspection or other mechanisms for understanding the same), based on network conditions (e.g., congestion, delays/latency, packet loss, error rates, cost of transport, quality of service (QoS), or the like), based on context of usage (e.g., based on user, system, use case, application, or the like, including based on prioritization of the same), based on market factors (e.g., price or cost factors), based on user configuration, or other factors, as well as based on various combinations of the same. For example, among many others, a least-cost route may be automatically selected for data that relates to management of a low-priority use of energy, such as heating a swimming pool, while a fastest or highest-QoS route may be selected for data that supports a prioritized use or energy, such as support of critical healthcare infrastructure.

Referring to FIG. 2B, the platform 102 and orchestration may include, integrate, link to, integrate with, use, create, or otherwise handle, a wide range of data resources for the advanced energy resources and systems 104, the configured stakeholder energy edge solutions 108, and/or the energy edge orchestration 110. In embodiments, elements of the advanced energy resources and systems 104, the configured stakeholder energy edge solutions 108, and/or the energy edge orchestration 110 may be the same as, similar to, or different from corresponding elements shown in FIG. 1. The data resources 110 may include separate databases, distributed databases, and/or federated data resources, among many others.

Edge and IoT Networking Systems

A wide range of energy-related data may be collected and processed (including by artificial intelligence services and other capabilities), and control instructions may be handled, by a set of edge and IoT networking systems 160, such as ones integrated into devices, components or systems, ones located in IoT devices and systems, ones located in edge devices and systems, or the like, such as where the foregoing are located in or around energy-related entities, such as ones used by consumers or enterprises, such as ones involved in energy generation, storage, delivery or use. These include any of the wide range of software, data and networking systems described herein.

Public Data Resources

In embodiments, the platform 102 may track various public data resources 162, such as weather data. Weather conditions can impact energy use, particularly as they relate to HVAC systems. Collecting, compiling, and analyzing weather data in connection with other building information allows building managers to be proactive about HVAC energy consumption. A wide range of public data resources 162 may include satellite data, demographic and psychographic data, population data, census data, market data, website data, ecommerce data, and many other types.

Enterprise Data Resources

Enterprise data resources 168 may include a wide range of enterprise resources, such as enterprise resource planning data, sales and marketing data, financial planning data, accounting data, tax data, customer relationship management data, demand planning data, supply chain data, procurement data, pricing data, customer data, product data, operating data, and many others.

Subsystems and Modules of Advanced Energy Resources and Systems

In embodiments, the advanced energy resources and systems 104 may include distributed energy resources 128, or "DERs" 128. More decentralized energy resources will mean that more individuals, networked groups, and energy communities will be capable of generating and sharing their own energy and coordinating systems to achieve ultimate efficacy. The DER 128 may be a small- or medium-scale unit of power generation and/or storage that operates locally and may be connected to a larger power grid at the distribution level. That is, the DER systems 128 may be either connected to the local electric power grid or isolated from the grid in stand-alone applications.

Transformed Energy Infrastructure

The advanced energy resources and systems 104 orchestrated by the platform 102 may include transformed energy infrastructure 120. The energy edge will involve increasing digitalization of generation, transmission, substation, and distribution assets, which in turn will shape the operations, maintenance, and expansion of legacy grid infrastructure. In embodiments, a set of transformed energy infrastructure systems 120 may be integrated with or linked to the platform 102. The transition to improved infrastructure may include moving from SCADA systems and other existing control, automation, and monitoring systems to IoT platforms with advanced capabilities.

In embodiments, new assets added to or coordinated with the grid (e.g., DERs 128) may be compatible with existing infrastructure to maintain voltage, frequency, and phase synchronization.

Any improvements to legacy grid assets, new grid-connected equipment, and supporting systems may, in embodiments, comply with regulatory standards from NERC, FERC, NIST, and other relevant authorities; positively impact the reliability of the grid; reduce the grid's susceptibility to cyberattacks and other security threats; increase the ability of the grid to adapt to extensive bi-directional flow of energy (i.e., DER proliferation); and offer interoperability with technologies that improve the efficiency of the grid (i.e., by providing and promoting demand response, reducing grid congestion, etc.).

Digitalization of legacy grid assets may relate to assets used for generation, transmission, storage, distribution or the like, including power stations, substations, transmission wires, and others.

In embodiments, in order to maintain and improve existing energy infrastructure, the platform 102 may include various capabilities, including fully integrated predictive maintenance across utility-owned assets (i.e., generation, transmission, substations, and distribution); smart (AI/ML-based) outage detection and response; and/or smart (AI/ML-based) load forecasting, including optional integration of the DERs 128 with the existing grid.

In embodiments, power grid maintenance may be provided. With proactive maintenance, utilities can accurately detect defects and reduce unplanned outages to better serve customers. AI systems, deployed with IoT and/or edge computing, can help monitor energy assets and reduce maintenance costs.

Digitized Resources

In embodiments, the platform 102 may take advantage of the digital transformation of a wide range of digitized resources. Machines are becoming smarter, and software intelligence is being embedded into every aspect of a business, helping drive new levels of operational efficiency and innovation. Also, digital transformation is ongoing, involving increasing presence of smart devices and systems that are capable of data processing and communication, nearly ubiquitous sensors in edge, IoT and other devices, and generation of large, dense streams of data, all of which provide opportunities for increased intelligence, automation, optimization, and agility, as information flows continuously between the physical and digital world. Such devices and systems demand large amounts of energy. Data centers, for example, consume massive amounts of energy, and edge and IoT devices may be deployed in off-grid environments that require alternative forms of generation, storage, or mobility of energy. In embodiments, a set of digitized resources may be integrated, accessed, or used for optimization of energy for compute, storage, and other resources in data centers and at the edge, among other places. In embodiments, as more and more devices are embedded with sensors and controls, information can flow continuously between the physical and digital worlds as machines 'talk' to each other. Products can be tracked from source to customer, or while they are in use, enabling fast responses to internal and external changes. Those tasked with managing or regulating such systems can gain detailed data from these devices to optimize the operation of the entire process. This trend turns big data into smart data, enabling significant cost- and process efficiencies.

In embodiments, advances in digital technologies enable a level of monitoring and operational performance that was not previously possible. Thanks to sensors and other smart assets, a service provider can collect a wide range of data across multiple parameters, monitoring in real-time, 24 hours a day.

In embodiments, the DERs 128 will be integrated into computational networks and infrastructure devices and systems, augmenting the existing power grid and serving to decrease costs and improve reliability.

Mobile Energy Resources

In embodiments, DERs may be integrated into mobile energy resources 124, such as electric vehicles (EVs) and their charging networks/infrastructure, thereby augmenting the existing power grid and serving to decrease costs and improve reliability. Given the rise of EVs (of all types) charging infrastructure and vehicle charging plans will need to be optimized to match supply and demand. Also, growing electricity demand and development of EV infrastructure will require optimization using edge and other related technologies such as IoT. Electric vehicle charging may be integrated into decentralized infrastructure and may even be used as the DER 128 by adding to the grid, such as through two-way charging stations, or by powering another system locally. Vehicle power electronic systems and batteries can benefit the power grid by providing system and grid services. Excess energy can be stored in the vehicles as needed and discharged when required. This flexibility option not only avoids expensive load peaks during times of short-term, high-energy demand but also increases the share of renewable energy use.

In embodiments, in order to universally integrate electric vehicles and charging infrastructure into a distribution network, coordination with various other standardized communication protocols is needed. The AI-based energy edge platform 102 may include, integrate and/or link to a set of communication protocols that enable management, provisioning, governance, control or the like of energy edge devices and systems using such protocols.

Configured Stakeholder Energy Edge Solutions

The set of configured stakeholder energy edge solutions 108 may include a set of Mobility Demand Solutions 152, a set of Enterprise Optimization Solutions 154, a set of Energy Provisioning and Governance Solutions 156 and/or a set of Localized Production Solutions 158, among others, that use various advanced energy resources and systems 104 and/or various configurable data and intelligence modules and services 118 to enable benefits to particular stakeholders, such as private enterprises, non-governmental organizations, independent service organizations, governmental organizations, and others. All such solutions may leverage edge intelligence, such as using data collected from onboard or integrated sensors, IoT systems, and edge devices that are located in proximity to entities that generate, store, deliver and/or use energy to feed models, expert systems, analytic systems, data services, intelligent agents, robotic process automation systems, and other artificial intelligence systems into order to facilitate a solution for a particular stakeholder needs.

Enterprise Optimization Solutions

In embodiments, the DERs 128 will be integrated with or into enterprises and shared resources, augmenting the existing power grid and serving to decrease costs and improve reliability. Increasing levels of digitalization will help integrate activities and facilitate new ways of optimizing energy in buildings/operations, and across campuses and enterprises. In embodiments, this may enable increasing the operational bottom line of a for-profit enterprise by leveraging big data and plug load analytics to efficiently manage buildings.

In embodiments, IoT sensors and building automation control systems may be configured to assist in optimizing floor space, identifying unused equipment, automating efficient energy consumption, improving safety, and reducing environmental impact of buildings.

In embodiments, the platform 102 may manage total energy consumption of systems and equipment connected to the electrical network or to a set of DERs 128. Some systems are almost always operational, while other pieces of equipment and machinery may be connected only occasionally. By maintaining an understanding of both the total daily electrical consumption of a building and the role individual devices play in the overall energy use of a specific system, the platform may forecast, provision, manage and control, optionally by AI or algorithm, the total consumption.

In embodiments, the platform 102 may track and leverage an understanding of o occupants' behavior. Activity levels, behavior patterns, and comfort preferences of occupants may be a consideration for energy efficiency measures. This may include tracking various cyclical or seasonal factors. Over time, a building's energy generation, storage and/or consumption may follow predictable patterns that an IoT-based analytics platform can take into consideration when generating proposed solutions.

In embodiments, the platform may enable or integrate with systems or platforms for autonomous operations. For example, industrial sites, such as oil rigs and power plants, require extensive monitoring for efficiency and safety because liquid, steam, or oil leakages can be catastrophic, costly, and wasteful. AI and machine learning may provide autonomous capabilities for power plants, such as those served by edge devices, IoT devices, and onsite cameras and sensors. Models may be deployed at the edge in power plants or on DERs 128, such as to use real-time inferencing and pattern detection to identify faults, such as leaks, shaking, stress, or the like. Operators may use computer vision, deep learning, and intelligent video analytics (IVA) to monitor heavy machinery, detect potential hazards, and alert workers in real-time to protect their health and safety, prevent accidents, and assign repair technicians for maintenance.

In embodiments, the platform may enable or integrate with systems or platforms for pipeline optimization. For example, oil and gas enterprises may rely on finding the best-fit routes to transfer oil to refineries and eventually to fuel stations. Edge AI can calculate the optimal flow of oil to ensure reliability of production and protect long-term pipeline health. In embodiments, enterprises can inspect pipelines for defects that can lead to dangerous failures and automatically alert pipeline operators.

Energy Provisioning and Governance Solutions

The energy provisioning and governance solutions 156 may include solutions for governance of mining operations. Cobalt, nickel, and other metals are fundamental components of the batteries that will be needed for the green EV revolution. Amounts required to support the growing market will create economic pressure on mining operations, many of which take place in regions like the DRC where there is long history of corruption, child labor, and violence. Companies are exploring areas like Greenland for cobalt, in part on the basis that it can offer reliable labor law enforcement, taxation compliance, and the like. Such promises can be made there and in other jurisdictions with greater reliability through one or more mining governance solutions 542. The mining government solutions 542 may include mine-level IoT sensing of the mine environment, ground-penetrating sensing of unmined portions, mass spectrometry and computer vision-based sensing of mined materials, asset tagging of smart containers (e.g., detecting and recording opening and closing events to ensure that the material placed in a container is the same material delivered at the end point), wearable devices for detecting physiological status of miners, secure (e.g., blockchain- and DLT-based) recording and resolution of transactions and transaction-related events, smart contracts for automatically allocating proceeds (e.g., to tax authorities, to workers, and the like), and an automated system for recording, reporting, and assessing compliance with contractual, regulatory, and legal policy requirements. All of the above, from base sensors to compliance reports can be optionally represented in a digital twin that represents each mine owner or operated by an enterprise.

The energy provisioning and governance solutions 156 may also include a set of carbon-aware energy solutions, where controls for operating entities that generate (or capture) carbon are managed by data collection through edge and IoT devices about current carbon generation or emission status and by automated generation of a set of recommendations and or control instructions to govern the operating entities to satisfy policies, such as by keeping operations within a range that is offset by available carbon offset credits, or the like.

More detail on a variety of energy provisioning and governance solutions 156 is provided below.

Localized Production Solutions

In embodiments, a set of localized production systems 158 may be integrated with, linked to, or managed by the platform 102, such that localized production demand can be met, particularly for goods that are very costly to transport (e.g., food) or services where the cost of energy distribution has a large adverse impact on product or service margins (e.g., where there is a need for intensive computation in places where the electrical grid is absent, lacks capacity, is unreliable, or is too expensive).

In embodiments, power management systems may converge with other systems, such as building management systems, operational management systems, production systems, services systems, data centers, and others to allow for enterprise-wide energy management.

Figure 3:
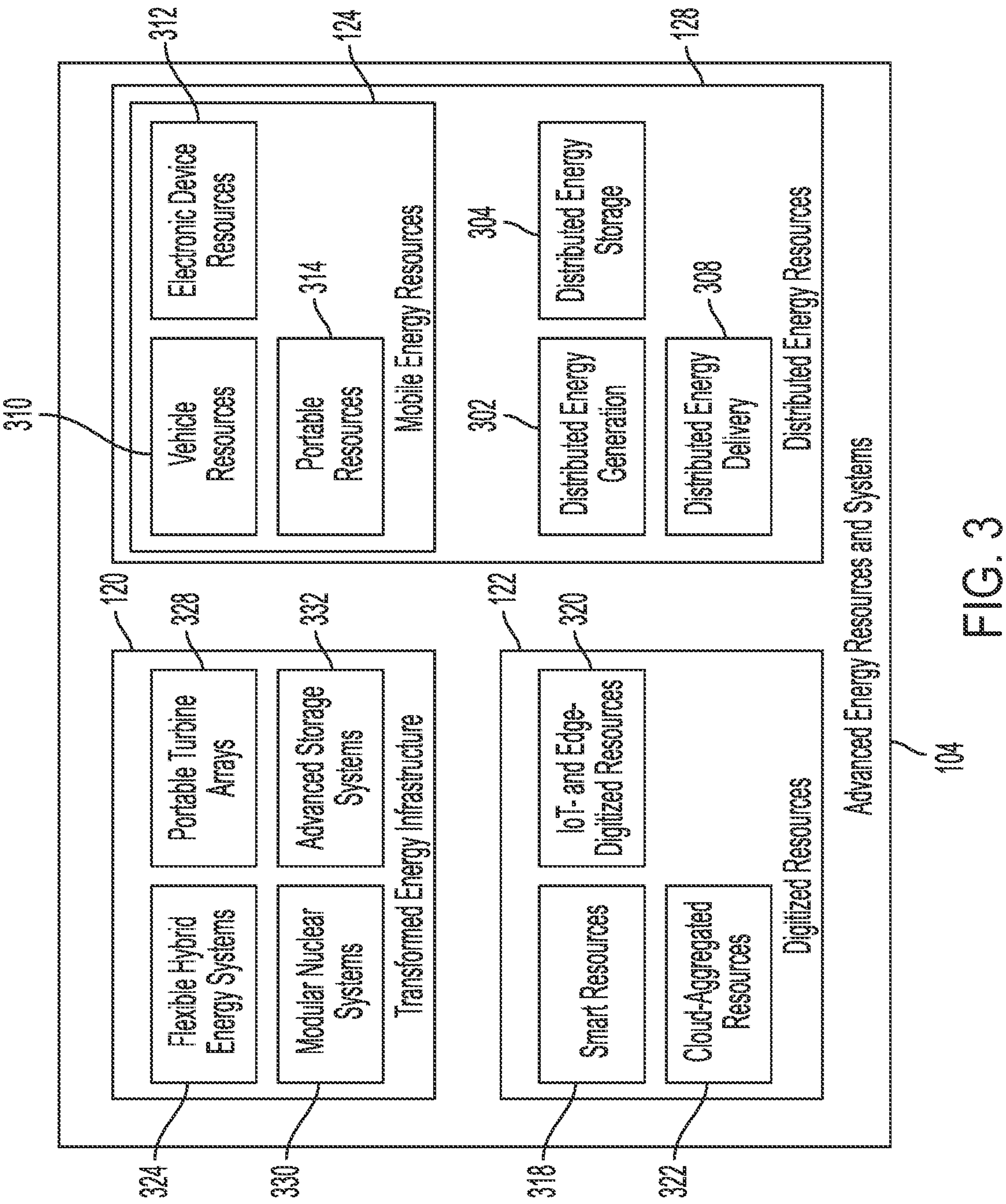
FIG. 3 is a schematic diagram that presents more detail on distributed energy generation systems, according to some embodiments.

FIG. 3: More Detail on Distributed Energy Generation Systems

Referring to FIG. 3, a distributed energy generation systems 302 may include wind turbines, solar photovoltaics (PV), flexible and/or floating solar systems, fuel cells, modular nuclear reactors, nuclear batteries, modular hydropower systems, microturbines and turbine arrays, reciprocating engines, combustion turbines, and cogeneration plants, among others. The distributed energy storage systems 304 may include battery storage energy (including chemical batteries and others), molten salt energy storage, electro-thermal energy storage (ETES), gravity-based storage, compressed fluid energy storage, pumped hydroelectric energy storage (PHES), and liquid air energy storage (LAES), among others. The DER systems 128 may be managed by the platform 102. In embodiments, the distributed energy storage systems 304 may be portable, such that units of energy may be transported to points of use, including points of use that are not connected to the conventional grid or ones where the conventional grid does not fully satisfy demand (e.g., where greater peak power, more reliable continuous power, or other capabilities are needed).

Management may include the integration, coordination, and maximizing of return-on-investment (ROI) on distributed energy resources (DERs), while providing reliability and flexibility for energy needs.

In embodiments, the DERs 128 may use various distributed energy delivery methods and systems 308 having various energy delivery capabilities, including transmission lines (e.g., conventional grid and building infrastructure), wireless energy transmission (including by coupled, resonant transfer between high-Q resonators, near-field energy transfer and other methods), transportation of fluids, batteries, fuel cells, small nuclear systems, and the like), and others.

The mobile energy resources 124 include a wide range of resources for generation, storage, or delivery of energy at various scales; accordingly, the mobile energy resources 124 may comprise a subcategory of the distributed energy resources 128 that have attributes of mobility, such as where the mobile energy resources 124 are integrated into a vehicle 310 (e.g., an electric vehicle, hybrid electric vehicle, hydrogen fuel cell vehicle, or the like, and in embodiments including a set of autonomous vehicles, which may be unmanned autonomous vehicles (UAVs), drones, or the like); where resources are integrated into or used by a mobile electronic device 312, or other mobile system; where the mobile energy resources 124 are portable resources 314 (including where they are removable and replaceable from a vehicle or other system), and the like. As the mobile energy resources 124 and supporting infrastructure (e.g., charging stations) scale in capacity and availability, orchestration of the mobile energy resources 124 and other DERs 128, optionally in coordination with available grid resources, takes on increased importance.

Resources involved in generation, storage, and transmission of energy are increasingly undergoing digital transformation. These digitized resources 122 may include smart resources 318 (such as smart devices (e.g., thermostats), smart home devices (e.g., speakers), smart buildings, smart wearable devices and many others that are enabled with processors, network connectivity, intelligent agents, and other onboard intelligence features) where intelligence features of the smart resources 318 can be used for energy orchestration, optimization, autonomy, control or the like and/or used to supply data for artificial intelligence and analytics in connection with the foregoing. The digitized resources 122 may also include IoT- and edge-digitized resources 320, where sensors or other data collectors (such as data collectors that monitor event logs, network packets, network traffic patterns, networked device location patterns, or other available data) provide additional energy-related intelligence, such as in connection with energy generation, storage, transmission or consumption by legacy infrastructure systems and devices ranging from large scale generators and transformers to consumer or business devices, appliances, and other systems that are in proximity to a set of IoT or edge devices that can monitor the same. Thus, IoT and edge device can provide digital information about energy states and flows for such devices and systems whether or not the devices and systems have onboard intelligence features; for example, among many others, an IoT device can deploy a current sensor on a power line to an appliance to detect utilization patterns, or an edge networking device can detect whether another device or system connected to the device is in use (and in what state) by monitoring network traffic from the other device. The digitized resources 122 may also include cloud-aggregated resources 322 about energy generation, storage, transmission, or use, such as by aggregating data across a fleet of similar resources that are owned or operated by an enterprise, that are used in connection with a defined workflow or activity, or the like. The cloud-aggregated resources 322 may consume data from the various data resources 110, from crowdsourcing, from sensor data collection, from edge device data collection, and many other sources.

In embodiments, the digitized resources 122 may be used for a wide range of uses that involve or benefit from real time information about the attributes, states, or flows of energy generation, storage, transmission, or consumption, including to enable digital twins, such as adaptive energy digital twin systems 134 and/or stakeholder energy digital twins 148 and for various configured stakeholder energy edge solutions 108.

Energy generation, storage, and consumption, particularly involving green or renewable energy, have been the subject of intensive research and development in recent decades, yielding higher peak power generation capacity, increases in storage capacity, reductions in size and weight, improvements in intelligence and autonomy, and many others. The advanced energy resources and systems 104 may include a wide range of advanced energy infrastructure systems and devices that result from combinations of features and capabilities. In embodiments, a set of flexible hybrid energy systems 324 may be provided that is adaptable to meet varying energy consumption requirements, such as ones that can provide more than one kind of energy (e.g., solar or wind power) to meet baseline requirements of an off-grid operation, along with a nuclear battery to satisfy much higher peak power requirements, such as for temporary, resource intensive activities, such as operating a drill in a mine or running a large factory machine on a periodic basis. A wide variety of such flexible, hybrid energy systems 324 are contemplated herein, including ones that are configured for modular interconnection with various types of localized production infrastructure as described elsewhere herein. In embodiments, the advanced energy resources and systems 104 may include advanced energy generation systems that draw power from fluid flows, such as portable turbine arrays 328 that can be transported to points of consumption that are in proximity to wind or water flows to substitute for or augment grid resources. The advanced energy resources and systems 104 may also include modular nuclear systems 330, including ones that are configured to use a nuclear battery and ones that are configured with mechanical, electrical and data interfaces to work with various consumption systems, including vehicles, localized production systems (as described elsewhere herein), smart buildings, and many others. The nuclear systems 330 may include SMRs and other reactor types. The advanced energy resources and systems 104 may include advanced storage systems 332, including advanced batteries and fuel cells, including batteries with onboard intelligence for autonomous management, batteries with network connectivity for remote management, batteries with alternative chemistry (including green chemistry, such as nickel zinc), batteries made from alternative materials or structures (e.g., diamond batteries), batteries that incorporate generation capacity (e.g., nuclear batteries), advanced fuel cells (e.g., cathode layer fuels cells, alkaline fuel cells, polymer electrolyte fuel cells, solid oxide fuel cells, and many others).

Figure 4:
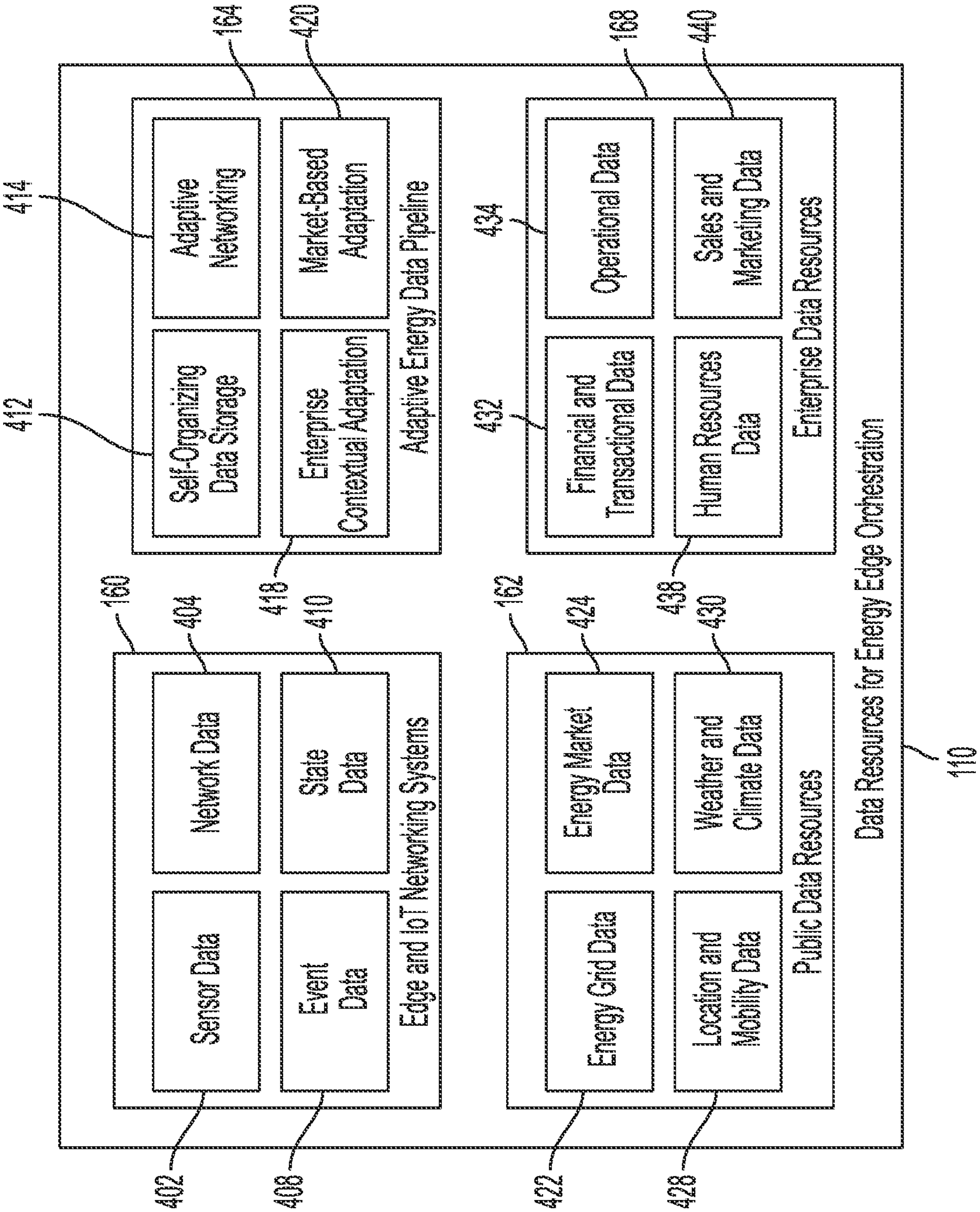
FIG. 4 is a schematic diagram that presents more detail on data resources, according to some embodiments.

FIG. 4: More Detail on Data Resources

Referring to FIG. 4, the data resources for energy edge orchestration 110 may include a wide range of public data sets, as well as private or proprietary data sets of an enterprise or individual. This may include data sets generated by or passed through the edge and IoT networking systems 160, such as sensor data 402 (e.g., from sensors integrated into or placed on machines or devices, sensors in wearable devices, and others); network data 404 (such as data on network traffic volume, latency, congestion, quality of service (QoS), packet loss, error rate, and the like); event data 408 (such as data from event logs of edge and IoT devices, data from event logs of operating assets of an enterprise, event logs of wearable devices, event data detected by inspection of traffic on application programming interfaces, event streams published by devices and systems, user interface interaction events (such as captured by tracking clicks, eye tracking and the like), user behavioral events, transaction events (including financial transaction, database transactions and others), events within workflows (including directed, acyclic flows, iterative and/or looping flows, and the like), and others); state data 410 (such as data indicating historical, current or predicted/anticipated states of entities (such as machines, systems, devices, users, objects, individuals, and many others) and including a wide range of attributes and parameters relevant to energy generation, storage, delivery or utilization of such entities); and/or combinations of the foregoing (e.g., data indicating the state of an entity and of a workflow involving the entity).

In embodiments, data resources may include, among many others, energy-relevant public data resources 162, such as energy grid data 422 (such as historical, current and anticipated/predicted maintenance status, operating status, energy production status, capacity, efficiency, or other attribute of energy grid assets involved in generation, storage or transmission of energy); energy market data 424 (such as historical, current and anticipated/predicted pricing data for energy or energy-related entities, including spot market prices of energy based on location, type of consumption, type of generation and the like, day-ahead or other futures market pricing for the same, costs of fuel, cost of raw materials involved (e.g., costs of materials used in battery production), costs of energy-related activities, such as mineral extraction, and many others); location and mobility data 428 (such as data indicating historical, current and/or anticipated/predicted locations or movements of groups of individuals (e.g., crowds attending large events, such as concerts, festivals, sporting events, conventions, and the like), data indicating historical, current and/or anticipated/predicted locations or movements of vehicles (such as used in transportation of people, goods, fuel, materials, and the like), data indicating historical, current and/or anticipated/predicted locations or movements of points of production and/or demand for resources, and others); and weather and climate data 430 (such as indicating historical, current and/or anticipated/predicted energy-relevant weather patterns, including temperature data, precipitation data, cloud cover data, humidity data, wind velocity data, wind direction data, storm data, barometric pressure data, and others).

In embodiments, the data resources for energy edge orchestration 110 may include enterprise data resources 168, which may include, among many others, energy-relevant financial and transactional data 432 (such as indicating historical, current and/or anticipated/predicted state, event, or workflow data involving financial entities, assets, and the like, such as data relating to prices and/or costs of energy and/or of goods and services, data related to transactions, data relating to valuation of assets, balance sheet data, accounting data, data relating to profits or losses, data relating to investments, interest rate data, data relating to debt and equity financing, capitalization data, and many others); operational data 434 (such as indicating historical, current and/or anticipated/predicted states or flows of operating entities, such as relating to operation of assets and systems used in production of goods and performance of services, relating to movement of individuals, devices, vehicles, machines and systems, relating to maintenance and repair operations, and many others); human resources data 438 (such as indicating historical, current and/or anticipated/predicted states, activities, locations or movements of enterprise personnel); and sales and marketing data 440 (such as indicating historical, current and/or anticipated/predicted states or activities of customers, advertising data, promotional data, loyalty program data, customer behavioral data, demand planning data, pricing data, and many others); and others.

In embodiments, the data resources for energy edge optimization 110 may be handled by an adaptive energy data pipeline 164, which may leverage artificial intelligence capabilities of the platform 102 in order to optimize the handling of the various data resources. Increases in processing power and storage capacity of devices are combining with wider deployment of edge and IoT devices to produce massive increases in the scale and granularity of data of available data of the many types described herein. Accordingly, even more powerful networks like 5G, and anticipated 6G, are likely to have difficulty transmitting available volumes of data without problems of congestion, latency, errors, and reduced QoS. The adaptive energy edge data pipeline 164 can include a set of artificial intelligence capabilities for adapting the pipeline of the data resources 110 to enable more effective orchestration of energy-related activities, such as by optimizing various elements of data transmission in coordination with energy orchestration needs. In embodiments, the adaptive energy data pipeline 164 may include self-organizing data storage 412 (such as storing data on a device or system (e.g., an edge, IoT, or other networking device, cloud or data center system, on-premises system, or the like) based on the patterns or attributes of the data (e.g., patterns in volume of data over time, or other metrics), the content of the data, the context of the data (e.g., whether the data relates high-stakes enterprise activities), and the like). In embodiments, the adaptive energy data pipeline 164 may include automated, adaptive networking 414 (such as adaptive routing based on network route conditions (including packet loss, error rates, QoS, congestion, cost/pricing and the like)), adaptive protocol selection (such as selecting among transport layer protocols (e.g., TCP or UDP) and others), adaptive routing based on RF conditions (e.g., adaptive selection among available RF networks (e.g., Bluetooth, Zigbee, NFC, and others)), adaptive filtering of data (e.g., DSP-based filtering of data based on recognition of whether a device is permitted to use RF capability), adaptive slicing of network bandwidth, adaptive use of cognitive and/or peer-to-peer network capacity, and others. In embodiments, the adaptive energy data pipeline 164 may include enterprise contextual adaptation 418, such as where data is automatically processed based on context (such as operating context of an enterprise (e.g., distinguishing between mission-critical and less critical operations, distinguishing between time-sensitive and other operations, distinguishing between context required for compliance with policy or law, and the like), transactional or financial context (e.g., based on whether the data is required based on contractual requirements, based on whether the data is useful or necessary for real-time transactional or financial benefits (e.g., time-sensitive arbitrage opportunities or damage-mitigation needs)), and many others). In embodiments, the adaptive energy data pipeline 164 may include market-based adaptation 420, such as where storage, networking, or other adaptation is based on historical, current and/or anticipated/predicted market factors (such as based on the cost of storage, transmission and/or processing of the data (including the cost of energy used for the same), the price, cost, and/or marginal profit of goods or services that are produced based on the data, and many others).

In embodiments, the adaptive energy data pipeline 164 may adapt any and all aspects of data handling, including storage, routing, transmission, error correction, timing, security, extraction, transformation, loading, cleansing, normalization, filtering, compression, protocol selection (including physical layer, media access control layer and application layer protocol selection), encoding, decoding, and others.

Figure 5:
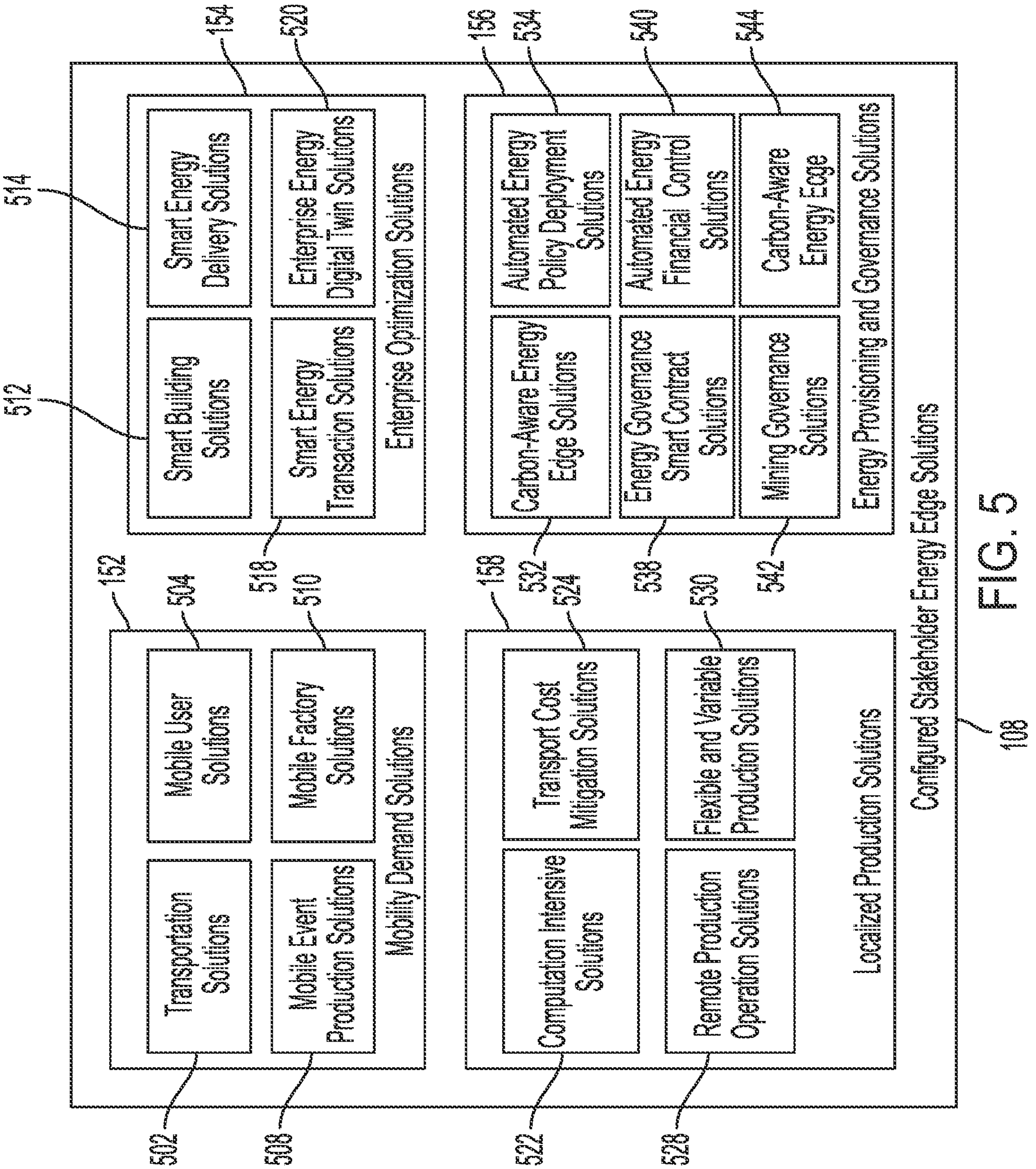
FIG. 5 is a schematic diagram that presents more detail on configured energy edge stakeholders, according to some embodiments.

FIG. 5: More Detail on Configured Energy Edge Stakeholder Solutions Localized Production Referring to FIG. 5, the platform 102 may orchestrate the various services and capabilities described in order to configure the set of configured stakeholder energy edge solutions 108, including the mobility demand solutions 152, enterprise optimization solutions 154, localized production solutions 158, and energy provisioning and governance solutions 108.

The set of localized production solutions 158 may include a set of computation intensive solutions 522 where the demand for energy involved in computation activities in a location is operationally significant, either in terms of overall energy usage or peak demand (particularly ones where location is a relevant factor in operations, but energy availability may not be assured in adequate capacity, at acceptable prices), such as data center operations (e.g., to support high-frequency trading operations that require low-latency and benefit from close proximity to the computational systems of marketplaces and exchanges), operations using quantum computation, operations using very large neural networks or computation-intensive artificial intelligence solutions (e.g., encoding and decoding systems used in cryptography), operations involving complex optimization solutions (e.g., high-dimensionality database operations, analytics and the like, such as route optimization in computer networks, behavioral targeting in marketing, route optimization in transportation), operations supporting cryptocurrencies (such as mining operations in cryptocurrencies that use proof-of-work or other computationally intensive approaches), operations where energy is sourced from local energy sources (e.g., hydropower dams, wind farms, and the like), and many others.

The set of localized production solutions 158 may include a set of transport cost mitigation solutions 524, such as ones where the cost of energy required to transport raw materials or finished goods to a point of sale or to a point of use is a significant component in overall cost of goods. The transport cost mitigation solutions 524 may configure a set of distributed energy resources 128 or other advanced energy resources 104 to provide energy that either supplements or substitutes for conventional grid energy in order to allow localized production of goods that are conventionally produced remotely and transported by transportation and logistics networks (e.g., long-haul trucking) to points of sale or use. For example, crops that have high water content can be produced locally, such as in containers that are equipped with lighting systems, hydration systems, and the like in order to shift the energy mix toward production of the crops, rather than transportation of the finished goods. The platform 102 may be used to optimize, at a fleet level, the mix of a set of localized, modular energy generation systems or storage systems to support a set of localized production systems for heavy goods, such as by rotating the energy generation or storage systems among the localized production systems to meet demand (e.g., seasonal demand, demand based on crop cycles, demand based on market cycles and the like).

The set of localized production solutions 158 may include a set of remote production operation solutions 528, such as to orchestrate distributed energy resources 128 or other advanced energy resources 104 to provide energy in a more optimal way to remote operations, such as mineral mining operations, energy exploration operations, drilling operations, military operations, firefighting and other disaster response operations, forestry operations, and others where localized energy demand at given points of time periodically exceeds what can be provided by the energy grid, or where the energy grid is not available. This may include orchestration of the routing and provisioning of a fleet of portable energy storage systems (e.g., vehicles, batteries, and others), the routing and provisioning of a fleet of portable renewable energy generation systems (wind, solar, nuclear, hydropower and others), and the routing and provisioning of fuels (e.g., fuel cells).

The set of localized production solutions 158 may include a set of flexible and variable production solutions 530, such as where a set of production assets (e.g., 3D printers, CNC machines, reactors, fabrication systems, conveyors and other components) are configured to interface with a set of modular energy production systems, such as to accept a combination of energy from the grid and from a localized energy generation or storage source, and where the energy storage and generation systems are configured to be modular, removable, and portable among the production assets in order to provide grid augmentation or substitution at a fleet level, without requiring a dedicated energy asset for each production asset. The platform 102 may be used to configure and orchestrate the set of energy assets and the set of production assets in order to optimize localized production, including based on various factors noted herein, such as marketplace conditions in the energy market and in the market for the goods and services of an enterprise.

Enterprise Optimization Solutions

The set of configured stakeholder energy edge solutions 108 may also include a set of enterprise optimization solutions 154, such as to provide an enterprise with greater visibility into the role that energy plays in enterprise operations (such as to enable targeted, strategic investment in energy-relevant assets); greater agility in configuring operations and transactions to meet operational and financial objectives that are driven at least in part by energy availability energy market prices or the like; improved governance and control over energy-related factors, such as carbon production, waste heat and pollution emissions; and improved efficiency in use of energy at any and all scales of use, ranging from electronic devices and smart buildings to factories and energy extraction activities. The term "enterprise," as used herein, may, except where context requires otherwise, include private and public enterprises, including corporations, limited liability companies, partnerships, proprietorships and the like, non-governmental organizations, for-profit organizations, non-profit organizations, public-private partnerships, military organizations, first responder organizations (police, fire departments, emergency medical services and the like), private and public educational entities (schools, colleges, universities and others), governmental entities (municipal, county, state, provincial, regional, federal, national and international), agencies (local, state, federal, national and international, cooperative (e.g., treatybased agencies), regulatory, environmental, energy, defense, civil rights, educational, and many others), and others. Examples provided in connection with a for-profit business should be understood to apply to other enterprises, and vice versa, except where context precludes such applicability.

The enterprise optimization solutions 154 may include a set of smart building solutions 512, where the platform 102 may be used to orchestrate energy generation, transmission, storage and/or consumption across a set of buildings owned or operated by the enterprise, such as by aggregating energy purchasing transactions across a fleet of smart buildings, providing a set of shared mobile or portable energy units across a fleet of smart buildings that are provisioned based on contextual factors, such as utilization requirements, weather, market prices and the like at each of the buildings, and many others.

Enterprise optimization solutions 154 may include a set of smart energy delivery solutions 514, where the platform 102 may be used to orchestrate delivery or energy at a favorable cost and at a favorable time to a point of operational use. In embodiments, the platform 102 may, for example, be used to time the routing of liquid fuel through elements of a pipeline by automatically controlling switching points of the pipeline based on contextual factors, such as operational utilization requirements, regulatory requirements, market prices, and the like. In other embodiments, the platform 102 may be used to orchestrate routing of portable energy storage units or portable energy generation units in order to deliver energy to augment or substitute for grid energy capacity at a point and time of operational use. In embodiments, the platform 102 may be used to orchestrate routing and delivery of wireless power to deliver energy to a point and time of use. Energy delivery optimization may be based on market prices (historical, current, futures market, and/or predicted), based on operational conditions (current and predicted), based on policies (e.g., dictating priority for certain uses) and many other factors.

Enterprise optimization solutions 154 may include a set of smart energy transaction solutions 518, where the platform 102 may be used to orchestrate transactions in energy or energy-related entities (e.g., renewable energy credits (RECs), pollution abatement credits, carbon-reduction credits, or the like) across a fleet of enterprise assets and/or operations, such as to optimize energy purchases and sales in coordination with energy-relevant operations at any and all scales of energy usage. This may include, in embodiments, aggregating and timing current and futures market energy purchases across assets and operations, automatically configuring purchases of shared generation, storage or delivery capacity for enterprise operational usage and the like. The platform 102 may leverage blockchain, smart contract, and artificial intelligence capabilities, trained as described throughout this disclosure, to undertake such activities based on the operational needs, strategic objectives, and contextual factors of an enterprise, as well as external contextual factors, such as market needs. For example, an anticipated need for energy by an enterprise machine may be provided as an event stream to a smart contract, which may automatically secure a future energy delivery contract to meet the need, either by purchasing grid-based energy from a provider or by ordering a portable energy storage unit, among other possibilities. The smart contract may be configured with intelligence, such as to time the purchase based on a predicted market price, which may be predicated, such as by an intelligent agent, based on historical market prices and current contextual factors.

Enterprise optimization solutions 154 may include a set of enterprise energy digital twin solutions 520, where the platform 102 may be used to collect, monitor, store, process and represent in a digital twin a wide range of data representing states, conditions, operating parameters, events, workflows and other attributes of energy-relevant entities, such as assets of the enterprise involved in operations, assets of external entities that are relevant to the energy utilization or transactions of the enterprise (e.g., energy grid entities, pipelines, charging locations, and the like), energy market entities (e.g., counterparties, smart contracts, blockchains, prices and the like). A user of the set of enterprise energy digital twin solutions 520 may, for example, view a set of factories that are consuming energy and be presented with a view that indicates the relative efficiency of each factory, of individual machines within the factory, or of components of the machines, such as to identify inefficient assets or components that should be replaced because the cost of replacement would be rapidly recouped by reduced energy usage. The digital twin, in such example, may provide a visual indicator of inefficient assets, such as a red flag, may provide an ordered list of the assets most benefiting from replacement, may provide a recommendation that can be accepted by the user (e.g., triggering an order for replacement), or the like. Digital twins may be role-based, adaptive based on context or market conditions, personalized, augmented by artificial intelligence, and the like, in the many ways described herein and in the documents incorporated by reference herein.

Mobility Demand Solutions

Referring still to FIG. 5, the set of configured stakeholder energy edge solutions 108 may include a set of mobility demand solutions 152, such as where the platform 102 may be used to orchestrate energy generation, storage, delivery and or consumption by or for a set of mobile entities, such as a fleet of vehicles, a set of individuals, a set of mobile event production units, or a set of mobile factory units, among many others.

The set of mobility demand solutions 510 may include a set of transportation solutions 502, such as where the platform 102 may be used to orchestrate energy generation, storage, delivery and or consumption by or for a set of vehicles, such as used to transport goods, passengers, or the like. The platform 102 may handle relevant operational and contextual data, such as indicating needs, priorities, and the like for transportation, as well as relevant energy data, such as the cost of energy used to transport entities using different modes of transportation at different points in time, and may provide a set of recommendations, or automated provisioning, of transportation in order to optimize transportation operations while accounting fully for energy costs and prices. For example, among many others, an electric or hybrid passenger tour bus may be automatically routed to a scenic location that is in proximity to a low cost, renewable energy charging station, so that the bus can be recharged while the tourists experience the location, thus satisfying an energy-related objective (cost reduction) and an operational objective (customer satisfaction). An intelligent agent may be trained, using techniques described herein and in the documents incorporated by reference (such as by training robotic process automation on a training set of expert interactions), to provide a set of recommendations for optimizing energy-related objectives and other operational objectives.

The set of mobility demand solutions 510 may include a set of mobile user solutions 504, such as where the platform 102 may be used to orchestrate energy generation, storage, delivery and or consumption by or for a set of mobile users, such as users of mobile devices. For example, in anticipation of a large, temporary increase in the number of people at a location (such as in a small city hosting a major sporting event), the platform 102 may provide a set of recommendations for, or automatically configure a set of orders for a set of portable recharging units to support charging of consumer devices.

The set of mobility demand solutions 510 may include a set of mobile event production solutions 508, such as where the platform 102 may be used to orchestrate energy generation, storage, delivery and or consumption by or for a set of mobile entities involved in production of an event, such as a concert, sporting event, convention, circus, fair, revival, graduation ceremony, college reunion, festival, or the like. This may include automatically configuring a set of energy generation, storage or delivery units based on the operational configuration of the event (e.g., to meet needs for lighting, food service, transportation, loudspeakers and other audio-visual elements, machines (e.g., 3D printers, video gaming machines, and the like), rides and others), automatically configuring such operational configuration based on energy capabilities, configuring one or more of energy or operational factors based on contextual factors (e.g., market prices, demographic factors of attendees, or the like), and the like.

The set of mobility demand solutions 510 may include a set of mobile factory solutions 510, such as where the platform 102 may be used to orchestrate energy generation, storage, delivery and or consumption by or for a set of mobile factory entities. These may include container-based factories, such as where a 3D printer, CNC machine, closed-environment agriculture system, semiconductor fabricator, gene editing machine, biological or chemical reactor, furnace, or other factory machine is integrated into or otherwise contained in a shipping container or other mobile factory housing, wherein the platform 102 may, based on a set of operational needs of the set of factory machines, configure a set of recommendations or instructions to provision energy generation, storage, or delivery to meet the operational needs of the set of factory machine at a set of times and places. The configuration may be based on energy factors, operational factors, and/or contextual factors, such as market prices of goods and energy, needs of a population (such as disaster recovery needs), and many other factors.

Energy Provisioning and Governance Solutions

Referring still to FIG. 5, the set of configured stakeholder energy edge solutions 108 may include a set of energy provisioning and governance solutions 156, such as where the platform 102 may be used to orchestrate energy generation, storage, delivery and or consumption by or for a set of entities based on a set of policies, regulations, laws, or the like, such as to facilitate compliance with company financial control policies, government or company policies on carbon reduction, and many others.

The set of energy provisioning and governance solutions 156 may include a set of carbon-aware energy edge solutions 532, such as where a set of policies regarding carbon generation may be explored, configured, and implemented in the platform 102, such as to require energy production by one or more assets or operations to be monitored in order to track carbon generation or emissions, to require offsetting of such generation or emissions, or the like. In embodiments, energy generation control instructions (such as for a machine or set of machines) may be configured with embedded policy instructions, such as required confirmation of available offsets before a machine is permitted to generate energy (and carbon), or before a machine can exceed a given amount of production in a given period. In embodiments, the embedded policy instructions may include a set of override provisions that enable the policy to be overridden (such as by a user, or based on contextual factors, such as a declared state of emergency) for mission critical or emergency operations. Carbon generation, reduction and offsets may be optimized across operations and assets of an enterprise, such as by an intelligent agent trained in various ways as described elsewhere in this disclosure.

The set of energy provisioning and governance solutions 156 may include a set of automated energy policy deployment solutions 534, such as where a user may interact with a user interface to design, develop or configure (such as by entering rules or parameters) a set of policies relating to energy generation, storage, delivery and/or utilization, which may be handled by the platform, such as by presenting the policies to users who interact with entities that are subject to the policies (such as interfaces of such entities and/or digital twins of such entities, such as to provide alerts as to actions that risk noncompliance, to log noncompliant events, to recommend alternative, compliance options, and the like), by embedding the policies in control systems of entities that generate, store, deliver or use energy (such that operations of such entities are controlled in a manner that is compliant with the policies), by embedding the policies in smart contracts that enable energy-related transactions (such that transactions are automatically executed in compliance with the policies, such that warnings or alerts are provided in the case of non-compliance, or the like), by setting policies that are automatically reconfigured based on contextual factors (such as operational and/or market factors) and others. In embodiments, an intelligent agent may be trained, such as on a training data set of historical data, on feedback from outcomes, and/or on a training data set of human policy-setting interactions, to generate policies, to configure or modify policies, and/or to undertake actions based on policies. A wide range of policies and configurations may be implemented, such as setting maximum energy usage for an entity for a time period, setting maximum energy cost for an entity for a time period, setting maximum carbon production for an entity for a time period, setting maximum pollution emissions for an entity for a time period, setting carbon offset requirements, setting renewable energy credit requirements, setting energy mix requirements (e.g., requiring a minimum fraction of renewable energy), setting profit margin minimums based on energy and other marginal costs for a production entity, setting minimum storage baselines for energy storage entities (such as to provide a margin of safety for disaster recovery), and many others.

The set of energy provisioning and governance solutions 156 may include a set of energy governance smart contract solutions 538, such as to allow a user of the platform 102 to design, generate, configure and/or deploy a smart contract that automatically provides a degree of governance of a set of energy transactions, such as where the smart contract takes a set of operational, market or other contextual inputs (such as energy utilization information collected by edge devices about operating assets) as inputs and automatically configures a set of contracts that are compliance with a set of policies for the purchase, sale, reservation, sharing, or other transaction for energy, energy-related credits, and the like. For example, a smart contract may automatically aggregate carbon offset credits needed to balance carbon generation detected across a set of machines used in enterprise operations.

The set of energy provisioning and governance solutions 156 may include a set of automated energy financial control solutions 540, such as to allow a user of the platform 102 and/or an intelligent agent to design, generate, configure, or deploy a policy related to control of financial factors related to energy generation, storage, delivery and/or utilization. For example, a user may set a policy requiring minimum marginal profit for a machine to continue operation, and the policy may be presented to an operator of the machine, to a manager, or the like. As another example, the policy may be embedded in a control system for the machine that takes a set of inputs needed to determine marginal profitability (e.g., cost of inputs and other non-energy resources used in production, cost of energy, predicted energy required to produce outputs, and market price of outputs) and automatically determines whether to continue production, and at what level, in order to maintain marginal profitability. Such a policy may take further inputs, such as relating to anticipated market and customer behavior, such as based on elasticity of demand for relevant outputs.

Figure 6:
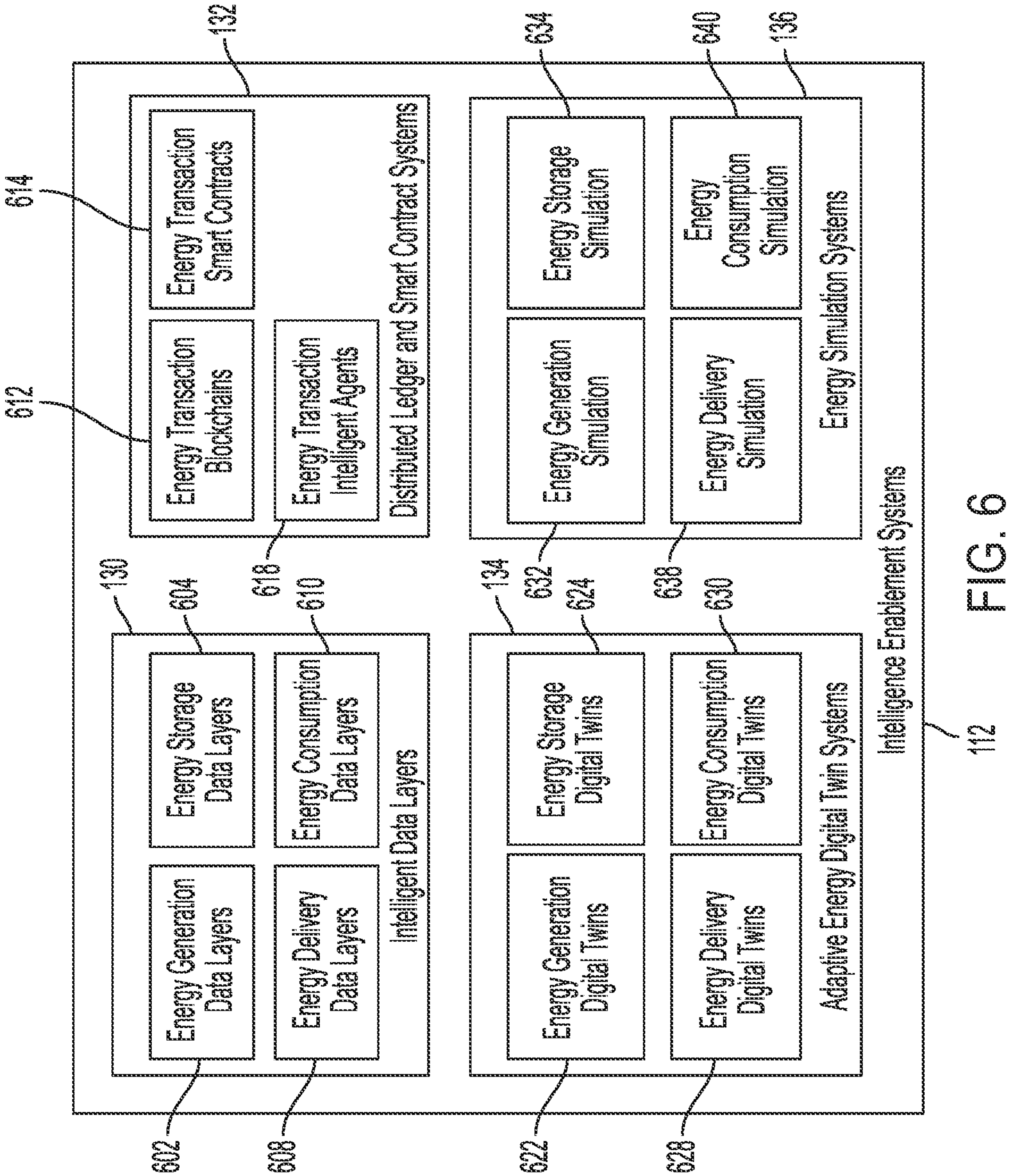
FIG. 6 is a schematic diagram that presents more detail on intelligence enablement systems, according to some embodiments.

FIG. 6: More Detail on Intelligence Enablement Systems

Referring to FIG. 6, further detail is provided as to embodiments of the intelligence enablement systems 112, including the intelligent data layers 130, the distributed ledger and smart contract systems 132, the adaptive energy digital twin systems 134 and the energy simulation systems 136.

The intelligent data layers 130 may undertake any of the wide range of data processing capabilities noted throughout this disclosure and the documents incorporated by reference herein, optionally autonomously, under user supervision, or with semi-supervision, including extraction, transformation, loading, normalization, cleansing, compression, route selection, protocol selection, self-organization of storage, filtering, timing of transmission, encoding, decoding, and many others. The intelligent data layers 130 may include energy generation data layers 602 (such as producing and automatically configuring and routing streams or batches of data relating to energy generation by a set of entities, such as operating assets of an enterprise), energy storage data layers 604 (such as producing and automatically configuring and routing streams or batches of data relating to energy storage by a set of entities, such as operating assets of an enterprise or assets of a set of customers), energy delivery data layers 608 (such as producing and automatically configuring and routing streams or batches of data relating to energy delivery by a set of entities, such as delivery by transmission line, by pipeline, by portable energy storage, or others), and energy consumption data layers 610 (such as producing and automatically configuring and routing streams or batches of data relating to energy consumption by a set of entities, such as operating assets of an enterprise, a set of customers, a set of vehicles, or the like).

The distributed ledger and smart contract systems 132 may provide a set of underlying capabilities to enable energy-related transactions, such as purchases, sales, leases, futures contracts, and the like for energy generation, storage, delivery, or consumption, as well as for related types of transactions, such as in renewable energy credits, carbon abatement credits, pollution abatement credits, leasing of assets, shared economy transactions for asset usage, shared consumption contracts, bulk purchases, provisioning of mobile resources, and many others. This may include a set of energy transaction blockchains 612 or distributed ledgers to record energy transactions, including generation, storage, delivery, and consumption transactions. A set of energy transaction smart contracts 614 may operate on blockchain events and other input data to enable, configure, and execute the aforementioned types of transactions and others. In embodiments, a set of energy transaction intelligent agents 618 may be configured to design, generate, and deploy the smart contracts 614, to optimize transaction parameters, to automatically discover counterparties, arbitrage opportunities, and the like, to recommend and/or automatically initiate steps to contract offers or execution, to resolve contracts upon completion based on blockchain data, and many other functions.

The adaptive energy digital twin systems 134 may include digital twins of energy-related entities, such as operating assets of an enterprise that generate, store, deliver, or consume energy, and may include may include energy generation digital twins 622 (such as displaying content from event logs, or from streams or batches of data relating to energy generation by a set of entities, such as operating assets of an enterprise), energy storage digital twins 624 (such as displaying energy storage status information, usage patterns, or the like for a set of entities, such as operating assets of an enterprise or assets of a set of customers), energy delivery digital twins 628 (such as displaying status data, events, workflows, and the like relating to energy delivery by a set of entities, such as delivery by transmission line, by pipeline, by portable energy storage, or others), and energy consumption digital twins 630 (such as displaying data relating to energy consumption by a set of entities, such as operating assets of an enterprise, a set of customers, a set of vehicles, or the like). The adaptive energy digital twin systems 134 may include various types of digital twin described throughout this disclosure and/or the documents incorporated herein by reference, such as ones fed by data streams from edge and IoT devices, ones that adapt based on user role or context, ones that adapt based on market context, ones that adapt based on operating context, and many others.

The set of energy simulation systems 136 may include a wide range of systems for the simulation of energy-related behavior based on historical patterns, current states (including contextual, operating, market and other information), and anticipated/predicted states of entities involved in generation, storage, delivery and/or consumption of energy. This may include an energy generation simulation 632, energy storage simulation 634, energy delivery simulation 638 and energy consumption simulation 640, among others. The simulation systems 136 may employ a wide range of simulation capabilities, such as 3D visualization simulation of behavior of physical, presentation of simulation outputs in a digital twin, generation of simulated financial outcomes for a set of different operational scenarios, generation of simulated operational outcomes, and many others. Simulation may be based on a set of models, such as models of the energy generation, storage, delivery and/or consumption behavior of a machine or system, or a fleet of machines or systems (which may be aggregated based on underlying models and/or based on projection to a larger set from a subset of models). Models may be iteratively improved, such as by feedback of outcomes from operations and/or by feedback comparing model-based predictions to actual outcomes and/or predictions by other models or human experts. Simulations may be undertaken using probabilistic techniques, by random walk or random forest algorithms, by projections of trends from past data on current conditions, or the like. Simulations may be based on behavioral models, such as models of enterprise or individual behavior based on various factors, including past behavior, economic factors (e.g., elasticity of demand or supply in response to price changes), energy utilization models, and others. Simulations may use predictions from artificial intelligence, including artificial intelligence trained by machine learning (including deep learning, supervised learning, semi-supervised learning, or the like). Simulations may be configured for presentation in augmented reality, virtual reality and/or mixed reality interfaces and systems (collectively referred to as "XR"), such as to enable a user to interact with aspects of a simulation in order to be trained to control a machine, to set policies, to govern a factory or other entity that includes multiple machines, to handle a fleet of machines or factories, or the like. As one example among many, a simulation of a factory may simulate the energy consumption of all machines in the factory while presenting other data, such as operational data, input costs, production costs, computation costs, market pricing data, and other content in the simulation. In the simulation, a user may configure the factory, such as by setting output levels for each machine, and the simulation may simulate profitability of the factory based on a variety of simulated market conditions. Thus, the user may be trained to configure the factory under a variety of different market conditions.

Figure 7:
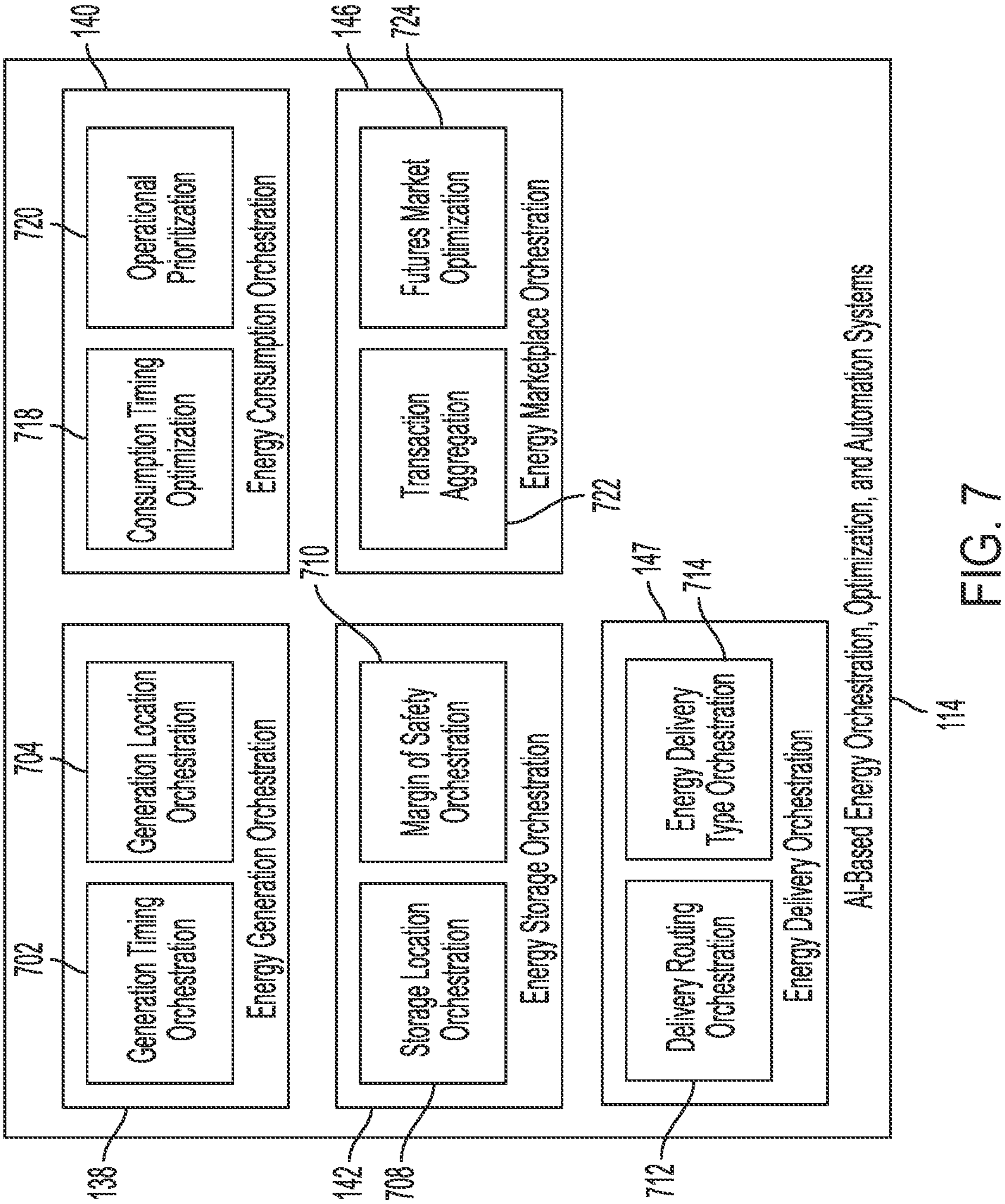
FIG. 7 is a schematic diagram that presents more detail on AI-based energy orchestration, according to some embodiments.

FIG. 7: More Detail on AI-Based Energy Orchestration, Optimization, and Automation Systems Referring to FIG. 7 more detail is provided with respect to the set of AI-based energy orchestration, optimization, and automation systems 114, each of which may use various other capabilities, services, functions, modules, components, or other elements of the platform 102 in order to orchestrate energy-related entities, workflows, or the like on behalf of an enterprise or other user. Orchestration may, for example, use robotic process automation to facilitate automated orchestration of energy-related entities and resources based on training data sets and/or human supervision based on historical human interaction data. As another example, orchestration may involve design, configuration, and deployment of a set of intelligent agents, which may automatically orchestrate a set of energy-related workflows based on operational, market, contextual and other inputs. Orchestration may involve design, configuration, and deployment of autonomous control systems, such as systems that control energy-related activities based on operational data collected by or from onboard sensors, edge devices, IoT devices and the like. Orchestration may involve optimization, such as optimization of multivariate decisions based on simulation, optimization based on real-time inputs, and others. Orchestration may involve use of artificial intelligence for pattern recognition, forecasting and prediction, such as based on historical data sets and current conditions.

The set of AI-based energy orchestration, optimization, and automation systems 114 may include the set of energy generation orchestration systems 138, the set of energy consumption orchestration systems 140, the set of energy storage orchestration systems 142, the set of energy marketplace orchestration systems 146 and the set of energy delivery orchestration systems 147, among others.

The set of energy generation orchestration systems 138 may include a set of generation timing orchestration systems 702 and a set of location orchestration systems 704, among others. The set of timing orchestration systems 702 may orchestrate the timing of energy generation, such as to ensure that timing of generation meets mission critical or operational needs, complies with policies and plans, is optimized to improve financial or operational metrics and/or (in the case of energy generated for sale) is well-timed based on fluctuations of energy market prices. Generation timing orchestration can be based on models, simulations, or machine learning on historical data sets. Generation timing orchestration can be based on current conditions (operating, market, and others).

The set of generation location orchestration systems 704 may orchestrate location of generation assets, including mobile or portable generation assets, such as portable generators, solar systems, wind systems, modular nuclear systems and others, as well as selection of locations for larger-scale, fixed infrastructure generation assets, such as power plants, generators, turbines, and others, such as to ensure that for any given operational location, available generation capacity (baseline and peak capacity) meets mission critical or operational needs, complies with policies and plans, is optimized to improve financial or operational metrics and/or (in the case of energy generated for sale) is well-located based on local variations in energy market prices. Generation location orchestration can be based on models, simulations, or machine learning on historical data sets. Generation location orchestration can be based on current conditions (operating, market, and others).

The set of energy consumption orchestration systems 140 may include a set of consumption timing optimization systems 718 and a set of operational prioritization systems 720, among others. The set of consumption timing optimization systems 718 may orchestrate timing consumption, such as to shift consumption for non-critical activities to lower-cost energy resources (e.g., by shifting to off-peak times to obtain lower electricity pricing for grid energy consumption, shifting to lower cost resources (e.g., renewable energy systems in lieu of the grid), to shift consumption to activities that are more profitable (e.g., to shift consumption to a machine that has a high marginal profit per time period based on current market and operating conditions (such as detected by a combination of edge and IoT devices and market data sources), and the like).

The set of operational prioritization systems 720 may enable a user, intelligent agent, or the like to set operational priorities, such as by rule or policy, by setting target metrics (e.g., for efficiency, marginal profit production, or the like), by declaring mission-critical operations (e.g., for safety, disaster recovery and emergency systems), by declaring priority among a set of operating assets or activities, or the like. In embodiments, energy consumption orchestration may take inputs from operational prioritization to provide a set of recommendations or control instructions to optimize energy consumption by a machine, components, a set of machines, a factory, or a fleet of assets.

The set of energy storage orchestration systems 142 may include a set of storage location orchestration systems 708 and a set of margin-of-safety orchestration systems 710. The set of storage location orchestration systems 708 may orchestrate location of storage assets, including mobile or portable generation assets, such as portable batteries, fuel cells, nuclear storage systems and others, as well as selection of locations for larger-scale, fixed infrastructure storage assets, such as large-scale arrays of batteries, fuel storage systems, thermal energy storage systems (e.g., using molten salt), gravity-based storage systems, storage systems using fluid compression, and others, such as to ensure that for any given operational location, available storage capacity meets mission critical or operational needs, complies with policies and plans, is optimized to improve financial or operational metrics and/or (in the case of energy stored and provide for sale) is well-located based on local variations in energy market prices. Storage location orchestration can be based on models, simulations, or machine learning on historical data sets, such as behavioral models that indicate usage patterns by individuals or enterprises. Storage location orchestration can be based on current conditions (operating, market, and others) and many other factors; for example, storage capacity can be brought to locations where grid capacity is offline or unusually constrained (e.g., for disaster recovery).

The set of margin of safety orchestration systems 710 may be used to orchestrate storage capacity to preserve a margin of safety, such as a minimum amount of stored energy to power mission critical systems (e.g., life support systems, perimeter security systems, or the like) or high priority systems (e.g., high-margin manufacturing) for a defined period in case of loss of baseline energy capacity (e.g., due to an outage or brownout of the grid) or inadequate renewable energy production (e.g., when there is inadequate wind, water or solar power due to weather conditions, drought, or the like). The minimum amount may be set by rule or policy, or may be learned adaptively, such as by an intelligent agent, based on a training data set of outcomes and/or based on historical, current, and anticipated conditions (e.g., climate and weather forecasts). The margin of safety orchestration system 710 may, in embodiments, take inputs from the energy provisioning and governance solutions 156.

The set of energy marketplace orchestration systems 146 may include a set of transaction aggregation systems 722 and a set of futures market optimization systems 724.

The set of transaction aggregation systems 722 systems may automatically orchestrate a set of energy-related transactions, such as purchases, sales, orders, futures contracts, hedging contracts, limit orders, stop loss orders, and others for energy generation, storage, delivery or consumption, for renewable energy credits, for carbon abatement credits, for pollution abatement credits, or the like, such as to aggregate a set of smaller transactions into a bulk transaction, such as to take advantage of volume discounts, to ensure current or day-ahead pricing when favorable, to enable fractional ownership by a set of owners, operators, or consumers of a block of energy generation, storage, or delivery capacity, or the like. For example, an enterprise may aggregate energy purchases across a set of assets in different jurisdictions by use of an intelligent agent that aggregates a set of futures market energy purchases across the jurisdiction and represents the aggregated purchases in a centralized location, such as an operating digital twin of the enterprise.

The set of futures market optimization systems 724 may automatically orchestrate aggregation of a set of futures markets contracts for energy, renewable energy credits, for carbon offsets or abatement credits, for pollution abatement credits, or the like based on a forecast of future energy needs for an individual or enterprise. The forecast may be based on historical usage patterns, current operating conditions, current market conditions, anticipated operational needs, and the like. The forecast may be generated using a predictive model and/or by an intelligent agent, such as one based on machine learning on outcomes, on human output, on human-labeled data, or the like. The forecast may be generated by deep learning, supervised learning, semi-supervised learning, or the like. Based on the forecast, an intelligent agent may design, configure, and execute a series of futures market transactions across various jurisdictions to meet anticipated timing, location, and type of needs.

The set of energy delivery orchestration systems 147 may include a set of delivery routing orchestration systems 712 and a set of energy delivery type orchestration systems 714.

The set of energy delivery routing orchestration systems 712 may use various components, modules, facilities, services, functions and other elements of the platform 102 to orchestrate routing of energy delivery, such as based on location, timing and type of needs, available generation and storage capacity at places of energy need, available energy sources for routing (e.g., liquid fuel, portable energy generation systems, portable energy storage systems, and the like), available routes (e.g., main pipelines, pipeline branches, transmission lines, wireless power transfer systems, and transportation infrastructure (roads, railways and waterways, among others)), market factors (price of energy, price of goods, profit margins for production activities, timing of events that require energy, and others), environmental factors (e.g., weather), operational priorities, and others. A set of artificial intelligence systems trained in various ways disclosed herein may be trained to recommend or to configure a route, such as based on the foregoing inputs and a set of training data, such as human routing activities, a route optimization model, iteration among a large number of simulated scenarios, or the like, or combination of any of the foregoing. For example, a set of control instructions may direct valves and other elements of an energy pipeline to deliver an amount of fluid-based energy to a location while directing mobile or portable resources to another location that would otherwise have reduced energy availability based on the pipeline routing instructions.

The set of energy delivery type orchestration systems 714 may use various components, modules, facilities, services, functions and other elements of the platform 102 to orchestrate optimization of the type of energy delivery, such as based on location, timing and type of needs, available generation and storage capacity at places of energy need, available energy sources for routing (e.g., liquid fuel, portable energy generation systems, portable energy storage systems, and the like), available routes (e.g., main pipelines, pipeline branches, transmission lines, wireless power transfer systems, and transportation infrastructure (roads, railways and waterways, among others)), market factors (price of energy, price of goods, profit margins for production activities, timing of events that require energy, and others), environmental factors (e.g., weather), operational priorities, and others. A set of artificial intelligence systems trained in various ways disclosed herein may be trained to recommend or to configure a mix of energy types, such as based on the foregoing inputs and a set of training data, such as human type selection activities, a delivery type optimization model, iteration among a large number of simulated scenarios, or the like, or combination of any of the foregoing. For example, a set of recommendations or control instructions may select a set of portable, modular energy resources that are compatible with needs (e.g., specifying renewable sources where there is high storage capacity to meet operational needs, such that inexpensive, intermittent sources are preferred), while the instructions may select more expensive natural gas energy where storage capacity is limited or absent and usage is continuous (such as for a 24/7 data center that operates remotely from the energy grid).

Many other examples of AI-based energy orchestration, optimization, and automation 114 are provided throughout this disclosure.

Figure 8:
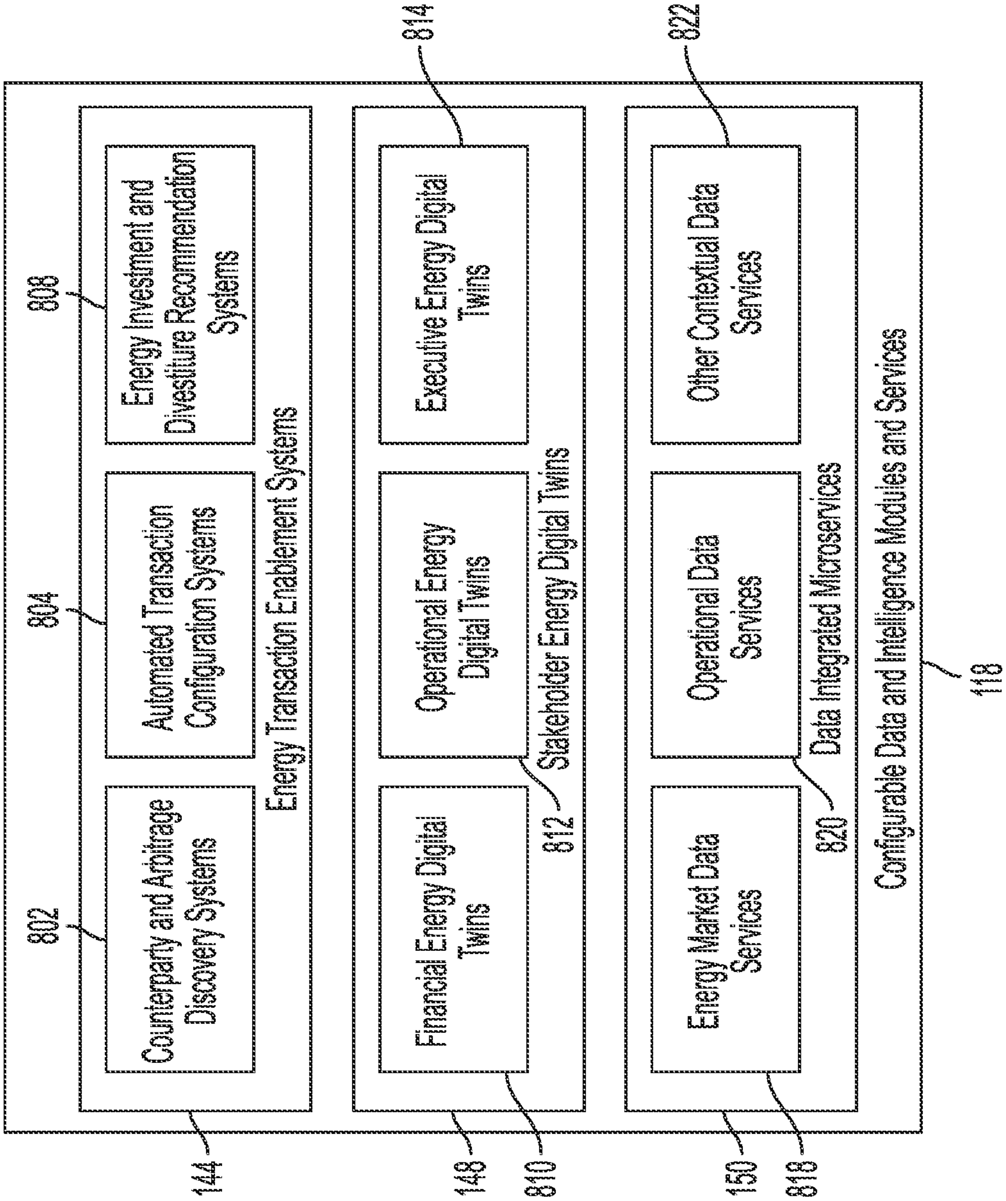
FIG. 8 is a schematic diagram that presents more detail on configurable data and intelligence, according to some embodiments.

FIG. 8: More Detail on Configurable Data and Intelligence Modules and Services Referring to FIG. 8 the set of configurable data and intelligence modules and services 118 may include the set of energy transaction enablement systems 144, the set of stakeholder energy digital twins 148 and the set of data integrated microservices 150, among many others. These data and intelligence modules may include various components, modules, services, subsystems, and other elements needed to configure a data stream or batch, to configure intelligence to provide a particular type of output, or the like, such as to enable other elements of the platform 102 and/or various stakeholder solutions.

The set of energy transaction enablement systems 144 may include a set of counterparty and arbitrage discovery systems 802, a set of automated transaction configuration systems 804 and a set of energy investment and divestiture recommendation systems 808, among others. The set of counterparty and arbitrage discovery systems 802 may be configured to operate on various data sources related to operating energy needs, contextual factors, and a set of energy market, renewable energy credit, carbon offset, pollution abatement credit, or other energy-related market offers by a set of counterparties in order to determine a recommendation or selection of a set of counterparties and offers. An intelligent agent of the counterparty and arbitrage discovery systems 802 may initiate a transaction with a set of counterparties based on the recommendation or selection. Factors may include cost, counterparty reliability, size of counterparty offer, timing, location of energy needs, and many others.

The set of automated transaction configuration systems 804 may automatically or under human supervision recommend or automatically configure terms for a transaction, such as based on contextual factors (e.g., weather), historical, current, or anticipated/predicted market data (e.g., relating to energy pricing, costs of production, costs of storage, and the like), timing and location of operating needs, and other factors. Automation may be by artificial intelligence, such as trained on human configuration interactions, trained by deep learning on outcomes, or trained by iterative improvement through a series of trials and adjustments (e.g., of the inputs and/or weights of a neural network).

The set of energy investment and divestiture recommendation systems 808 may automatically or under human supervision recommend or automatically configure terms for an investment or divestiture transaction, such as based on contextual factors (e.g., weather), historical, current, or anticipated/predicted market data (e.g., relating to energy pricing, costs of production, costs of storage, and the like), timing and location of operating needs, and other factors. Automation may be by artificial intelligence, such as trained on human configuration interactions, trained by deep learning on outcomes, or trained by iterative improvement through a series of trials and adjustments (e.g., of the inputs and/or weights of a neural network). For example, the set of energy investment and divestiture recommendation systems 808 may output a recommendation to invest in additional modular, portable generation units to support locations of planned energy exploration activities or the divestiture of relatively inefficient factories, where energy costs are forecast to produce negative marginal profits.

The set of stakeholder energy digital twins 148 may include a set of financial energy digital twins 810, a set of operational energy digital twins 812 and a set of executive energy digital twins 814, among many others. The set of financial energy digital twins 810 may, for example, represent a set of entities, such as operating assets of an enterprise, along with energy-related financial data, such as the cost of energy being used or forecast to be used by a machine, component, factory, or fleet of assets, the price of energy that could be sold, the cost or price of renewable energy credits available through use of renewable energy generation capacity, the cost or price of carbon offsets needed to offset current of future anticipated operations, the cost of pollution abatement offsets or credits, and the like. The financial energy digital twins 810 may be integrated with other financial reporting systems and interfaces, such as enterprise resource planning suites, financial accounting suites, tax systems, and others.

The set of operational energy digital twins 812 may, for example, represent operational entities involved in energy generation, storage, delivery, or consumption, along with relevant specification data, historical, current or anticipated/predicted operating states or parameters, and other information, such as to enable an operator to view components, machines, systems, factories, and various combinations and sets thereof, on an individual or aggregate level. The operational energy digital twins 812 may display energy data and energy-related data relevant to operations, such as generation, storage, delivery and consumption data, carbon production, pollution emissions, waste heat production, and the like. A set of intelligent agents may provide alerts in the digital twins. The digital twins may automatically adapt, such as by highlighting important changes, critical operations, maintenance, or replacement needs, or the like. The operational energy digital twins 812 may take data from onboard sensors, IoT devices, and edge devices positioned at or near relevant operations, such as to provide real-time, current data.

The set of executive energy digital twins 814 may, for example, display entities involved in energy generation, storage, delivery or consumption, along with relevant specification data, historical, current or anticipated/predicted operating states or parameters, and other information, such as to enable an executive to view key performance metrics driven by energy with respect to components, machines, systems, factories, and various combinations and sets thereof, on an individual or aggregate level. The executive energy digital twins 814 may display energy data and energy-related data relevant to executive decisions, such as generation, storage, delivery and consumption data, carbon production, pollution emissions, waste heat production, and the like, as well as financial performance data, competitive market data, and the like. A set of intelligent agents may provide alerts in the digital twins, such as configured to the role of the executive (e.g., financial data to a CFO, risk management data to a chief legal officer, and aggregate performance data to a CEO or chief strategy officer. The executive energy digital twins 814 may automatically adapt, such as by highlighting important changes, critical operations, strategic opportunities, or the like. The executive energy digital twins 814 may take data from onboard sensors, IoT devices, and edge devices positioned at or near relevant operations, such as to provide real-time, current data.

The set of data integrated microservices 150 may include a set of energy market data services 818, a set of operational data services 820 and a set of other contextual data services 822, among many others.

The set of energy market data services 818 may provide a configured, filtered and/or otherwise processed feed of relevant market data, such as market prices of the goods and services of an enterprise, a feed of historical, current and/or futures market energy prices in the operating jurisdictions of the enterprise (optionally weighted or ordered based on relative energy usage across the jurisdictions), a feed of historical and/or proposed transactions (optionally augmented with counterparty information) configured according to a set of preferences of a user or enterprise (e.g., to show transactions relevant to the operating requirements or energy capacities of the enterprise), a feed of historical, current or future renewable energy credit prices, a feed of historical, current or future carbon offset prices, a feed of historical, current or future pollution abatement credit prices, and others.

The set of operational data services 820 may provide a configured, filtered and/or otherwise processed feed of operational data, such as historical, current, and anticipated/predicted states and events of operating assets of an enterprise, such as collected by sensors, IoT devices and/or edge devices and or anticipated or inferred based on a set of models, analytic systems, and or operation of artificial intelligence systems, such as intelligent forecasting agents.

The set of other contextual data services 822 may provide a wide range of configured, filtered, or otherwise processed feeds of contextual data, such as weather data, user behavior data, location data for a population, demographic data, psychographic data, and many others.

The configurable data integrated microservices of various types may provide various configured outputs, such as batches and files, database reports, event logs, data streams, and others. Streams and feeds may be automatically generated and pushed to other systems, services may be queried and/or may be pulled from sources (e.g., distributed databases, data lakes, and the like), and may be pulled by application programming interfaces.

Neural Network Examples

The foregoing neural networks may have a variety of nodes or neurons, which may perform a variety of functions on inputs, such as inputs received from sensors or other data sources, including other nodes. Functions may involve weights, features, feature vectors, and the like. Neurons may include perceptrons, neurons that mimic biological functions (such as of the human senses of touch, vision, taste, hearing, and smell), and the like. Continuous neurons, such as with sigmoidal activation, may be used in the context of various forms of neural net, such as where back propagation is involved.

In many embodiments, an expert system or neural network may be trained, such as by a human operator or supervisor, or based on a data set, model, or the like. Training may include presenting the neural network with one or more training data sets that represent values, such as sensor data, event data, parameter data, and other types of data (including the many types described throughout this disclosure), as well as one or more indicators of an outcome, such as an outcome of a process, an outcome of a calculation, an outcome of an event, an outcome of an activity, or the like. Training may include training in optimization, such as training a neural network to optimize one or more systems based on one or more optimization approaches, such as Bayesian approaches, parametric Bayes classifier approaches, k-nearest-neighbor classifier approaches, iterative approaches, interpolation approaches, Pareto optimization approaches, algorithmic approaches, and the like. Feedback may be provided in a process of variation and selection, such as with a genetic algorithm that evolves one or more solutions based on feedback through a series of rounds.

In embodiments, a plurality of neural networks may be deployed in a cloud platform that receives data streams and other inputs collected (such as by mobile data collectors) in one or more energy edge environments and transmitted to the cloud platform over one or more networks, including using network coding to provide efficient transmission. In the cloud platform, optionally using massively parallel computational capability, a plurality of different neural networks of various types (including modular forms, structure-adaptive forms, hybrids, and the like) may be used to undertake prediction, classification, control functions, and provide other outputs as described in connection with expert systems disclosed throughout this disclosure. The different neural networks may be structured to compete with each other (optionally including use evolutionary algorithms, genetic algorithms, or the like), such that an appropriate type of neural network, with appropriate input sets, weights, node types and functions, and the like, may be selected, such as by an expert system, for a specific task involved in a given context, workflow, environment process, system, or the like.

In embodiments, methods and systems described herein that involve an expert system or self-organization capability may use a feed forward neural network, which moves information in one direction, such as from a data input, like a data source related to at least one resource or parameter related to a transactional environment, such as any of the data sources mentioned throughout this disclosure, through a series of neurons or nodes, to an output. Data may move from the input nodes to the output nodes, optionally passing through one or more hidden nodes, without loops. In embodiments, feed forward neural networks may be constructed with various types of units, such as binary McCulloch-Pitts neurons, the simplest of which is a perceptron.

In embodiments, methods and systems described herein that involve an expert system or self-organization capability may use a capsule neural network, such as for prediction, classification, or control functions with respect to a transactional environment, such as relating to one or more of the machines and automated systems described throughout this disclosure.

In embodiments, methods and systems described herein that involve an expert system or self-organization capability may use a radial basis function (RBF) neural network, which may be preferred in some situations involving interpolation in a multi-dimensional space (such as where interpolation is helpful in optimizing a multi-dimensional function, such as for optimizing a data marketplace as described here, optimizing the efficiency or output of a power generation system, a factory system, or the like, or other situation involving multiple dimensions. In embodiments, each neuron in the RBF neural network stores an example from a training set as a "prototype." Linearity involved in the functioning of this neural network offers RBF the advantage of not typically suffering from problems with local minima or maxima.

In embodiments, methods and systems described herein that involve an expert system or self-organization capability may use a radial basis function (RBF) neural network, such as one that employs a distance criterion with respect to a center (e.g., a Gaussian function). A radial basis function may be applied as a replacement for a hidden layer, such as a sigmoidal hidden layer transfer, in a multi-layer perceptron. An RBF network may have two layers, such as where an input is mapped onto each RBF in a hidden layer. In embodiments, an output layer may comprise a linear combination of hidden layer values representing, for example, a mean predicted output. The output layer value may provide an output that is the same as or similar to that of a regression model in statistics. In classification problems, the output layer may be a sigmoid function of a linear combination of hidden layer values, representing a posterior probability. Performance in both cases is often improved by shrinkage techniques, such as ridge regression in classical statistics. This corresponds to a prior belief in small parameter values (and therefore smooth output functions) in a Bayesian framework. RBF networks may avoid local minima, because the only parameters that are adjusted in the learning process are the linear mapping from hidden layer to output layer.

Linearity ensures that the error surface is quadratic and therefore has a single minimum. In regression problems, this can be found in one matrix operation. In classification problems, the fixed non-linearity introduced by the sigmoid output function may be handled using an iteratively re-weighted least squares function or the like.

RBF networks may use kernel methods such as support vector machines (SVM) and Gaussian processes (where the RBF is the kernel function). A non-linear kernel function may be used to project the input data into a space where the learning problem can be solved using a linear model.

In embodiments, an RBF neural network may include an input layer, a hidden layer and a summation layer. In the input layer, one neuron appears in the input layer for each predictor variable. In the case of categorical variables, N−1 neurons are used, where N is the number of categories. The input neurons may, in embodiments, standardize the value ranges by subtracting the median and dividing by the interquartile range. The input neurons may then feed the values to each of the neurons in the hidden layer. In the hidden layer, a variable number of neurons may be used (determined by the training process). Each neuron may consist of a radial basis function that is centered on a point with as many dimensions as a number of predictor variables. The spread (e.g., radius) of the RBF function may be different for each dimension. The centers and spreads may be determined by training. When presented with a vector of input values from the input layer, a hidden neuron may compute a Euclidean distance of the test case from the neuron's center point and then apply the RBF kernel function to this distance, such as using the spread values. The resulting value may then be passed to the summation layer. In the summation layer, the value coming out of a neuron in the hidden layer may be multiplied by a weight associated with the neuron and may add to the weighted values of other neurons. This sum becomes the output. For classification problems, one output is produced (with a separate set of weights and summation units) for each target category. The value output for a category is the probability that the case being evaluated has that category. In training of an RBF, various parameters may be determined, such as the number of neurons in a hidden layer, the coordinates of the center of each hidden-layer function, the spread of each function in each dimension, and the weights applied to outputs as they pass to the summation layer. Training may be used by clustering algorithms (such as k-means clustering), by evolutionary approaches, and the like.

In embodiments, a recurrent neural network may have a time-varying, real-valued (more than just zero or one) activation (output). Each connection may have a modifiable real-valued weight. Some of the nodes are called labeled nodes, some output nodes, and others hidden nodes. For supervised learning in discrete time settings, training sequences of real-valued input vectors may become sequences of activations of the input nodes, one input vector at a time. At each time step, each non-input unit may compute its current activation as a nonlinear function of the weighted sum of the activations of all units from which it receives connections. The system can explicitly activate (independent of incoming signals) some output units at certain time steps.

In embodiments, methods and systems described herein that involve an expert system or self-organization capability may use a self-organizing neural network, such as a Kohonen self-organizing neural network, such as for visualization of views of data, such as low-dimensional views of high-dimensional data. The self-organizing neural network may apply competitive learning to a set of input data, such as from one or more sensors or other data inputs from or associated with a transactional environment, including any machine or component that relates to the transactional environment. In embodiments, the self-organizing neural network may be used to identify structures in data, such as unlabeled data, such as in data sensed from a range of data sources about or sensors in or about in a transactional environment, where sources of the data are unknown (such as where events may be coming from any of a range of unknown sources). The self-organizing neural network may organize structures or patterns in the data, such that they can be recognized, analyzed, and labeled, such as identifying market behavior structures as corresponding to other events and signals.

In embodiments, methods and systems described herein that involve an expert system or self-organization capability may use a recurrent neural network, which may allow for a bi directional flow of data, such as where connected units (e.g., neurons or nodes) form a directed cycle. Such a network may be used to model or exhibit dynamic temporal behavior, such as involved in dynamic systems, such as a wide variety of the automation systems, machines and devices described throughout this disclosure, such as an automated agent interacting with a marketplace for purposes of collecting data, testing spot market transactions, execution transactions, and the like, where dynamic system behavior involves complex interactions that a user may desire to understand, predict, control and/or optimize. For example, the recurrent neural network may be used to anticipate the state of a market, such as one involving a dynamic process or action, such as a change in state of a resource that is traded in or that enables a marketplace of transactional environment. In embodiments, the recurrent neural network may use internal memory to process a sequence of inputs, such as from other nodes and/or from sensors and other data inputs from or about the transactional environment, of the various types described herein. In embodiments, the recurrent neural network may also be used for pattern recognition, such as for recognizing a machine, component, agent, or other item based on a behavioral signature, a profile, a set of feature vectors (such as in an audio file or image), or the like. In a non-limiting example, a recurrent neural network may recognize a shift in an operational mode of a marketplace or machine by learning to classify the shift from a training data set consisting of a stream of data from one or more data sources of sensors applied to or about one or more resources.

In embodiments, methods and systems described herein that involve an expert system or self-organization capability may use a modular neural network, which may comprise a series of independent neural networks (such as ones of various types described herein) that are moderated by an intermediary. Each of the independent neural networks in the modular neural network may work with separate inputs, accomplishing sub tasks that make up the task the modular network as whole is intended to perform. For example, a modular neural network may comprise a recurrent neural network for pattern recognition, such as to recognize what type of machine or system is being sensed by one or more sensors that are provided as input channels to the modular network and an RBF neural network for optimizing the behavior of the machine or system once understood. The intermediary may accept inputs of each of the individual neural networks, process them, and create output for the modular neural network, such an appropriate control parameter, a prediction of state, or the like.

Combinations among any of the pairs, triplets, or larger combinations, of the various neural network types described herein, are encompassed by the present disclosure. This may include combinations where an expert system uses one neural network for recognizing a pattern (e.g., a pattern indicating a problem or fault condition) and a different neural network for self-organizing an activity or workflow based on the recognized pattern (such as providing an output governing autonomous control of a system in response to the recognized condition or pattern). This may also include combinations where an expert system uses one neural network for classifying an item (e.g., identifying a machine, a component, or an operational mode) and a different neural network for predicting a state of the item (e.g., a fault state, an operational state, an anticipated state, a maintenance state, or the like). Modular neural networks may also include situations where an expert system uses one neural network for determining a state or context (such as a state of a machine, a process, a work flow, a marketplace, a storage system, a network, a data collector, or the like) and a different neural network for self-organizing a process involving the state or context (e.g., a data storage process, a network coding process, a network selection process, a data marketplace process, a power generation process, a manufacturing process, a refining process, a digging process, a boring process, or other process described herein).

In embodiments, methods and systems described herein that involve an expert system or self-organization capability may use a physical neural network where one or more hardware elements is used to perform or simulate neural behavior. In embodiments, one or more hardware neurons may be configured to stream voltage values, current values, or the like that represent sensor data, such as to calculate information from analog sensor inputs representing energy consumption, energy production, or the like, such as by one or more machines providing energy or consuming energy for one or more transactions. One or more hardware nodes may be configured to stream output data resulting from the activity of the neural net. Hardware nodes, which may comprise one or more chips, microprocessors, integrated circuits, programmable logic controllers, application-specific integrated circuits, field-programmable gate arrays, or the like, may be provided to optimize the machine that is producing or consuming energy, or to optimize another parameter of some part of a neural net of any of the types described herein. Hardware nodes may include hardware for acceleration of calculations (such as dedicated processors for performing basic or more sophisticated calculations on input data to provide outputs, dedicated processors for filtering or compressing data, dedicated processors for decompressing data, dedicated processors for compression of specific file or data types (e.g., for handling image data, video streams, acoustic signals, thermal images, heat maps, or the like), and the like. A physical neural network may be embodied in a data collector, including one that may be reconfigured by switching or routing inputs in varying configurations, such as to provide different neural net configurations within the data collector for handling different types of inputs (with the switching and configuration optionally under control of an expert system, which may include a software-based neural net located on the data collector or remotely). A physical, or at least partially physical, neural network may include physical hardware nodes located in a storage system, such as for storing data within a machine, a data storage system, a distributed ledger, a mobile device, a server, a cloud resource, or in a transactional environment, such as for accelerating input/output functions to one or more storage elements that supply data to or take data from the neural net. A physical, or at least partially physical, neural network may include physical hardware nodes located in a network, such as for transmitting data within, to or from an energy edge environment, such as for accelerating input/output functions to one or more network nodes in the net, accelerating relay functions, or the like. In embodiments of a physical neural network, an electrically adjustable resistance material may be used for emulating the function of a neural synapse. In embodiments, the physical hardware emulates the neurons, and software emulates the neural network between the neurons. In embodiments, neural networks complement conventional algorithmic computers. They are versatile and can be trained to perform appropriate functions without the need for any instructions, such as classification functions, optimization functions, pattern recognition functions, control functions, selection functions, evolution functions, and others.

In embodiments, methods and systems described herein that involve an expert system or self-organization capability may use a multilayered feed forward neural network, such as for complex pattern classification of one or more items, phenomena, modes, states, or the like. In embodiments, a multilayered feed forward neural network may be trained by an optimization technical, such as a genetic algorithm, such as to explore a large and complex space of options to find an optimum, or near-optimum, global solution. For example, one or more genetic algorithms may be used to train a multilayered feed forward neural network to classify complex phenomena, such as to recognize complex operational modes of machines, such as modes involving complex interactions among machines (including interference effects, resonance effects, and the like), modes involving non-linear phenomena, modes involving critical faults, such as where multiple, simultaneous faults occur, making root cause analysis difficult, and others. In embodiments, a multilayered feed forward neural network may be used to classify results from monitoring of a marketplace, such as monitoring systems, such as automated agents, that operate within the marketplace, as well as monitoring resources that enable the marketplace, such as computing, networking, energy, data storage, energy storage, and other resources.

In embodiments, methods and systems described herein that involve an expert system or self-organization capability may use a feed-forward, back-propagation multi-layer perceptron (MLP) neural network, such as for handling one or more remote sensing applications, such as for taking inputs from sensors distributed throughout various transactional environments. In embodiments, the MLP neural network may be used for classification of transactional environments and resource environments, such as lending markets, spot markets, forward markets, energy markets, renewable energy credit (REC) markets, networking markets, advertising markets, spectrum markets, ticketing markets, rewards markets, compute markets, and others mentioned throughout this disclosure, as well as physical resources and environments that produce them, such as energy resources (including renewable energy environments, mining environments, exploration environments, drilling environments, and the like, including classification of geological structures (including underground features and above ground features), classification of materials (including fluids, minerals, metals, and the like), and other problems. This may include fuzzy classification.

In embodiments, methods and systems described herein that involve an expert system or self-organization capability may use a structure-adaptive neural network, where the structure of a neural network is adapted, such as based on a rule, a sensed condition, a contextual parameter, or the like. For example, if a neural network does not converge on a solution, such as classifying an item or arriving at a prediction, when acting on a set of inputs after some amount of training, the neural network may be modified, such as from a feed forward neural network to a recurrent neural network, such as by switching data paths between some subset of nodes from unidirectional to bi directional data paths. The structure adaptation may occur under control of an expert system, such as to trigger adaptation upon occurrence of a trigger, rule or event, such as recognizing occurrence of a threshold (such as an absence of a convergence to a solution within a given amount of time) or recognizing a phenomenon as requiring different or additional structure (such as recognizing that a system is varying dynamically or in a non-linear fashion). In one non-limiting example, an expert system may switch from a simple neural network structure like a feed forward neural network to a more complex neural network structure like a recurrent neural network, a convolutional neural network, or the like upon receiving an indication that a continuously variable transmission is being used to drive a generator, turbine, or the like in a system being analyzed.

In embodiments, methods and systems described herein that involve an expert system or self-organization capability may use an autoencoder, autoassociator or Diabolo neural network, which may be similar to a multilayer perceptron (MLP) neural network, such as where there may be an input layer, an output layer and one or more hidden layers connecting them. However, the output layer in the auto-encoder may have the same number of units as the input layer, where the purpose of the MLP neural network is to reconstruct its own inputs (rather than just emitting a target value). Therefore, the auto encoders may operate as an unsupervised learning model. An auto encoder may be used, for example, for unsupervised learning of efficient codings, such as for dimensionality reduction, for learning generative models of data, and the like. In embodiments, an auto-encoding neural network may be used to self-learn an efficient network coding for transmission of analog sensor data from a machine over one or more networks or of digital data from one or more data sources. In embodiments, an auto-encoding neural network may be used to self-learn an efficient storage approach for storage of streams of data.

In embodiments, methods and systems described herein that involve an expert system or self-organization capability may use a probabilistic neural network (PNN), which in embodiments may comprise a multi-layer (e.g., four-layer) feed forward neural network, where layers may include input layers, hidden layers, pattern/summation layers and an output layer. In an embodiment of a PNN algorithm, a parent probability distribution function (PDF) of each class may be approximated, such as by a Parzen window and/or a non-parametric function. Then, using the PDF of each class, the class probability of a new input is estimated, and Bayes' rule may be employed, such as to allocate it to the class with the highest posterior probability. A PNN may embody a Bayesian network and may use a statistical algorithm or analytic technique, such as Kernel Fisher discriminant analysis technique. The PNN may be used for classification and pattern recognition in any of a wide range of embodiments disclosed herein. In one non-limiting example, a probabilistic neural network may be used to predict a fault condition of an engine based on collection of data inputs from sensors and instruments for the engine.

In embodiments, methods and systems described herein that involve an expert system or self-organization capability may use a time delay neural network (TDNN), which may comprise a feed forward architecture for sequential data that recognizes features independent of sequence position. In embodiments, to account for time shifts in data, delays are added to one or more inputs, or between one or more nodes, so that multiple data points (from distinct points in time) are analyzed together. A time delay neural network may form part of a larger pattern recognition system, such as using a perceptron network. In embodiments, a TDNN may be trained with supervised learning, such as where connection weights are trained with back propagation or under feedback. In embodiments, a TDNN may be used to process sensor data from distinct streams, such as a stream of velocity data, a stream of acceleration data, a stream of temperature data, a stream of pressure data, and the like, where time delays are used to align the data streams in time, such as to help understand patterns that involve understanding of the various streams (e.g., changes in price patterns in spot or forward markets).

In embodiments, methods and systems described herein that involve an expert system or self-organization capability may use a convolutional neural network (referred to in some cases as a CNN, a ConvNet, a shift invariant neural network, or a space invariant neural network), wherein the units are connected in a pattern similar to the visual cortex of the human brain. Neurons may respond to stimuli in a restricted region of space, referred to as a receptive field. Receptive fields may partially overlap, such that they collectively cover the entire (e.g., visual) field. Node responses can be calculated mathematically, such as by a convolution operation, such as using multilayer perceptrons that use minimal preprocessing. A convolutional neural network may be used for recognition within images and video streams, such as for recognizing a type of machine in a large environment using a camera system disposed on a mobile data collector, such as on a drone or mobile robot. In embodiments, a convolutional neural network may be used to provide a recommendation based on data inputs, including sensor inputs and other contextual information, such as recommending a route for a mobile data collector. In embodiments, a convolutional neural network may be used for processing inputs, such as for natural language processing of instructions provided by one or more parties involved in a workflow in an environment. In embodiments, a convolutional neural network may be deployed with a large number of neurons (e.g., 100,000, 500,000 or more), with multiple (e.g., 4, 5, 6 or more) layers, and with many (e.g., millions) of parameters. A convolutional neural net may use one or more convolutional nets.

In embodiments, methods and systems described herein that involve an expert system or self-organization capability may use a regulatory feedback network, such as for recognizing emergent phenomena (such as new types of behavior not previously understood in a transactional environment).

In embodiments, methods and systems described herein that involve an expert system or self-organization capability may use a self-organizing map (SOM), involving unsupervised learning. A set of neurons may learn to map points in an input space to coordinates in an output space. The input space can have different dimensions and topology from the output space, and the SOM may preserve these while mapping phenomena into groups.

In embodiments, methods and systems described herein that involve an expert system or self-organization capability may use a learning vector quantization neural net (LVQ). Prototypical representatives of the classes may parameterize, together with an appropriate distance measure, in a distance-based classification scheme.

In embodiments, methods and systems described herein that involve an expert system or self-organization capability may use an echo state network (ESN), which may comprise a recurrent neural network with a sparsely connected, random hidden layer. The weights of output neurons may be changed (e.g., the weights may be trained based on feedback). In embodiments, an ESN may be used to handle time series patterns, such as, in an example, recognizing a pattern of events associated with a market, such as the pattern of price changes in response to stimuli.

In embodiments, methods and systems described herein that involve an expert system or self-organization capability may use a Bi-directional, recurrent neural network (BRNN), such as using a finite sequence of values (e.g., voltage values from a sensor) to predict or label each element of the sequence based on both the past and the future context of the element. This may be done by adding the outputs of two RNNs, such as one processing the sequence from left to right, the other one from right to left. The combined outputs are the predictions of target signals, such as ones provided by a teacher or supervisor. A bi-directional RNN may be combined with a long short-term memory RNN.

In embodiments, methods and systems described herein that involve an expert system or self-organization capability may use a hierarchical RNN that connects elements in various ways to decompose hierarchical behavior, such as into useful subprograms. In embodiments, a hierarchical RNN may be used to manage one or more hierarchical templates for data collection in a transactional environment.

In embodiments, methods and systems described herein that involve an expert system or self-organization capability may use a stochastic neural network, which may introduce random variations into the network. Such random variations can be viewed as a form of statistical sampling, such as Monte Carlo sampling.

In embodiments, methods and systems described herein that involve an expert system or self-organization capability may use a genetic scale recurrent neural network. In such embodiments, a RNN (often a LSTM) is used where a series is decomposed into a number of scales where every scale informs the primary length between two consecutive points. A first order scale consists of a normal RNN, a second order consists of all points separated by two indices and so on. The Nth order RNN connects the first and last node. The outputs from all the various scales may be treated as a committee of members, and the associated scores may be used genetically for the next iteration.

In embodiments, methods and systems described herein that involve an expert system or self-organization capability may use a committee of machines (CoM), comprising a collection of different neural networks that together “vote” on a given example. Because neural networks may suffer from local minima, starting with the same architecture and training, but using randomly different initial weights often gives different results. A CoM tends to stabilize the result.

In embodiments, methods and systems described herein that involve an expert system or self-organization capability may use an associative neural network (ASNN), such as involving an extension of committee of machines that combines multiple feed forward neural networks and a k-nearest neighbor technique. It may use the correlation between ensemble responses as a measure of distance amid the analyzed cases for the kNN. This corrects the bias of the neural network ensemble. An associative neural network may have a memory that can coincide with a training set. If new data become available, the network instantly improves its predictive ability and provides data approximation (self-learns) without retraining. Another important feature of ASNN is the possibility to interpret neural network results by analysis of correlations between data cases in the space of models.

In embodiments, methods and systems described herein that involve an expert system or self-organization capability may use an instantaneously trained neural network (ITNN), where the weights of the hidden and the output layers are mapped directly from training vector data.

In embodiments, methods and systems described herein that involve an expert system or self-organization capability may use a spiking neural network, which may explicitly consider the timing of inputs. The network input and output may be represented as a series of spikes (such as a delta function or more complex shapes). SNNs can process information in the time domain (e.g., signals that vary over time, such as signals involving dynamic behavior of markets or transactional environments). They are often implemented as recurrent networks.

In embodiments, methods and systems described herein that involve an expert system or self-organization capability may use a dynamic neural network that addresses nonlinear multivariate behavior and includes learning of time-dependent behavior, such as transient phenomena and delay effects. Transients may include behavior of shifting market variables, such as prices, available quantities, available counterparties, and the like.

In embodiments, cascade correlation may be used as an architecture and supervised learning algorithm, supplementing adjustment of the weights in a network of fixed topology. Cascade-correlation may begin with a minimal network, then automatically trains and add new hidden units one by one, creating a multi-layer structure. Once a new hidden unit has been added to the network, its input-side weights may be frozen. This unit then becomes a permanent feature-detector in the network, available for producing outputs or for creating other, more complex feature detectors. The cascade-correlation architecture may learn quickly, determine its own size and topology, and retain the structures it has built even if the training set changes and requires no back-propagation.

In embodiments, methods and systems described herein that involve an expert system or self-organization capability may use a neuro-fuzzy network, such as involving a fuzzy inference system in the body of an artificial neural network. Depending on the type, several layers may simulate the processes involved in a fuzzy inference, such as fuzzification, inference, aggregation and defuzzification. Embedding a fuzzy system in a general structure of a neural net as the benefit of using available training methods to find the parameters of a fuzzy system.

In embodiments, methods and systems described herein that involve an expert system or self-organization capability may use a compositional pattern-producing network (CPPN), such as a variation of an associative neural network (ANN) that differs the set of activation functions and how they are applied. While typical ANNs often contain only sigmoid functions (and sometimes Gaussian functions), CPPNs can include both types of functions and many others. Furthermore, CPPNs may be applied across the entire space of possible inputs, so that they can represent a complete image. Since they are compositions of functions, CPPNs in effect encode images at infinite resolution and can be sampled for a particular display at whatever resolution is optimal.

This type of network can add new patterns without re-training. In embodiments, methods and systems described herein that involve an expert system or self-organization capability may use a one-shot associative memory network, such as by creating a specific memory structure, which assigns each new pattern to an orthogonal plane using adjacently connected hierarchical arrays.

In embodiments, methods and systems described herein that involve an expert system or self-organization capability may use a hierarchical temporal memory (HTM) neural network, such as involving the structural and algorithmic properties of the neocortex. HTM may use a biomimetic model based on memory-prediction theory. HTM may be used to discover and infer the high-level causes of observed input patterns and sequences.

In embodiments, methods and systems described herein that involve an expert system or self-organization capability may use a holographic associative memory (HAM) neural network, which may comprise an analog, correlation-based, associative, stimulus-response system. Information may be mapped onto the phase orientation of complex numbers. The memory is effective for associative memory tasks, generalization and pattern recognition with changeable attention.

In embodiments, various embodiments involving network coding may be used to code transmission data among network nodes in neural net, such as where nodes are located in one or more data collectors or machines in a transactional environment.

Referring to FIG. 9 through FIG. 37, embodiments of the present disclosure, including ones involving expert systems, self-organization, machine learning, artificial intelligence, and the like, may benefit from the use of a neural net, such as a neural net trained for pattern recognition, for classification of one or more parameters, characteristics, or phenomena, for support of autonomous control, and other purposes. References to a neural net throughout this disclosure should be understood to encompass a wide range of different types of neural networks, machine learning systems, artificial intelligence systems, and the like, such as dual-process artificial neural networks (DPANN), feed forward neural networks, radial basis function neural networks, self-organizing neural networks (e.g., Kohonen self-organizing neural networks), recurrent neural networks, modular neural networks, artificial neural networks, physical neural networks, multilayered neural networks, convolutional neural networks, hybrids of neural networks with other expert systems (e.g., hybrid fuzzy logic—neural network systems), Autoencoder neural networks, probabilistic neural networks, time delay neural networks, convolutional neural networks, regulatory feedback neural networks, radial basis function neural networks, recurrent neural networks, Hopfield neural networks, Boltzmann machine neural networks, self-organizing map (SOM) neural networks, learning vector quantization (LVQ) neural networks, fully recurrent neural networks, simple recurrent neural networks, echo state neural networks, long short-term memory neural networks, bi-directional neural networks, hierarchical neural networks, stochastic neural networks, genetic scale RNN neural networks, committee of machines neural networks, associative neural networks, physical neural networks, instantaneously trained neural networks, spiking neural networks, neocognitron neural networks, dynamic neural networks, cascading neural networks, neuro-fuzzy neural networks, compositional pattern-producing neural networks, memory neural networks, hierarchical temporal memory neural networks, deep feed forward neural networks, gated recurrent unit (GCU) neural networks, auto encoder neural networks, variational auto encoder neural networks, de-noising auto encoder neural networks, sparse auto-encoder neural networks, Markov chain neural networks, restricted Boltzmann machine neural networks, deep belief neural networks, deep convolutional neural networks, de-convolutional neural networks, deep convolutional inverse graphics neural networks, generative adversarial neural networks, liquid state machine neural networks, extreme learning machine neural networks, echo state neural networks, deep residual neural networks, support vector machine neural networks, neural Turing machine neural networks, and/or holographic associative memory neural networks, or hybrids or combinations of the foregoing, or combinations with other expert systems, such as rule-based systems, model-based systems (including ones based on physical models, statistical models, flow-based models, biological models, biomimetic models, and the like).

In embodiments, the platform 102 includes a dual process artificial neural network (DPANN) system. The DPANN system includes an artificial neural network (ANN) having behaviors and operational processes (such as decision-making) that are products of a training system and a retraining system. The training system is configured to perform automatic, trained execution of ANN operations. The retraining system performs effortful, analytical, intentional retraining of the ANN, such as based on one or more relevant aspects of the ANN, such as memory, one or more input data sets (including time information with respect to elements in such data sets), one or more goals or objectives (including ones that may vary dynamically, such as periodically and/or based on contextual changes, such as ones relating to the usage context of the ANN), and/or others. In cases involving memory-based retraining, the memory may include original/historical training data and refined training data. The DPANN system includes a dual process learning function (DPLF) 902 configured to manage and perform an ongoing data retention process. The DPLF 902 (including, where applicable, memory management process) facilitate retraining and refining of behavior of the ANN. The DPLF 902 provides a framework by which the ANN creates outputs such as predictions, classifications, recommendations, conclusions and/or other outputs based on a historic inputs, new inputs, and new outputs (including outputs configured for specific use cases, including ones determined by parameters of the context of utilization (which may include performance parameters such as latency parameters, accuracy parameters, consistency parameters, bandwidth utilization parameters, processing capacity utilization parameters, prioritization parameters, energy utilization parameters, and many others).

In embodiments, the DPANN system stores training data, thereby allowing for constant retraining based on results of decisions, predictions, and/or other operations of the ANN, as well as allowing for analysis of training data upon the outputs of the ANN. The management of entities stored in the memory allows the construction and execution of new models, such as ones that may be processed, executed or otherwise performed by or under management of the training system. The DPANN system uses instances of the memory to validate actions (e.g., in a manner similar to the thinking of a biological neural network (including retrospective or self-reflective thinking about whether actions that were undertaken under a given situation where optimal) and perform training of the ANN, including training that intentionally feeds the ANN with appropriate sets of memories (i.e., ones that produce favorable outcomes given the performance requirements for the ANN).

Figure 9:
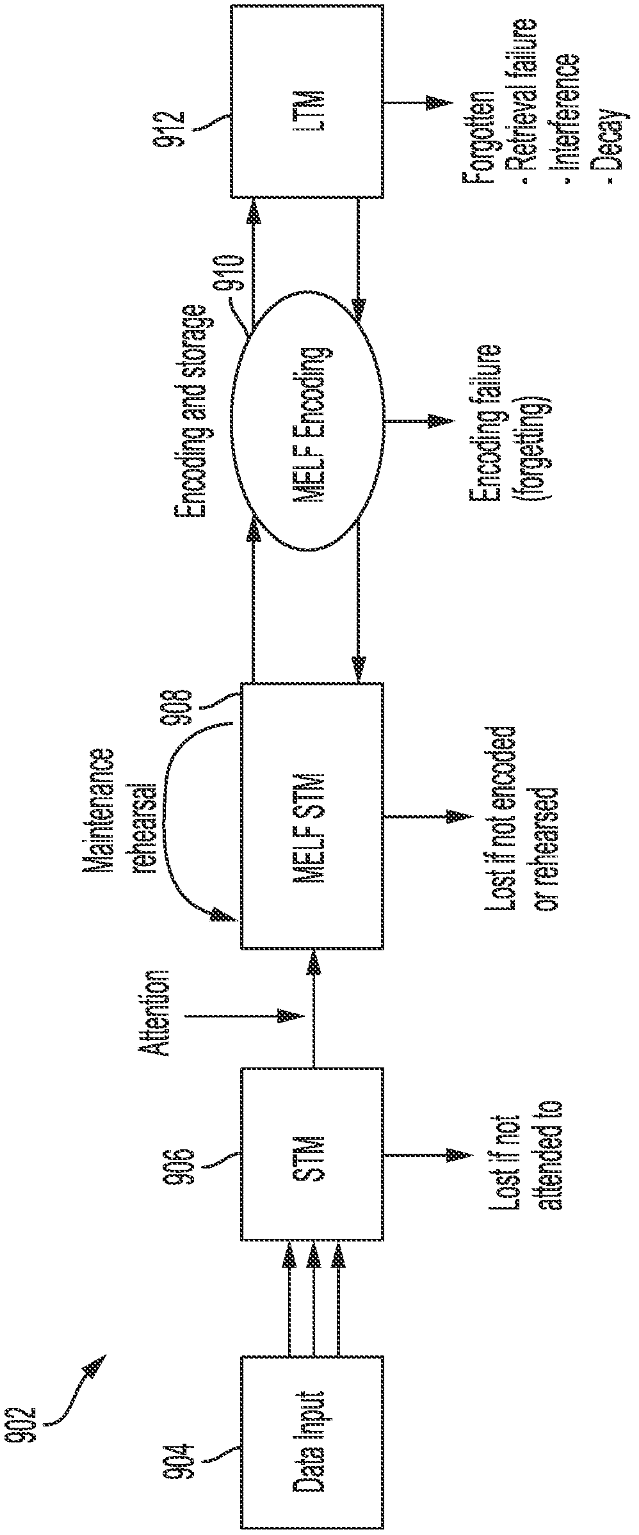
FIG. 9 is a schematic diagram that presents a dual-process learning function of a dual-process artificial neural network, according to some embodiments.

In embodiments, FIG. 9 illustrates an exemplary process of the DPLF 902. The DPLF 902 may be or include the continued process retention of one or more training datasets and/or memories stored in the memory over time. The DPLF 902 thereby allows the ANN to apply existing neural functions and draw upon sets of past events (including ones that are intentionally varied and/or curated for distinct purposes), such as to frame understanding of and behavior within present, recent, and/or new scenarios, including in simulations, during training processes, and in fully operational deployments of the ANN. The DPLF 902 may provide the ANN with a framework by which the ANN may analyze, evaluate, and/or manage data, such as data related to the past, present and future. As such, the DPLF 902 plays a crucial role in training and retraining the ANN via the training system and the retraining system.

In embodiments, the DPLF 902 is configured to perform a dual-process operation to manage existing training processes and is also configured to manage and/or perform new training processes, i.e., retraining processes. In embodiments, each instance of the ANN is trained via the training system and configured to be retrained via the retraining system. The ANN encodes training and/or retraining datasets, stores the datasets, and retrieves the datasets during both training via the training system and retraining via the retraining system. The DPANN system may recognize whether a dataset (the term dataset in this context optionally including various subsets, supersets, combinations, permutations, elements, metadata, augmentations, or the like, relative to a base dataset used for training or retraining), storage activity, processing operation and/or output, has characteristics that natively favor the training system versus the retraining system based on its respective inputs, processing (e.g., based on its structure, type, models, operations, execution environment, resource utilization, or the like) and/or outcomes (including outcome types, performance requirements (including contextual or dynamic requirements), and the like. For example, the DPANN system may determine that poor performance of the training system on a classification task may indicate a novel problem for which the training of the ANN was not adequate (e.g., in type of data set, nature of input models and/or feedback, quantity of training data, quality of tagging or labeling, quality of supervision, or the like), for which the processing operations of the ANN are not well-suited (e.g., where they are prone to known vulnerabilities due to the type of neural network used, the type of models used, etc.), and that may be solved by engaging the retraining system to retrain the model to teach the model to learn to solve the new classification problem (e.g., by feeding it many more labeled instances of correctly classified items). With periodic or continuous evaluation of the performance of the ANN, the DPANN system may subsequently determine that highly stable performance of the ANN (such as where only small improvements of the ANN occur over many iterations of retraining by the retraining system) indicates readiness for the training system to replace the retraining system (or be weighted more favorably where both are involved). Over longer periods of time, cycles of varying performance may emerge, such as where a series of novel problems emerge, such that the retraining system of the DPANN is serially engaged, as needed, to retrain the ANN and/or to augment the ANN by providing a second source of outputs (which may be fused or combined with ANN outputs to provide a single result (with various weightings across them), or may be provided in parallel, such as enabling comparison, selection, averaging, or context- or situation-specific application of the respective outputs).

In embodiments, the ANN is configured to learn new functions in conjunction with the collection of data according to the dual-process training of the ANN via the training system and the retraining system. The DPANN system performs analysis of the ANN via the training system and performs initial training of the ANN such that the ANN gains new internal functions (or internal functions are subtracted or modified, such as where existing functions are not contributing to favorable outcomes). After the initial training, the DPANN system performs retraining of the ANN via the retraining system. To perform the retraining, the retraining system evaluates the memory and historic processing of the ANN to construct targeted DPLF 902 processes for retraining. The DPLF 902 processes may be specific to identified scenarios. The ANN processes can run in parallel with the DPLF 902 processes. By way of example, the ANN may function to operate a particular make and model of a self-driving car after the initial training by the training system. The DPANN system may perform retraining of the functions of the ANN via the retraining system, such as to allow the ANN to operate a different make and model of car (such as one with different cameras, accelerometers and other sensors, different physical characteristics, different performance requirements, and the like), or even a different kind of vehicle, such as a bicycle or a spaceship.

In embodiments, as quality of outputs and/or operations of the ANN improves, and as long as the performance requirements and the context of utilization for the ANN remain fairly stable, performing the dual-process training process can become a decreasingly demanding process. As such, the DPANN system may determine that fewer neurons of the ANN are required to perform operations and/or processes of the ANN, that performance monitoring can be less intensive (such as with longer intervals between performance checks), and/or that the retraining is no longer necessary (at least for a period of time, such as until a long-term maintenance period arrives and/or until there are significant shifts in context of utilization). As the ANN continues to improve upon existing functions and/or add new functions via the dual-process training process, the ANN may perform other, at times more “intellectually-demanding” (e.g., retraining intensive) tasks simultaneously. For example, utilizing dual process-learned knowledge of a function or process being trained, the ANN can solve an unrelated complex problem or make a retraining decision simultaneously. The retraining may include supervision, such as where an agent (e.g., human supervisor or intelligent agent) directs the ANN to a retraining objective (e.g., “master this new function”) and provides a set of training tasks and feedback functions (such as supervisory grading) for the retraining. In-embodiments, the ANN can be used to organize the supervision, training and retraining of other dual process-trained ANNs, to seed such training or retraining, or the like.

In embodiments, one or more behaviors and operational processes (such as decision-making) of the ANN may be products of training and retraining processes facilitated by the training system and the retraining system, respectively. The training system may be configured to perform automatic training of ANN, such as by continuously adding additional instances of training data as it is collected by or from various data sources. The retraining system may be configured to perform effortful, analytical, intentional retraining of the ANN, such as based on memory (e.g., stored training data or refined training data) and/or optionally based on reasoning or other factors. For example, in a deployment management context, the training system may be associated with a standard response by the ANN, while the retraining system may implement DPLF 902 retraining and/or network adaptation of the ANN. In some cases, retraining of the ANN beyond the factory, or "out-of-the-box," training level may involve more than retraining by the retraining system. Successful adjustment of the ANN by one or more network adaptations may be dependent on the operation of one or more network adjustments of the training system.

In embodiments, the training system may facilitate fast operating by and training of the ANN by applying existing neural functions of the ANN based on training of the ANN with previous datasets. Standard operational activities of the ANN that may draw heavily on the training system may include one or more of the methods, processes, workflows, systems, or the like described throughout this disclosure and the documents incorporated herein, such as, without limitation: defined functions within networking (such as discovering available networks and connections, establishing connections in networks, provisioning network bandwidth among devices and systems, routing data within networks, steering traffic to available network paths, load balancing across networking resources, and many others); recognition and classification (such as of images, text, symbols, objects, video content, music and other audio content, speech content, and many others); spoken words; prediction of states and events (such as prediction of failure modes of machines or systems, prediction of events within workflows, predictions of behavior in shopping and other activities, and many others); control (such as controlling autonomous or semi-autonomous systems, automated agents (such as automated call-center operations, chat bots, and the like) and others); and/or optimization and recommendation (such as for products, content, decisions, and many others). ANNs may also be suitable for training datasets for scenarios that only require output. The standard operational activities may not require the ANN to actively analyze what is being asked of the ANN beyond operating on well-defined data inputs, to calculate well-defined outputs for well-defined use cases. The operations of the training system and/or the retraining system may be based on one or more historic data training datasets and may use the parameters of the historic data training datasets to calculate results based on new input values and may be performed with small or no alterations to the ANN or its input types. In embodiments, an instance of the training system can be trained to classify whether the ANN is capable of performing well in a given situation, such as by recognizing whether an image or sound being classified by the ANN is of a type that has historically been classified with a high accuracy (e.g., above a threshold).

In embodiments, network adaptation of the ANN by one or both of the training system and the retraining system may include a number of defined network functions, knowledge, and intuition-like behavior of the ANN when subjected to new input values. In such embodiments, the retraining system may apply the new input values to the DPLF 902 system to adjust the functional response of the ANN, thereby performing retraining of the ANN. The DPANN system may determine that retraining the ANN via network adjustment is necessary when, for example, without limitation, functional neural networks are assigned activities and assignments that require the ANN to provide a solution to a novel problem, engage in network adaptation or other higher-order cognitive activity, apply a concept outside of the domain in which the DPANN was originally designed, support a different context of deployment (such as where the use case, performance requirements, available resources, or other factors have changed), or the like. The ANN can be trained to recognize where the retraining system is needed, such as by training the ANN to recognize poor performance of the training system, high variability of input data sets relative to the historical data sets used to train the training system, novel functional or performance requirements, dynamic changes in the use case or context, or other factors. The ANN may apply reasoning to assess performance and provide feedback to the retraining system. The ANN may be trained and/or retrained to perform intuitive functions, optionally including by a combinatorial or re-combinatorial process (e.g., including genetic programming wherein inputs (e.g., data sources), processes/functions (e.g., neural network types and structures), feedback, and outputs, or elements thereof, are arranged in various permutations and combinations and the ANN is tested in association with each (whether in simulations or live deployments), such as in a series of rounds, or evolutionary steps, to promote favorable variants until a preferred ANN, or preferred set of ANNs is identified for a given scenario, use case, or set of requirements). This may include generating a set of input "ideas" (e.g., combinations of different conclusions about cause-and-effect in a diagnostic process) for processing by the retraining system and subsequent training and/or by an explicit reasoning process, such as a Bayesian reasoning process, a casuistic or conditional reasoning process, a deductive reasoning process, an inductive reasoning process, or others (including combinations of the above) as described in this disclosure or the documents incorporated herein by reference.

In embodiments, the DPLF 902 may perform an encoding process of the DPLF 902 to process datasets into a stored form for future use, such as retraining of the ANN by the retraining system. The encoding process enables datasets to be taken in, understood, and altered by the DPLF 902 to better support storage in and usage from the memory. The DPLF 902 may apply current functional knowledge and/or reasoning to consolidate new input values. The memory can include short-term memory (STM) 906, long-term memory (LTM) 912, or a combination thereof. The datasets may be stored in one or both of the STM 906 and the LTM 912. The STM 906 may be implemented by the application of specialized behaviors inside the ANN (such as recurrent neural network, which may be gated or un-gated, or long-term short-term neural networks). The LTM 912 may be implemented by storing scenarios, associated data, and/or unprocessed data that can be applied to the discovery of new scenarios. The encoding process may include processing and/or storing, for example, visual encoding data (e.g., processed through a Convolution Neural Network), acoustic sensor encoding data (e.g., how something sounds, speech encoding data (e.g., processed through a deep neural network (DNN), optionally including for phoneme recognition), semantic encoding data of words, such to determine semantic meaning, e.g., by using a Hidden Markov Model (HMM); and/or movement and/or tactile encoding data (such as operation on vibration/accelerometer sensor data, touch sensor data, positional or geolocation data, and the like). While datasets may enter the DPLF 902 system through one of these modes, the form in which the datasets are stored may differ from an original form of the datasets and may pass-through neural processing engines to be encoded into compressed and/or context-relevant format. For example, an unsupervised instance of the ANN can be used to learn the historic data into a compressed format.

In embodiments, the encoded datasets are retained within the DPLF 902 system. Encoded datasets are first stored in short-term DPLF 902, i.e., STM 906. For example, sensor datasets may be primarily stored in STM 906, and may be kept in STM 906 through constant repetition. The datasets stored in the STM 906 are active and function as a kind of immediate response to new input values. The DPANN system may remove datasets from STM 906 in response to changes in data streams due to, for example, running out of space in STM 906 as new data is imported, processed and/or stored. For example, it is viable for short-term DPLF 902 to only last between 15 and 30 seconds. STM 906 may only store small amounts of data typically embedded inside the ANN.

In embodiments, the DPANN system may measure attention based on utilization of the training system, of the DPANN system as a whole, and/or the like, such as by consuming various indicators of attention to and/or utilization of outputs from the ANN and transmitting such indicators to the ANN in response (similar to a "moment of recognition" in the brain where attention passes over something and the cognitive system says "aha!"). In embodiments, attention can be measured by the sheer amount of the activity of one or both of the systems on the data stream. In embodiments, a system using output from the ANN can explicitly indicate attention, such as by an operator directing the ANN to pay attention to a particular activity (e.g., to respond to a diagnosed problem, among many other possibilities). The DPANN system may manage data inputs to facilitate measures of attention, such as by prompting and/or calculating greater attention to data that has high inherent variability from historical patterns (e.g., in rates of change, departure from norm, etc.), data indicative of high variability in historical performance (such as data having similar characteristics to data sets involved in situations where the ANN performed poorly in training), or the like.

In embodiments, the DPANN system may retain encoded datasets within the DPLF 902 system according to and/or as part of one or more storage processes. The DPLF 902 system may store the encoded datasets in LTM 912 as necessary after the encoded datasets have been stored in STM 906 and determined to be no longer necessary and/or low priority for a current operation of the ANN, training process, retraining process, etc. The LTM 912 may be implemented by storing scenarios, and the DPANN system may apply associated data and/or unprocessed data to the discovery of new scenarios. For example, data from certain processed data streams, such as semantically encoded datasets, may be primarily stored in LTM 912. The LTM 912 may also store image (and sensor) datasets in encoded form, among many other examples.

In embodiments, the LTM 912 may have relatively high storage capacity, and datasets stored within LTM 912 may, in some scenarios, be effectively stored indefinitely. The DPANN system may be configured to remove datasets from the LTM 912, such as by passing LTM 912 data through a series of memory structures that have increasingly long retrieval periods or increasingly high threshold requirements to trigger utilization (similar to where a biological brain "thinks very hard" to find precedent to deal with a challenging problem), thereby providing increased salience of more recent or more frequently used memories while retaining the ability to retrieve (with more time/effort) older memories when the situation justifies more comprehensive memory utilization. As such, the DPANN system may arrange datasets stored in the LTM 912 on a timeline, such as by storing the older memories (measured by time of origination and/or latest time of utilization) on a separate and/or slower system, by penalizing older memories by imposing artificial delays in retrieval thereof, and/or by imposing threshold requirements before utilization (such as indicators of high demand for improved results). Additionally or alternatively, LTM 912 may be clustered according to other categorization protocols, such as by topic. For example, all memories proximal in time to a periodically recognized person may be clustered for retrieval together, and/or all memories that were related to a scenario may be clustered for retrieval together.

In embodiments, the DPANN system may modularize and link LTM 912 datasets, such as in a catalog, a hierarchy, a cluster, a knowledge graph (directed/acyclic or having conditional logic), or the like, such as to facilitate search for relevant memories. For example, all memory modules that have instances involving a person, a topic, an item, a process, a linkage of n-tuples of such things (e.g., all memory modules that involve a selected pair of entities), etc. The DPANN system may select sub-graphs of the knowledge graph for the DPLF 902 to implement in one or more domain-specific and/or task-specific uses, such as training a model to predict robotic or human agent behavior by using memories that relate to a particular set of robotic or human agents, and/or similar robotic or human agents. The DPLF 902 system may cache frequently used modules for different speed and/or probability of utilization. High value modules (e.g., ones with high-quality outcomes, performance characteristics, or the like) can be used for other functions, such as selection/training of STM 906 keep/forget processes.

In embodiments, the DPANN system may modularize and link LTM datasets, such as in various ways noted above, to facilitate search for relevant memories. For example, memory modules that have instances involving a person, a topic, an item, a process, a linkage of n-tuples of such things (such as all memory modules that involve a selected pair of entities), or all memories associated with a scenario, etc., may be linked and searched. The DPANN system may select subsets of the scenario (e.g., sub-graphs of a knowledge graph) for the DPLF 902 for a domain-specific and/or task-specific use, such as training a model to predict robotic or human agent behavior by using memories that relate to a particular set of robotic or human agents and/or similar robotic or human agents. Frequently used modules or scenarios can be cached for different speed/probability of utilization, or other performance characteristics. High value modules or scenarios (ones where high-quality outcomes results) can be used for other functions, such as selection/training of STM 906 keep/forget processes, among others.

In embodiments, the DPANN system may perform LTM planning, such as to find a procedural course of action for a declaratively described system to reach its goals while optimizing overall performance measures. The DPANN system may perform LTM planning when, for example, a problem can be described in a declarative way, the DPANN system has domain knowledge that should not be ignored, there is a structure to a problem that makes the problem difficult for pure learning techniques, and/or the ANN needs to be trained and/or retrained to be able to explain a particular course of action taken by the DPANN system. In embodiments, the DPANN system may be applied to a plan recognition problem, i.e., the inverse of a planning problem: instead of a goal state, one is given a set of possible goals, and the objective in plan recognition is to find out which goal was being achieved and how.

In embodiments, the DPANN system may facilitate LTM scenario planning by users to develop long-term plans. For example, LTM scenario planning for risk management use cases may place added emphasis on identifying extreme or unusual, yet possible, risks and opportunities that are not usually considered in daily operations, such as ones that are outside a bell curve or normal distribution, but that in fact occur with greater-than-anticipated frequency in "long tail" or "fat tail" situations, such as involving information or market pricing processes, among many others. LTM scenario planning may involve analyzing relationships between forces (such as social, technical, economic, environmental, and/or political trends) in order to explain the current situation, and/or may include providing scenarios for potential future states.

In embodiments, the DPANN system may facilitate LTM scenario planning for predicting and anticipating possible alternative futures along with the ability to respond to the predicted states. The LTM planning may be induced from expert domain knowledge or projected from current scenarios, because many scenarios (such as ones involving results of combinatorial processes that result in new entities or behaviors) have never yet occurred and thus cannot be projected by probabilistic means that rely entirely on historical distributions. The DPANN system may prepare the application to LTM 912 to generate many different scenarios, exploring a variety of possible futures to the DPLM for both expected and surprising futures. This may be facilitated or augmented by genetic programming and reasoning techniques as noted above, among others.

In embodiments, the DPANN system may implement LTM scenario planning to facilitate transforming risk management into a plan recognition problem and apply the DPLF 902 to generate potential solutions. LTM scenario induction addresses several challenges inherent to forecast planning. LTM scenario induction may be applicable when, for example, models that are used for forecasting have inconsistent, missing, unreliable observations; when it is possible to generate not just one but many future plans; and/or when LTM domain knowledge can be captured and encoded to improve forecasting (e.g., where domain experts tend to outperform available computational models). LTM scenarios can be focused on applying LTM scenario planning for risk management. LTM scenarios planning may provide situational awareness of relevant risk drivers by detecting emerging storylines. In addition, LTM scenario planning can generate future scenarios that allow DPLM, or operators, to reason about, and plan for, contingencies and opportunities in the future.

In embodiments, the DPANN system may be configured to perform a retrieval process via the DPLF 902 to access stored datasets of the ANN. The retrieval process may determine how well the ANN performs with regard to assignments designed to test recall. For example, the ANN may be trained to perform a controlled vehicle parking operation, whereby the autonomous vehicle returns to a designated spot, or the exit, by associating a prior visit via retrieval of data stored in the LTM 912. The datasets stored in the STM 906 and the LTM may be retrieved by differing processes. The datasets stored in the STM 906 may be retrieved in response to specific input and/or by order in which the datasets are stored, e.g., by a sequential list of numbers. The datasets stored in the LTM 912 may be retrieved through association and/or matching of events to historic activities, e.g., through complex associations and indexing of large datasets.

In embodiments, the DPANN system may implement scenario monitoring as at least a part of the retrieval process. A scenario may provide context for contextual decision-making processes. In embodiments, scenarios may involve explicit reasoning (such as cause-and-effect reasoning, Bayesian, casuistic, conditional logic, or the like, or combinations thereof) the output of which declares what LTM-stored data is retrieved (e.g., a timeline of events being evaluated and other timelines involving events that potentially follow a similar cause-and-effect pattern). For example, diagnosis of a failure of a machine or workflow may retrieve historical sensor data as well as LTM data on various failure modes of that type of machine or workflow (and/or a similar process involving a diagnosis of a problem state or condition, recognition of an event or behavior, a failure mode (e.g., a financial failure, contract breach, or the like), or many others).

Figure 10:
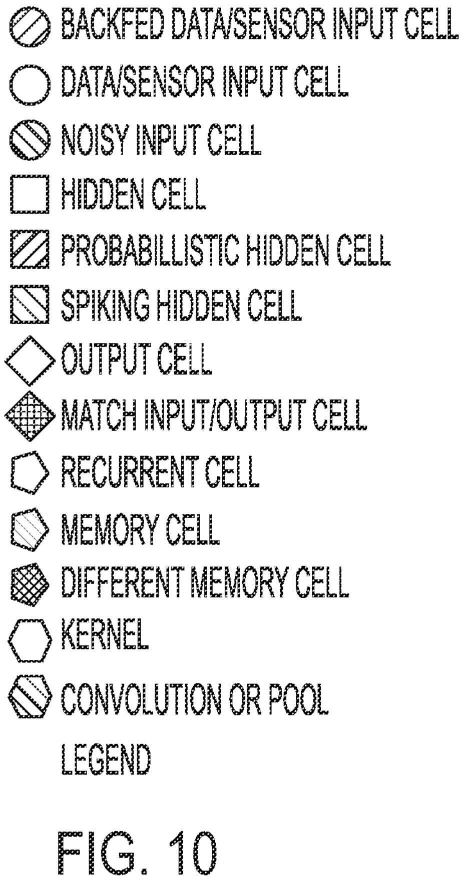
FIG. 10 through FIG. 37 are schematic diagrams of embodiments of neural net systems that may connect to, be integrated in, and be accessible by the platform for enabling intelligent transactions including ones involving expert systems, self-organization, machine learning, artificial intelligence and including neural net systems trained for pattern recognition, for classification of one or more parameters, characteristics, or phenomena, for support of autonomous control, and other purposes in accordance with embodiments of the present disclosure.

In embodiments, FIG. 10 through FIG. 37 depict exemplary neural networks and FIG. 10 depicts a legend showing the various components of the neural networks depicted throughout FIG. 10 to FIG. 37. FIG. 10 depicts various neural net components depicted in cells that are assigned functions and requirements. In embodiments, the various neural net examples may include (from top to bottom in the example of FIG. 10): back fed data/sensor input cells, data/sensor input cells, noisy input cells, and hidden cells. The neural net components also include probabilistic hidden cells, spiking hidden cells, output cells, match input/output cells, recurrent cells, memory cells, different memory cells, kernels, and convolution or pool cells.

Figure 11:
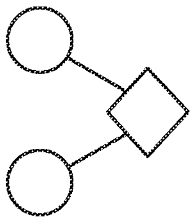
Figure 12:
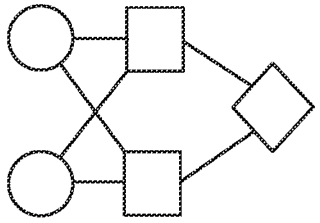
Figure 13:
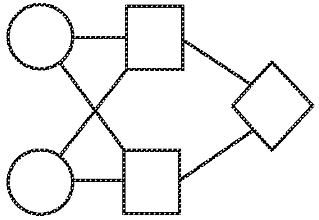
Figure 14:
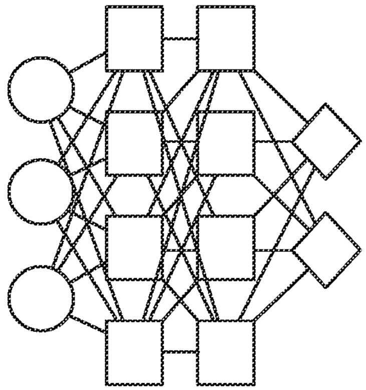
Figure 15:
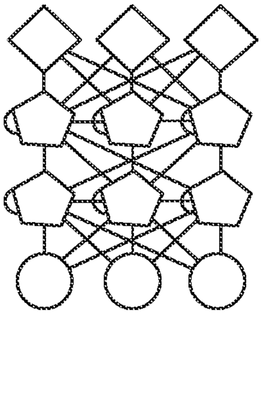
Figure 16:
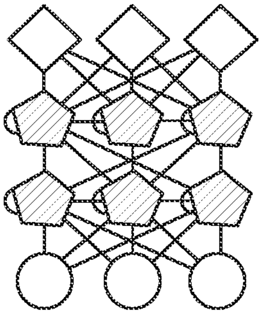
Figure 17:
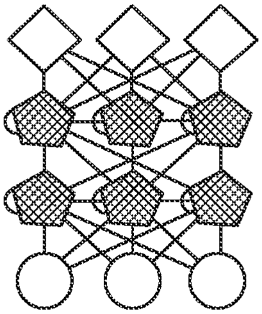
Figure 18:
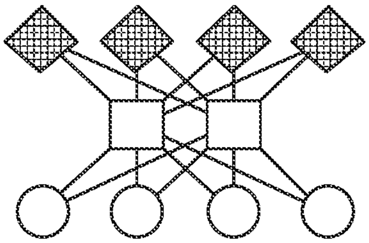
Figure 19:
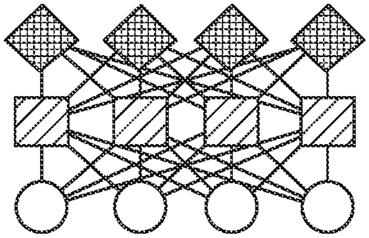
Figure 20:
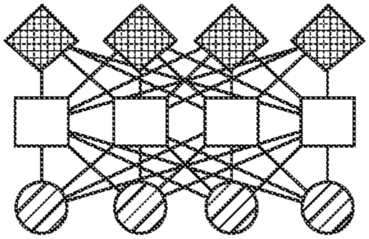
Figure 21:
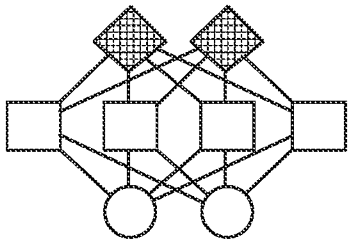
Figure 22:
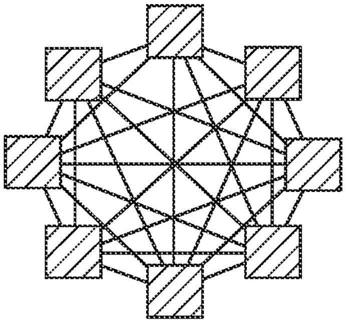
Figure 23:
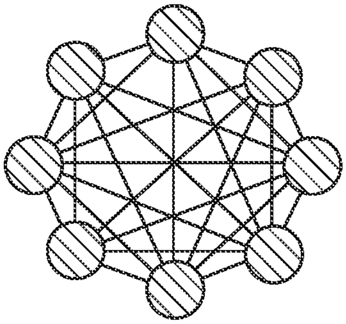
Figure 24:
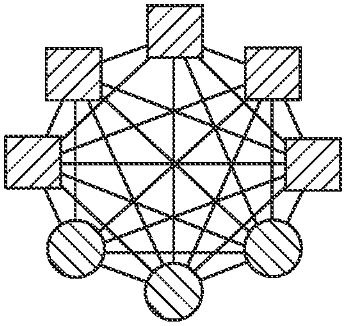
Figure 25:
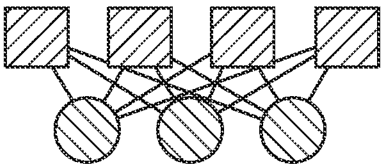
Figure 26:
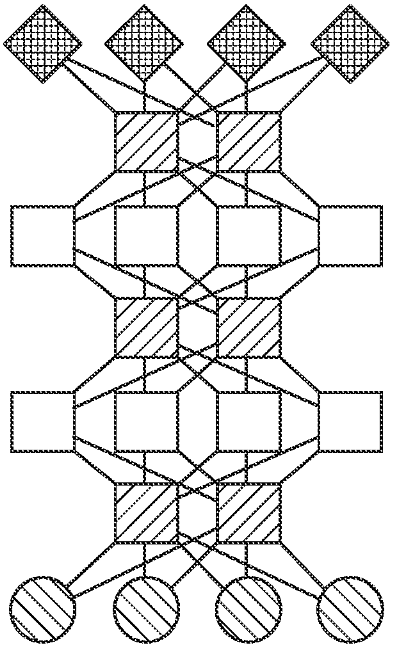
Figure 27:
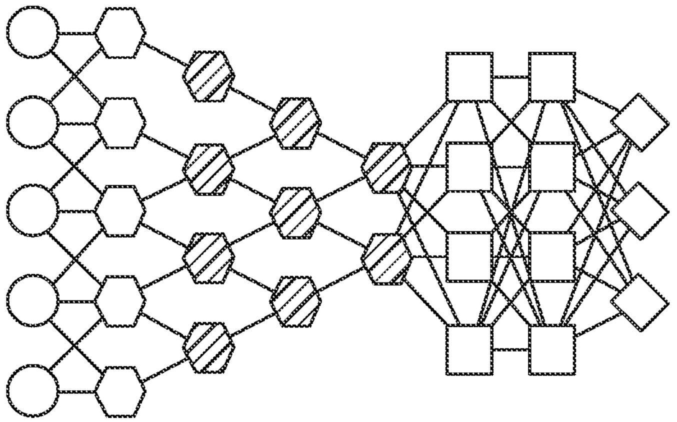
Figure 28:
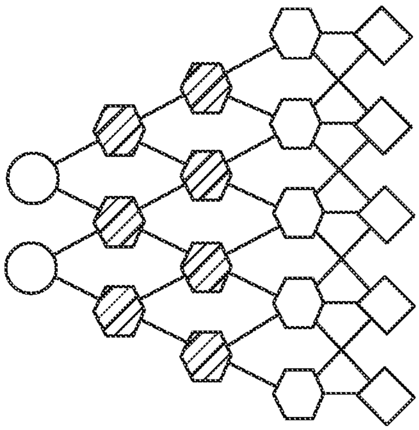
Figure 29:
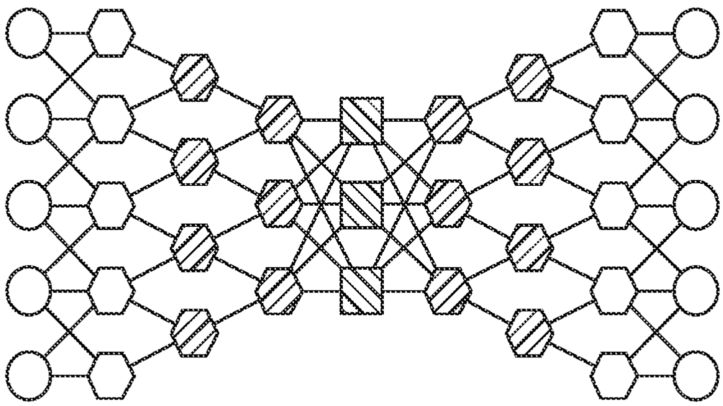
Figure 30:
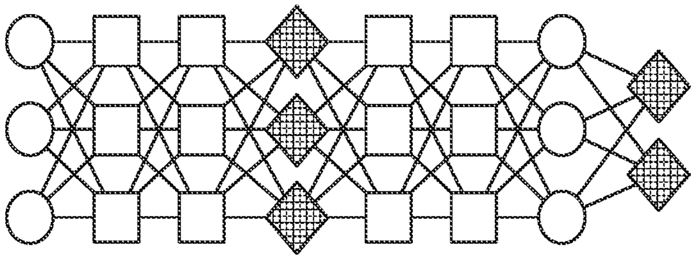
Figure 31:
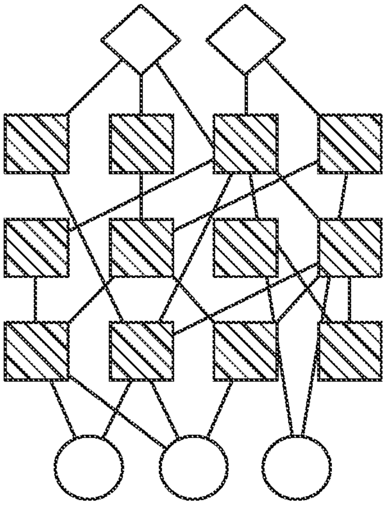
Figure 32:
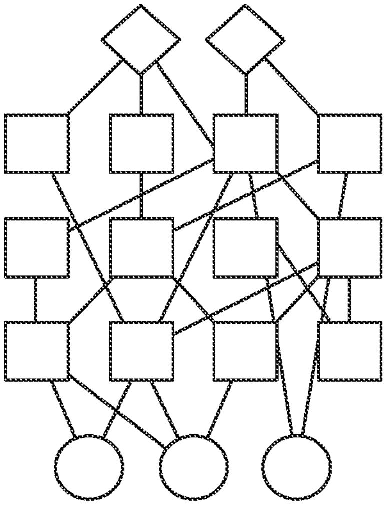
Figure 33:
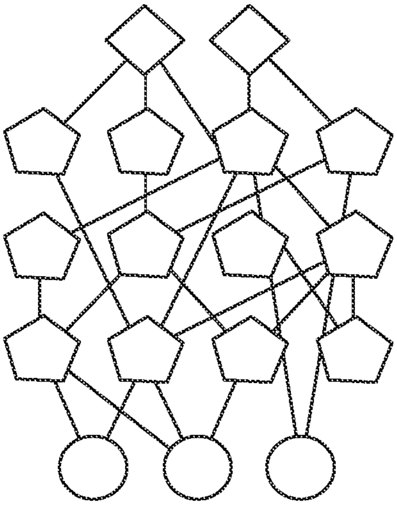
Figure 34:
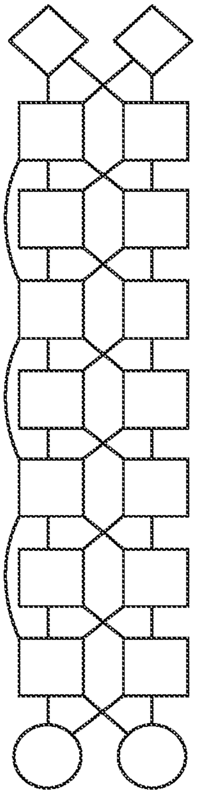
Figure 36:
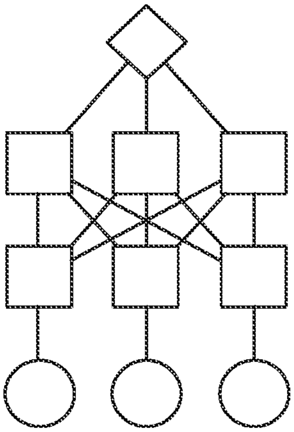
Figure 37:
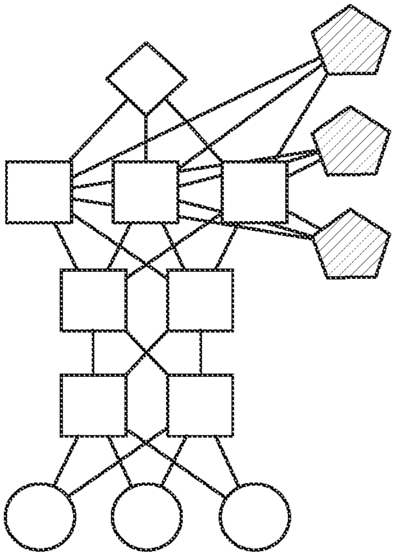
Figure 35:
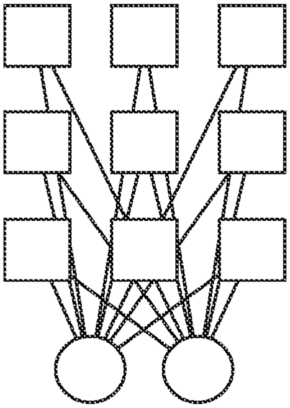

In embodiments, FIG. 11 depicts an exemplary perceptron neural network that may connect to, integrate with, or interface with the platform 102. The platform may also be associated with further neural net systems such as a feed forward neural network (FIG. 12), a radial basis neural network (FIG. 13), a deep feed forward neural network (FIG. 14), a recurrent neural network (FIG. 15), a long/short term neural network (FIG. 16), and a gated recurrent neural network (FIG. 17). The platform may also be associated with further neural net systems such as an auto encoder neural network (FIG. 18), a variational neural network (FIG. 19), a denoising neural network (FIG. 20), a sparse neural network (FIG. 21), a Markov chain neural network (FIG. 22), and a Hopfield network neural network (FIG. 23). The platform may further be associated with additional neural net systems such as a Boltzmann machine neural network (FIG. 24), a restricted BM neural network (FIG. 25), a deep belief neural network (FIG. 26), a deep convolutional neural network (FIG. 27), a deconvolutional neural network (FIG. 28), and a deep convolutional inverse graphics neural network (FIG. 29). The platform may also be associated with further neural net systems such as a generative adversarial neural network (FIG. 30), a liquid state machine neural network (FIG. 31), an extreme learning machine neural network (FIG. 32), an echo state neural network (FIG. 33), a deep residual neural network (FIG. 34), a Kohonen neural network (FIG. 35), a support vector machine neural network (FIG. 36), and a neural Turing machine neural network (FIG. 37).

The foregoing neural networks may have a variety of nodes or neurons, which may perform a variety of functions on inputs, such as inputs received from sensors or other data sources, including other nodes. Functions may involve weights, features, feature vectors, and the like. Neurons may include perceptrons, neurons that mimic biological functions (such as of the human senses of touch, vision, taste, hearing, and smell), and the like. Continuous neurons, such as with sigmoidal activation, may be used in the context of various forms of neural net, such as where back propagation is involved.

In many embodiments, an expert system or neural network may be trained, such as by a human operator or supervisor, or based on a data set, model, or the like. Training may include presenting the neural network with one or more training data sets that represent values, such as sensor data, event data, parameter data, and other types of data (including the many types described throughout this disclosure), as well as one or more indicators of an outcome, such as an outcome of a process, an outcome of a calculation, an outcome of an event, an outcome of an activity, or the like. Training may include training in optimization, such as training a neural network to optimize one or more systems based on one or more optimization approaches, such as Bayesian approaches, parametric Bayes classifier approaches, k-nearest-neighbor classifier approaches, iterative approaches, interpolation approaches, Pareto optimization approaches, algorithmic approaches, and the like. Feedback may be provided in a process of variation and selection, such as with a genetic algorithm that evolves one or more solutions based on feedback through a series of rounds.

In embodiments, a plurality of neural networks may be deployed in a cloud platform that receives data streams and other inputs collected (such as by mobile data collectors) in one or more energy edge environments and transmitted to the cloud platform over one or more networks, including using network coding to provide efficient transmission. In the cloud platform, optionally using massively parallel computational capability, a plurality of different neural networks of various types (including modular forms, structure-adaptive forms, hybrids, and the like) may be used to undertake prediction, classification, control functions, and provide other outputs as described in connection with expert systems disclosed throughout this disclosure. The different neural networks may be structured to compete with each other (optionally including use evolutionary algorithms, genetic algorithms, or the like), such that an appropriate type of neural network, with appropriate input sets, weights, node types and functions, and the like, may be selected, such as by an expert system, for a specific task involved in a given context, workflow, environment process, system, or the like.

In embodiments, methods and systems described herein that involve an expert system or self-organization capability may use a feed forward neural network, which moves information in one direction, such as from a data input, like a data source related to at least one resource or parameter related to a transactional environment, such as any of the data sources mentioned throughout this disclosure, through a series of neurons or nodes, to an output. Data may move from the input nodes to the output nodes, optionally passing through one or more hidden nodes, without loops. In embodiments, feed forward neural networks may be constructed with various types of units, such as binary McCulloch-Pitts neurons, the simplest of which is a perceptron.

In embodiments, methods and systems described herein that involve an expert system or self-organization capability may use a capsule neural network, such as for prediction, classification, or control functions with respect to a transactional environment, such as relating to one or more of the machines and automated systems described throughout this disclosure.

In embodiments, methods and systems described herein that involve an expert system or self-organization capability may use a radial basis function (RBF) neural network, which may be preferred in some situations involving interpolation in a multi-dimensional space (such as where interpolation is helpful in optimizing a multi-dimensional function, such as for optimizing a data marketplace as described here, optimizing the efficiency or output of a power generation system, a factory system, or the like, or other situation involving multiple dimensions. In embodiments, each neuron in the RBF neural network stores an example from a training set as a "prototype." Linearity involved in the functioning of this neural network offers RBF the advantage of not typically suffering from problems with local minima or maxima.

In embodiments, methods and systems described herein that involve an expert system or self-organization capability may use a radial basis function (RBF) neural network, such as one that employs a distance criterion with respect to a center (e.g., a Gaussian function). A radial basis function may be applied as a replacement for a hidden layer, such as a sigmoidal hidden layer transfer, in a multi-layer perceptron. An RBF network may have two layers, such as where an input is mapped onto each RBF in a hidden layer. In embodiments, an output layer may comprise a linear combination of hidden layer values representing, for example, a mean predicted output. The output layer value may provide an output that is the same as or similar to that of a regression model in statistics. In classification problems, the output layer may be a sigmoid function of a linear combination of hidden layer values, representing a posterior probability. Performance in both cases is often improved by shrinkage techniques, such as ridge regression in classical statistics. This corresponds to a prior belief in small parameter values (and therefore smooth output functions) in a Bayesian framework. RBF networks may avoid local minima, because the only parameters that are adjusted in the learning process are the linear mapping from hidden layer to output layer. Linearity ensures that the error surface is quadratic and therefore has a single minimum. In regression problems, this may be found in one matrix operation. In classification problems, the fixed non-linearity introduced by the sigmoid output function may be handled using an iteratively re-weighted least squares function or the like. RBF networks may use kernel methods such as support vector machines (SVM) and Gaussian processes (where the RBF is the kernel function). A non-linear kernel function may be used to project the input data into a space where the learning problem may be solved using a linear model.

In embodiments, an RBF neural network may include an input layer, a hidden layer, and a summation layer. In the input layer, one neuron appears in the input layer for each predictor variable. In the case of categorical variables, N−1 neurons are used, where N is the number of categories. The input neurons may, in embodiments, standardize the value ranges by subtracting the median and dividing by the interquartile range. The input neurons may then feed the values to each of the neurons in the hidden layer. In the hidden layer, a variable number of neurons may be used (determined by the training process). Each neuron may consist of a radial basis function that is centered on a point with as many dimensions as a number of predictor variables. The spread (e.g., radius) of the RBF function may be different for each dimension. The centers and spreads may be determined by training. When presented with the vector of input values from the input layer, a hidden neuron may compute a Euclidean distance of the test case from the neuron's center point and then apply the RBF kernel function to this distance, such as using the spread values. The resulting value may then be passed to the summation layer. In the summation layer, the value coming out of a neuron in the hidden layer may be multiplied by a weight associated with the neuron and may add to the weighted values of other neurons. This sum becomes the output. For classification problems, one output is produced (with a separate set of weights and summation units) for each target category. The value output for a category is the probability that the case being evaluated has that category. In training of an RBF, various parameters may be determined, such as the number of neurons in a hidden layer, the coordinates of the center of each hidden-layer function, the spread of each function in each dimension, and the weights applied to outputs as they pass to the summation layer. Training may be used by clustering algorithms (such as k-means clustering), by evolutionary approaches, and the like.

In embodiments, a recurrent neural network may have a time-varying, real-valued (more than just zero or one) activation (output). Each connection may have a modifiable real-valued weight. Some of the nodes are called labeled nodes, some output nodes, and others hidden nodes. For supervised learning in discrete time settings, training sequences of real-valued input vectors may become sequences of activations of the input nodes, one input vector at a time. At each time step, each non-input unit may compute its current activation as a nonlinear function of the weighted sum of the activations of all units from which it receives connections. The system may explicitly activate (independent of incoming signals) some output units at certain time steps.

In embodiments, methods and systems described herein that involve an expert system or self-organization capability may use a self-organizing neural network, such as a Kohonen self organizing neural network, such as for visualization of views of data, such as low-dimensional views of high-dimensional data. The self-organizing neural network may apply competitive learning to a set of input data, such as from one or more sensors or other data inputs from or associated with a transactional environment, including any machine or component that relates to the transactional environment. In embodiments, the self-organizing neural network may be used to identify structures in data, such as unlabeled data, such as in data sensed from a range of data sources about or sensors in or about in a transactional environment, where sources of the data are unknown (such as where events may be coming from any of a range of unknown sources). The self-organizing neural network may organize structures or patterns in the data, such that they may be recognized, analyzed, and labeled, such as identifying market behavior structures as corresponding to other events and signals.

In embodiments, methods and systems described herein that involve an expert system or self-organization capability may use a recurrent neural network, which may allow for a bi directional flow of data, such as where connected units (e.g., neurons or nodes) form a directed cycle. Such a network may be used to model or exhibit dynamic temporal behavior, such as involved in dynamic systems, such as a wide variety of the automation systems, machines and devices described throughout this disclosure, such as an automated agent interacting with a marketplace for purposes of collecting data, testing spot market transactions, execution transactions, and the like, where dynamic system behavior involves complex interactions that a user may desire to understand, predict, control and/or optimize. For example, the recurrent neural network may be used to anticipate the state of a market, such as one involving a dynamic process or action, such as a change in state of a resource that is traded in or that enables a marketplace of transactional environment. In embodiments, the recurrent neural network may use internal memory to process a sequence of inputs, such as from other nodes and/or from sensors and other data inputs from or about the transactional environment, of the various types described herein. In embodiments, the recurrent neural network may also be used for pattern recognition, such as for recognizing a machine, component, agent, or other item based on a behavioral signature, a profile, a set of feature vectors (such as in an audio file or image), or the like. In a non-limiting example, a recurrent neural network may recognize a shift in an operational mode of a marketplace or machine by learning to classify the shift from a training data set consisting of a stream of data from one or more data sources of sensors applied to or about one or more resources.

In embodiments, methods and systems described herein that involve an expert system or self-organization capability may use a modular neural network, which may comprise a series of independent neural networks (such as ones of various types described herein) that are moderated by an intermediary. Each of the independent neural networks in the modular neural network may work with separate inputs, accomplishing sub tasks that make up the task the modular network as whole is intended to perform. For example, a modular neural network may comprise a recurrent neural network for pattern recognition, such as to recognize what type of machine or system is being sensed by one or more sensors that are provided as input channels to the modular network and an RBF neural network for optimizing the behavior of the machine or system once understood. The intermediary may accept inputs of each of the individual neural networks, process them, and create output for the modular neural network, such an appropriate control parameter, a prediction of state, or the like.

Combinations among any of the pairs, triplets, or larger combinations, of the various neural network types described herein, are encompassed by the present disclosure. This may include combinations where an expert system uses one neural network for recognizing a pattern (e.g., a pattern indicating a problem or fault condition) and a different neural network for self-organizing an activity or workflow based on the recognized pattern (such as providing an output governing autonomous control of a system in response to the recognized condition or pattern). This may also include combinations where an expert system uses one neural network for classifying an item (e.g., identifying a machine, a component, or an operational mode) and a different neural network for predicting a state of the item (e.g., a fault state, an operational state, an anticipated state, a maintenance state, or the like). Modular neural networks may also include situations where an expert system uses one neural network for determining a state or context (such as a state of a machine, a process, a work flow, a marketplace, a storage system, a network, a data collector, or the like) and a different neural network for self-organizing a process involving the state or context (e.g., a data storage process, a network coding process, a network selection process, a data marketplace process, a power generation process, a manufacturing process, a refining process, a digging process, a boring process, or other process described herein).

In embodiments, methods and systems described herein that involve an expert system or self-organization capability may use a physical neural network where one or more hardware elements is used to perform or simulate neural behavior. In embodiments, one or more hardware neurons may be configured to stream voltage values, current values, or the like that represent sensor data, such as to calculate information from analog sensor inputs representing energy consumption, energy production, or the like, such as by one or more machines providing energy or consuming energy for one or more transactions. One or more hardware nodes may be configured to stream output data resulting from the activity of the neural net. Hardware nodes, which may comprise one or more chips, microprocessors, integrated circuits, programmable logic controllers, application-specific integrated circuits, field-programmable gate arrays, or the like, may be provided to optimize the machine that is producing or consuming energy, or to optimize another parameter of some part of a neural net of any of the types described herein. Hardware nodes may include hardware for acceleration of calculations (such as dedicated processors for performing basic or more sophisticated calculations on input data to provide outputs, dedicated processors for filtering or compressing data, dedicated processors for decompressing data, dedicated processors for compression of specific file or data types (e.g., for handling image data, video streams, acoustic signals, thermal images, heat maps, or the like), and the like. A physical neural network may be embodied in a data collector, including one that may be reconfigured by switching or routing inputs in varying configurations, such as to provide different neural net configurations within the data collector for handling different types of inputs (with the switching and configuration optionally under control of an expert system, which may include a software-based neural net located on the data collector or remotely). A physical, or at least partially physical, neural network may include physical hardware nodes located in a storage system, such as for storing data within a machine, a data storage system, a distributed ledger, a mobile device, a server, a cloud resource, or in a transactional environment, such as for accelerating input/output functions to one or more storage elements that supply data to or take data from the neural net. A physical, or at least partially physical, neural network may include physical hardware nodes located in a network, such as for transmitting data within, to or from an energy edge environment, such as for accelerating input/output functions to one or more network nodes in the net, accelerating relay functions, or the like. In embodiments of a physical neural network, an electrically adjustable resistance material may be used for emulating the function of a neural synapse. In embodiments, the physical hardware emulates the neurons, and software emulates the neural network between the neurons. In embodiments, neural networks complement conventional algorithmic computers. They are versatile and may be trained to perform appropriate functions without the need for any instructions, such as classification functions, optimization functions, pattern recognition functions, control functions, selection functions, evolution functions, and others.

In embodiments, methods and systems described herein that involve an expert system or self-organization capability may use a multilayered feed forward neural network, such as for complex pattern classification of one or more items, phenomena, modes, states, or the like. In embodiments, a multilayered feed forward neural network may be trained by an optimization technique, such as a genetic algorithm, such as to explore a large and complex space of options to find an optimum, or near-optimum, global solution. For example, one or more genetic algorithms may be used to train a multilayered feed forward neural network to classify complex phenomena, such as to recognize complex operational modes of machines, such as modes involving complex interactions among machines (including interference effects, resonance effects, and the like), modes involving non-linear phenomena, modes involving critical faults, such as where multiple, simultaneous faults occur, making root cause analysis difficult, and others. In embodiments, a multilayered feed forward neural network may be used to classify results from monitoring of a marketplace, such as monitoring systems, such as automated agents, that operate within the marketplace, as well as monitoring resources that enable the marketplace, such as computing, networking, energy, data storage, energy storage, and other resources.

In embodiments, methods and systems described herein that involve an expert system or self-organization capability may use a feed-forward, back-propagation multi-layer perceptron (MLP) neural network, such as for handling one or more remote sensing applications, such as for taking inputs from sensors distributed throughout various transactional environments. In embodiments, the MLP neural network may be used for classification of energy edge environments and resource environments, such as spot markets, forward markets, energy markets, renewable energy credit (REC) markets, networking markets, advertising markets, spectrum markets, ticketing markets, rewards markets, compute markets, and others mentioned throughout this disclosure, as well as physical resources and environments that produce them, such as energy resources (including renewable energy environments, mining environments, exploration environments, drilling environments, and the like, including classification of geological structures (including underground features and above ground features), classification of materials (including fluids, minerals, metals, and the like), and other problems. This may include fuzzy classification. In embodiments, methods and systems described herein that involve an expert system or self-organization capability may use a structure-adaptive neural network, where the structure of a neural network is adapted, such as based on a rule, a sensed condition, a contextual parameter, or the like. For example, if a neural network does not converge on a solution, such as classifying an item or arriving at a prediction, when acting on a set of inputs after some amount of training, the neural network may be modified, such as from a feed forward neural network to a recurrent neural network, such as by switching data paths between some subset of nodes from unidirectional to bi directional data paths. The structure adaptation may occur under control of an expert system, such as to trigger adaptation upon occurrence of a trigger, rule or event, such as recognizing occurrence of a threshold (such as an absence of a convergence to a solution within a given amount of time) or recognizing a phenomenon as requiring different or additional structure (such as recognizing that a system is varying dynamically or in a non-linear fashion). In one non-limiting example, an expert system may switch from a simple neural network structure like a feed forward neural network to a more complex neural network structure like a recurrent neural network, a convolutional neural network, or the like upon receiving an indication that a continuously variable transmission is being used to drive a generator, turbine, or the like in a system being analyzed.

In embodiments, methods and systems described herein that involve an expert system or self-organization capability may use an autoencoder, autoassociator or Diabolo neural network, which may be similar to a multilayer perceptron (MLP) neural network, such as where there may be an input layer, an output layer and one or more hidden layers connecting them. However, the output layer in the auto-encoder may have the same number of units as the input layer, where the purpose of the MLP neural network is to reconstruct its own inputs (rather than just emitting a target value). Therefore, the auto encoders may operate as an unsupervised learning model. An auto encoder may be used, for example, for unsupervised learning of efficient codings, such as for dimensionality reduction, for learning generative models of data, and the like. In embodiments, an auto-encoding neural network may be used to self-learn an efficient network coding for transmission of analog sensor data from a machine over one or more networks or of digital data from one or more data sources. In embodiments, an auto-encoding neural network may be used to self-learn an efficient storage approach for storage of streams of data.

In embodiments, methods and systems described herein that involve an expert system or self-organization capability may use a probabilistic neural network (PNN), which, in embodiments, may comprise a multi-layer (e.g., four-layer) feed forward neural network, where layers may include input layers, hidden layers, pattern/summation layers and an output layer. In an embodiment of a PNN algorithm, a parent probability distribution function (PDF) of each class may be approximated, such as by a Parzen window and/or a non-parametric function. Then, using the PDF of each class, the class probability of a new input is estimated, and Bayes' rule may be employed, such as to allocate it to the class with the highest posterior probability. A PNN may embody a Bayesian network and may use a statistical algorithm or analytic technique, such as Kernel Fisher discriminant analysis technique. The PNN may be used for classification and pattern recognition in any of a wide range of embodiments disclosed herein. In one non-limiting example, a probabilistic neural network may be used to predict a fault condition of an engine based on collection of data inputs from sensors and instruments for the engine.

In embodiments, methods and systems described herein that involve an expert system or self-organization capability may use a time delay neural network (TDNN), which may comprise a feed forward architecture for sequential data that recognizes features independent of sequence position. In embodiments, to account for time shifts in data, delays are added to one or more inputs, or between one or more nodes, so that multiple data points (from distinct points in time) are analyzed together. A time delay neural network may form part of a larger pattern recognition system, such as using a perceptron network. In embodiments, a TDNN may be trained with supervised learning, such as where connection weights are trained with back propagation or under feedback. In embodiments, a TDNN may be used to process sensor data from distinct streams, such as a stream of velocity data, a stream of acceleration data, a stream of temperature data, a stream of pressure data, and the like, where time delays are used to align the data streams in time, such as to help understand patterns that involve understanding of the various streams (e.g., changes in price patterns in spot or forward markets).

In embodiments, methods and systems described herein that involve an expert system or self-organization capability may use a convolutional neural network (referred to in some cases as a CNN, a ConvNet, a shift invariant neural network, or a space invariant neural network), wherein the units are connected in a pattern similar to the visual cortex of the human brain. Neurons may respond to stimuli in a restricted region of space, referred to as a receptive field. Receptive fields may partially overlap, such that they collectively cover the entire (e.g., visual) field. Node responses may be calculated mathematically, such as by a convolution operation, such as using multilayer perceptrons that use minimal preprocessing. A convolutional neural network may be used for recognition within images and video streams, such as for recognizing a type of machine in a large environment using a camera system disposed on a mobile data collector, such as on a drone or mobile robot. In embodiments, a convolutional neural network may be used to provide a recommendation based on data inputs, including sensor inputs and other contextual information, such as recommending a route for a mobile data collector. In embodiments, a convolutional neural network may be used for processing inputs, such as for natural language processing of instructions provided by one or more parties involved in a workflow in an environment. In embodiments, a convolutional neural network may be deployed with a large number of neurons (e.g., 100,000, 500,000 or more), with multiple (e.g., 4, 5, 6 or more) layers, and with many (e.g., millions) of parameters. A convolutional neural net may use one or more convolutional nets.

In embodiments, methods and systems described herein that involve an expert system or self-organization capability may use a regulatory feedback network, such as for recognizing emergent phenomena (such as new types of behavior not previously understood in a transactional environment).

In embodiments, methods and systems described herein that involve an expert system or self-organization capability may use a self-organizing map (SOM), involving unsupervised learning. A set of neurons may learn to map points in an input space to coordinates in an output space. The input space may have different dimensions and topology from the output space, and the SOM may preserve these while mapping phenomena into groups.

In embodiments, methods and systems described herein that involve an expert system or self-organization capability may use a learning vector quantization neural net (LVQ). Prototypical representatives of the classes may parameterize, together with an appropriate distance measure, in a distance-based classification scheme.

In embodiments, methods and systems described herein that involve an expert system or self-organization capability may use an echo state network (ESN), which may comprise a recurrent neural network with a sparsely connected, random hidden layer. The weights of output neurons may be changed (e.g., the weights may be trained based on feedback). In embodiments, an ESN may be used to handle time series patterns, such as, in an example, recognizing a pattern of events associated with a market, such as the pattern of price changes in response to stimuli.

In embodiments, methods and systems described herein that involve an expert system or self-organization capability may use a Bi-directional, recurrent neural network (BRNN), such as using a finite sequence of values (e.g., voltage values from a sensor) to predict or label each element of the sequence based on both the past and the future context of the element. This may be done by adding the outputs of two RNNs, such as one processing the sequence from left to right, the other one from right to left. The combined outputs are the predictions of target signals, such as ones provided by a teacher or supervisor. A bi-directional RNN may be combined with a long short-term memory RNN.

In embodiments, methods and systems described herein that involve an expert system or self-organization capability may use a hierarchical RNN that connects elements in various ways to decompose hierarchical behavior, such as into useful subprograms. In embodiments, a hierarchical RNN may be used to manage one or more hierarchical templates for data collection in a transactional environment.

In embodiments, methods and systems described herein that involve an expert system or self-organization capability may use a stochastic neural network, which may introduce random variations into the network. Such random variations may be viewed as a form of statistical sampling, such as Monte Carlo sampling.

In embodiments, methods and systems described herein that involve an expert system or self-organization capability may use a genetic scale recurrent neural network. In such embodiments, an RNN (often an LSTM) is used where a series is decomposed into a number of scales where every scale informs the primary length between two consecutive points. A first order scale consists of a normal RNN, a second order consists of all points separated by two indices and so on. The Nth order RNN connects the first and last node. The outputs from all the various scales may be treated as a committee of members, and the associated scores may be used genetically for the next iteration.

In embodiments, methods and systems described herein that involve an expert system or self-organization capability may use a committee of machines (CoM), comprising a collection of different neural networks that together “vote” on a given example. Because neural networks may suffer from local minima, starting with the same architecture and training, but using randomly different initial weights often gives different results. A CoM tends to stabilize the result.

In embodiments, methods and systems described herein that involve an expert system or self-organization capability may use an associative neural network (ASNN), such as involving an extension of a committee of machines that combines multiple feed forward neural networks and a k-nearest neighbor technique. It may use the correlation between ensemble responses as a measure of distance amid the analyzed cases for the kNN. This corrects the bias of the neural network ensemble. An associative neural network may have a memory that may coincide with a training set. If new data become available, the network instantly improves its predictive ability and provides data approximation (self-learns) without retraining. Another important feature of ASNN is the possibility to interpret neural network results by analysis of correlations between data cases in the space of models.

In embodiments, methods and systems described herein that involve an expert system or self-organization capability may use an instantaneously trained neural network (ITNN), where the weights of the hidden and the output layers are mapped directly from training vector data.

In embodiments, methods and systems described herein that involve an expert system or self-organization capability may use a spiking neural network, which may explicitly consider the timing of inputs. The network input and output may be represented as a series of spikes (such as a delta function or more complex shapes). SNNs may process information in the time domain (e.g., signals that vary over time, such as signals involving dynamic behavior of markets or transactional environments). They are often implemented as recurrent networks.

In embodiments, methods and systems described herein that involve an expert system or self-organization capability may use a dynamic neural network that addresses nonlinear multivariate behavior and includes learning of time-dependent behavior, such as transient phenomena and delay effects. Transients may include behavior of shifting market variables, such as prices, available quantities, available counterparties, and the like.

In embodiments, cascade correlation may be used as an architecture and supervised learning algorithm, supplementing adjustment of the weights in a network of fixed topology. Cascade-correlation may begin with a minimal network, then automatically trains and add new hidden units one by one, creating a multi-layer structure. Once a new hidden unit has been added to the network, its input-side weights may be frozen. This unit then becomes a permanent feature-detector in the network, available for producing outputs or for creating other, more complex feature detectors. The cascade-correlation architecture may learn quickly, determine its own size and topology, and retain the structures it has built even if the training set changes and requires no back-propagation.

In embodiments, methods and systems described herein that involve an expert system or self-organization capability may use a neuro-fuzzy network, such as involving a fuzzy inference system in the body of an artificial neural network. Depending on the type, several layers may simulate the processes involved in a fuzzy inference, such as fuzzification, inference, aggregation and defuzzification. Embedding a fuzzy system in a general structure of a neural net as the benefit of using available training methods to find the parameters of a fuzzy system.

In embodiments, methods and systems described herein that involve an expert system or self-organization capability may use a compositional pattern-producing network (CPPN), such as a variation of an associative neural network (ANN) that differs the set of activation functions and how they are applied. While typical ANNs often contain only sigmoid functions (and sometimes Gaussian functions), CPPNs may include both types of functions and many others. Furthermore, CPPNs may be applied across the entire space of possible inputs, so that they may represent a complete image. Since they are compositions of functions, CPPNs in effect encode images at infinite resolution and may be sampled for a particular display at whatever resolution is optimal.

This type of network may add new patterns without re-training. In embodiments, methods and systems described herein that involve an expert system or self-organization capability may use a one-shot associative memory network, such as by creating a specific memory structure, which assigns each new pattern to an orthogonal plane using adjacently connected hierarchical arrays.

In embodiments, methods and systems described herein that involve an expert system or self-organization capability may use a hierarchical temporal memory (HTM) neural network, such as involving the structural and algorithmic properties of the neocortex. HTM may use a biomimetic model based on memory-prediction theory. HTM may be used to discover and infer the high-level causes of observed input patterns and sequences.

In embodiments, methods and systems described herein that involve an expert system or self-organization capability may use a holographic associative memory (HAM) neural network, which may comprise an analog, correlation-based, associative, stimulus-response system. Information may be mapped onto the phase orientation of complex numbers. The memory is effective for associative memory tasks, generalization and pattern recognition with changeable attention.

Quantum Computing Service

Figure 38:
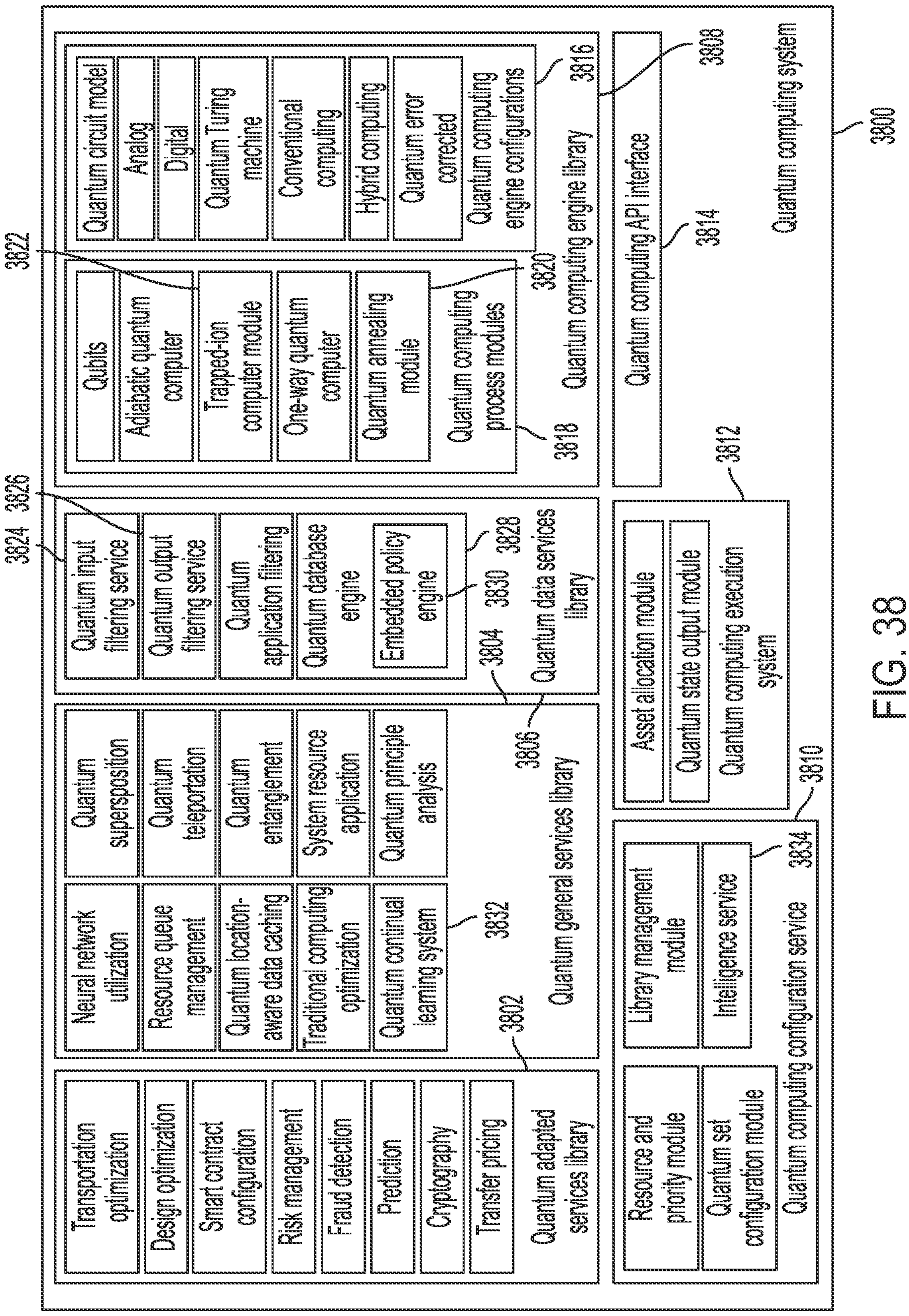
FIG. 38 is a schematic view of an exemplary embodiment of a quantum computing service according to some embodiments of the present disclosure.

FIG. 38 illustrates an example quantum computing system 3800 according to some embodiments of the present disclosure. In embodiments, the quantum computing system 3800 provides a framework for providing a set of quantum computing services to one or more quantum computing clients. In some embodiments, the quantum computing system 3800 framework may be at least partially replicated in respective quantum computing clients. In these embodiments, an individual client may include some or all of the capabilities of the quantum computing system 3800, whereby the quantum computing system 3800 is adapted for the specific functions performed by the subsystems of the quantum computing client. Additionally, or alternatively, in some embodiments, the quantum computing system 3800 may be implemented as a set of microservices, such that different quantum computing clients may leverage the quantum computing system 3800 via one or more APIs exposed to the quantum computing clients. In these embodiments, the quantum computing system 3800 may be configured to perform various types of quantum computing services that may be adapted for different quantum computing clients. In either of these configurations, a quantum computing client may provide a request to the quantum computing system 3800, whereby the request is to perform a specific task (e.g., an optimization). In response, the quantum computing system 3800 executes the requested task and returns a response to the quantum computing client.

Referring to FIG. 38, in some embodiments, the quantum computing system 3800 may include a quantum adapted services library 3802, a quantum general services library 3804, a quantum data services library 3806, a quantum computing engine library 3808, a quantum computing configuration service 3810, a quantum computing execution system 3812, and quantum computing API interface 3814.

In embodiments, the quantum computing engine library 3808 includes quantum computing engine configurations 3816 and quantum computing process modules 3818 based on various supported quantum models. In embodiments, the quantum computing system 3800 may support many different quantum models, including, but not limited to, the quantum circuit model, quantum Turing machine, adiabatic quantum computer, spintronic computing system (such as using spin-orbit coupling to generate spin-polarized electronic states in non-magnetic solids, such as ones using diamond materials), one-way quantum computer, quantum annealing, and various quantum cellular automata. Under the quantum circuit model, quantum circuits may be based on the quantum bit, or "qubit", which is somewhat analogous to the bit in classical computation. Qubits may be in a 1 or 0 quantum state or they may be in a superposition of the 1 and 0 states. However, when qubits have measured the result of a measurement, qubits will always be in is always either a 1 or 0 quantum state. The probabilities related to these two outcomes depend on the quantum state that the qubits were in immediately before the measurement. Computation is performed by manipulating qubits with quantum logic gates, which are somewhat analogous to classical logic gates.

In embodiments, the quantum computing system 3800 may be physically implemented using an analog approach or a digital approach. Analog approaches may include, but are not limited to, quantum simulation, quantum annealing, and adiabatic quantum computation. In embodiments, digital quantum computers use quantum logic gates for computation. Both analog and digital approaches may use quantum bits, or qubits.

In embodiments, the quantum computing system 3800 includes a quantum annealing module 3820 wherein the quantum annealing module may be configured to find the global minimum or maximum of a given objective function over a given set of candidate solutions (e.g., candidate states) using quantum fluctuations. As used herein, quantum annealing may refer to a meta-procedure for finding a procedure that identifies an absolute minimum or maximum, such as a size, length, cost, time, distance or other measure, from within a possibly very large, but finite, set of possible solutions using quantum fluctuation-based computation instead of classical computation. The quantum annealing module 3820 may be leveraged for problems where the search space is discrete (e.g., combinatorial optimization problems) with many local minima, such as finding the ground state of a spin glass or the traveling salesman problem.

In embodiments, the quantum annealing module 3820 starts from a quantum-mechanical superposition of all possible states (candidate states) with equal weights. The quantum annealing module 3820 may then evolve, such as following the time-dependent Schrödinger equation, a natural quantum-mechanical evolution of systems (e.g., physical systems, logical systems, or the like). In embodiments, the amplitudes of all candidate states change, realizing quantum parallelism according to the time-dependent strength of the transverse field, which causes quantum tunneling between states. If the rate of change of the transverse field is slow enough, the quantum annealing module 3820 may stay close to the ground state of the instantaneous Hamiltonian. If the rate of change of the transverse field is accelerated, the quantum annealing module 3820 may leave the ground state temporarily but produce a higher likelihood of concluding in the ground state of the final problem energy state or Hamiltonian.

In embodiments, the quantum computing system 3800 may include arbitrarily large numbers of qubits and may transport ions to spatially distinct locations in an array of ion traps, building large, entangled states via photonically connected networks of remotely entangled ion chains.

In some implementations, the quantum computing system 3800 includes a trapped ion computer module 3822, which may be a quantum computer that applies trapped ions to solve complex problems. Trapped ion computer module 3822 may have low quantum decoherence and may be able to construct large solution states. Ions, or charged atomic particles, may be confined and suspended in free space using electromagnetic fields. Qubits are stored in stable electronic states of each ion, and quantum information may be transferred through the collective quantized motion of the ions in a shared trap (interacting through the Coulomb force). Lasers may be applied to induce coupling between the qubit states (for single-qubit operations) or coupling between the internal qubit states and the external motional states (for entanglement between qubits).

In some embodiments of the invention, a traditional computer, including a processor, memory, and a graphical user interface (GUI), may be used for designing, compiling, and providing output from the execution and the quantum computing system 3800 may be used for executing the machine language instructions. In some embodiments of the invention, the quantum computing system 3800 may be simulated by a computer program executed by the traditional computer. In such embodiments, a superposition of states of the quantum computing system 3800 can be prepared based on input from the initial conditions. Since the initialization operation available in a quantum computer can only initialize a qubit to either the |0> or |1> state, initialization to a superposition of states is physically unrealistic. For simulation purposes, however, it may be useful to bypass the initialization process and initialize the quantum computing system 3800 directly.

In some embodiments, the quantum computing system 3800 provides various quantum data services, including quantum input filtering, quantum output filtering, quantum application filtering, and a quantum database engine.

In embodiments, the quantum computing system 3800 may include a quantum input filtering service 3824. In embodiments, quantum input filtering service 3824 may be configured to select whether to run a model on the quantum computing system 3800 or to run the model on a classic computing system. In some embodiments, quantum input filtering service 3824 may filter data for later modeling on a classic computer. In embodiments, the quantum computing system 3800 may provide input to traditional compute platforms while filtering out unnecessary information from flowing into distributed systems. In some embodiments, the platform 3800 may trust through filtered specified experiences for intelligent agents.

In embodiments, a system in the system of systems may include a model or system for automatically determining, based on a set of inputs, whether to deploy quantum computational or quantum algorithmic resources to an activity, whether to deploy traditional computational resources and algorithms, or whether to apply a hybrid or combination of them. In embodiments, inputs to a model or automation system may include demand information, supply information, financial data, energy cost information, capital costs for computational resources, development costs (such as for algorithms), energy costs, operational costs (including labor and other costs), performance information on available resources (quantum and traditional), and any of the many other data sets that may be used to simulate (such as using any of a wide variety of simulation techniques described herein and/or in the documents incorporated herein by refence) and/or predict the difference in outcome between a quantum-optimized result and a non-quantum-optimized result. A machine learned model (including in a DPANN system) may be trained, such as by deep learning on outcomes or by a data set from human expert decisions, to determine what set of resources to deploy given the input data for a given request. The model may itself be deployed on quantum computational resources and/or may use quantum algorithms, such as quantum annealing, to determine whether, where and when to use quantum systems, conventional systems, and/or hybrids or combinations.

In some embodiments of the invention, the quantum computing system 3800 may include a quantum output filtering service 3826. In embodiments, the quantum output filtering service 3826 may be configured to select a solution from solutions of multiple neural networks. For example, multiple neural networks may be configured to generate solutions to a specific problem and the quantum output filtering service 3826 may select the best solution from the set of solutions.

In some embodiments, the quantum computing system 3800 connects and directs a neural network development or selection process. In this embodiment, the quantum computing system 3800 may directly program the weights of a neural network such that the neural network gives the desired outputs. This quantum-programmed neural network may then operate without the oversight of the quantum computing system 3800 but will still be operating within the expected parameters of the desired computational engine.

In embodiments, the quantum computing system 3800 includes a quantum database engine 3828. In embodiments, the quantum database engine 3828 is configured with in-database quantum algorithm execution. In embodiments, a quantum query language may be employed to query the quantum database engine 3828. In some embodiments, the quantum database engine may have an embedded policy engine 3830 for prioritization and/or allocation of quantum workflows, including prioritization of query workloads, such as based on overall priority as well as the comparative advantage of using quantum computing resources versus others. In embodiments, quantum database engine 3828 may assist with the recognition of entities by establishing a single identity for that is valid across interactions and touchpoints. The quantum database engine 3828 may be configured to perform optimization of data matching and intelligent traditional compute optimization to match individual data elements. The quantum computing system 3800 may include a quantum data obfuscation system for obfuscating data.

The quantum computing system 3800 may include, but is not limited to, analog quantum computers, digital computers, and/or error-corrected quantum computers. Analog quantum computers may directly manipulate the interactions between qubits without breaking these actions into primitive gate operations. In embodiments, quantum computers that may run analog machines include, but are not limited to, quantum annealers, adiabatic quantum computers, and direct quantum simulators. The digital computers may operate by carrying out an algorithm of interest using primitive gate operations on physical qubits. Error-corrected quantum computers may refer to a version of gate-based quantum computers made more robust through the deployment of quantum error correction (QEC), which enables noisy physical qubits to emulate stable logical qubits so that the computer behaves reliably for any computation. Further, quantum information products may include, but are not limited to, computing power, quantum predictions, and quantum inventions.

In some embodiments, the quantum computing system 3800 is configured as an engine that may be used to optimize traditional computers, integrate data from multiple sources into a decision-making process, and the like. The data integration process may involve real-time capture and management of interaction data by a wide range of tracking capabilities, both directly and indirectly related to value chain network activities. In embodiments, the quantum computing system 3800 may be configured to accept cookies, email addresses and other contact data, social media feeds, news feeds, event and transaction log data (including transaction events, network events, computational events, and many others), event streams, results of web crawling, distributed ledger information (including blockchain updates and state information), results from distributed or federated queries of data sources, streams of data from chat rooms and discussion forums, and many others.

In embodiments, the quantum computing system 3800 includes a quantum register having a plurality of qubits. Further, the quantum computing system 3800 may include a quantum control system for implementing the fundamental operations on each of the qubits in the quantum register and a control processor for coordinating the operations required.

In embodiments, the quantum computing system 3800 is configured to optimize the pricing of a set of goods or services. In embodiments, the quantum computing system 3800 may utilize quantum annealing to provide optimized pricing. In embodiments, the quantum computing system 3800 may use q-bit based computational methods to optimize pricing.

In embodiments, the quantum computing system 3800 is configured to automatically discover smart contract configuration opportunities. Automated discovery of smart contract configuration opportunities may be based on published APIs to marketplaces and machine learning (e.g., by robotic process automation (RPA) of stakeholder, asset, and transaction types.

In embodiments, quantum-established or other blockchain-enabled smart contracts enable frequent transactions occurring among a network of parties, and manual or duplicative tasks are performed by counterparties for each transaction. The quantum-established or other blockchain acts as a shared database to provide a secure, single source of truth, and smart contracts automate approvals, calculations, and other transacting activities that are prone to lag and error. Smart contracts may use software code to automate tasks, and in some embodiments, this software code may include quantum code that enables extremely sophisticated optimized results.

In embodiments, the quantum computing system 3800 or other system in the system of systems may include a quantum-enabled or other risk identification module that is configured to perform risk identification and/or mitigation. The steps that may be taken by the risk identification module may include, but are not limited to, risk identification, impact assessment, and the like. In some embodiments, the risk identification module determines a risk type from a set of risk types. In embodiments, risks may include, but are not limited to, preventable, strategic, and external risks. Preventable risks may refer to risks that come from within and that can usually be managed on a rule-based level, such as employing operational procedures monitoring and employee and manager guidance and instruction. Strategy risks may refer to those risks that are taken on voluntarily to achieve greater rewards. External risks may refer to those risks that originate outside and are not in the businesses' control (such as natural disasters). External risks are not preventable or desirable. In embodiments, the risk identification module can determine a predicted cost for many categories of risk. The risk identification module may perform a calculation of current and potential impact on an overall risk profile. In embodiments, the risk identification module may determine the probability and significance of certain events. Additionally, or alternatively, the risk identification module may be configured to anticipate events.

In embodiments, the quantum computing system 3800 or other system of the platform 3800 is configured for graph clustering analysis for anomaly and fraud detection.

In some embodiments, the quantum computing system 3800 includes a quantum prediction module, which is configured to generate predictions. Furthermore, the quantum prediction module may construct classical prediction engines to further generate predictions, reducing the need for ongoing quantum calculation costs, which, can be substantial compared to traditional computers.

In embodiments, the quantum computing system 3800 may include a quantum principal component analysis (QPCA) algorithm that may process input vector data if the covariance matrix of the data is efficiently obtainable as a density matrix, under specific assumptions about the vectors given in the quantum mechanical form. It may be assumed that the user has quantum access to the training vector data in a quantum memory. Further, it may be assumed that each training vector is stored in the quantum memory in terms of its difference from the class means. These QPCA algorithms can then be applied to provide for dimension reduction using the calculational benefits of a quantum method.

In embodiments, the quantum computing system 3800 is configured for graph clustering analysis for certified randomness for proof-of-stake blockchains. Quantum cryptographic schemes may make use of quantum mechanics in their designs, which enables such schemes to rely on presumably unbreakable laws of physics for their security. The quantum cryptography schemes may be information-theoretically secure such that their security is not based on any non-fundamental assumptions. In the design of blockchain systems, information-theoretic security is not proven. Rather, classical blockchain technology typically relies on security arguments that make assumptions about the limitations of attackers' resources.

In embodiments, the quantum computing system 3800 is configured for detecting adversarial systems, such as adversarial neural networks, including adversarial convolutional neural networks. For example, the quantum computing system 3800 or other systems of the platform 3800 may be configured to detect fake trading patterns.

In embodiments, the quantum computing system 3800 includes a quantum continual learning (QCL) system 3832, wherein the QCL system 3832 learns continuously and adaptively about the external world, enabling the autonomous incremental development of complex skills and knowledge by updating a quantum model to account for different tasks and data distributions. The QCL system 3832 operates on a realistic time scale where data and/or tasks become available only during operation. Previous quantum states can be superimposed into the quantum engine to provide the capacity for QCL. Because the QCL system 3832 is not constrained to a finite number of variables that can be processed deterministically, it can continuously adapt to future states, producing a dynamic continual learning capability. The QCL system 3832 may have applications where data distributions stay relatively static, but where data is continuously being received. For example, the QCL system 3832 may be used in quantum recommendation applications or quantum anomaly detection systems where data is continuously being received and where the quantum model is continuously refined to provide for various outcomes, predictions, and the like. QCL enables asynchronous alternate training of tasks and only updates the quantum model on the real-time data available from one or more streaming sources at a particular moment.

In embodiments, the QCL system 3832 operates in a complex environment in which the target data keeps changing based on a hidden variable that is not controlled. In embodiments, the QCL system 3832 can scale in terms of intelligence while processing increasing amounts of data and while maintaining a realistic number of quantum states. The QCL system 3832 applies quantum methods to drastically reduce the requirement for storage of historic data while allowing the execution of continuous computations to provide for detail-driven optimal results. In embodiments, a QCL system 3832 is configured for unsupervised streaming perception data since it continually updates the quantum model with new available data.

In embodiments, QCL system 3832 enables multi-modal-multi-task quantum learning. The QCL system 3832 is not constrained to a single stream of perception data but allows for many streams of perception data from different sensors and input modalities. In embodiments, the QCL system 3832 can solve multiple tasks by duplicating the quantum state and executing computations on the duplicate quantum environment. A key advantage to QCL is that the quantum model does not need to be retrained on historic data, as the superposition state holds information relating to all prior inputs. Multi-modal and multi-task quantum learning enhance quantum optimization since it endows quantum machines with reasoning skills through the application of vast amounts of state information.

In embodiments, the quantum computing system 3800 supports quantum superposition, or the ability of a set of states to be overlaid into a single quantum environment.

In embodiments, the quantum computing system 3800 supports quantum teleportation. For example, information may be passed between photons on chipsets even if the photons are not physically linked.

In embodiments, the quantum computing system 3800 may include a quantum transfer pricing system. Quantum transfer pricing allows for the establishment of prices for the goods and/or services exchanged between subsidiaries, affiliates, or commonly controlled companies that are part of a larger enterprise and may be used to provide tax savings for corporations. In embodiments, solving a transfer pricing problem involves testing the elasticities of each system in the system of systems with a set of tests. In these embodiments, the testing may be done in periodic batches and then may be iterated. As described herein, transfer pricing may refer to the price that one division in a company charges another division in that company for goods and services.

In embodiments, the quantum transfer pricing system consolidates all financial data related to transfer pricing on an ongoing basis throughout the year for all entities of an organization wherein the consolidation involves applying quantum entanglement to overlay data into a single quantum state. In embodiments, the financial data may include profit data, loss data, data from intercompany invoices (potentially including quantities and prices), and the like.

In embodiments, the quantum transfer pricing system may interface with a reporting system that reports segmented profit and loss, transaction matrices, tax optimization results, and the like based on superposition data. In embodiments, the quantum transfer pricing system automatically generates forecast calculations and assesses the expected local profits for any set of quantum states.

In embodiments, the quantum transfer pricing system may integrate with a simulation system for performing simulations. Suggested optimal values for new product prices can be discussed cross-border via integrated quantum workflows and quantum teleportation communicated states.

In embodiments, quantum transfer pricing may be used to proactively control the distribution of profits within a multinational enterprise (MNE), for example, during the course of a calendar year, enabling the entities to achieve arms-length profit ranges for each type of transaction.

In embodiments, the QCL system 3832 may use a number of methods to calculate quantum transfer pricing, including the quantum comparable uncontrolled price (QCUP) method, the quantum cost plus percent method (QCPM), the quantum resale price method (QRPM), the quantum transaction net margin method (QTNM), and the quantum profit-split method.

The QCUP method may apply quantum calculations to find comparable transactions made between related and unrelated organizations, potentially through the sharing of quantum superposition data. By comparing the price of goods and/or services in an intercompany transaction with the price used by independent parties through the application of a quantum comparison engine, a benchmark price may be determined.

The QCPM method may compare the gross profit to the cost of sales, thus measuring the cost-plus mark-up (the actual profit earned from the products). Once this mark-up is determined, it should be equal to what a third party would make for a comparable transaction in a comparable context with similar external market conditions. In embodiments, the quantum engine may simulate the external market conditions.

The QRPM method looks at groups of transactions rather than individual transactions and is based on the gross margin or difference between the price at which a product is purchased and the price at which it is sold to a third party. In embodiments, the quantum engine may be applied to calculate the price differences and to record the transactions in the superposition system.

The QTNM method is based on the net profit of a controlled transaction rather than comparable external market pricing. The calculation of the net profit is accomplished through a quantum engine that can consider a wide variety of factors and solve optimally for the product price. The net profit may then be compared with the net profit of independent enterprises, potentially using quantum teleportation.

The quantum profit-split method may be used when two related companies work on the same business venture, but separately. In these applications, the quantum transfer pricing is based on profit. The quantum profit-split method applies quantum calculations to determine how the profit associated with a particular transaction would have been divided between the independent parties involved.

In embodiments, the quantum computing system 3800 may leverage one or artificial networks to fulfill the request of a quantum computing client. For example, the quantum computing system 3800 may leverage a set of artificial neural networks to identify patterns in images (e.g., using image data from a liquid lens system), perform binary matrix factorization, perform topical content targeting, perform similarity-based clustering, perform collaborative filtering, perform opportunity mining, or the like.

In embodiments, the system of systems may include a hybrid computing allocation system for prioritization and allocation of quantum computing resources and traditional computing resources. In embodiments, the prioritization and allocation of quantum computing resources and traditional computing resources may be measure-based (e.g., measuring the extent of the advantage of the quantum resource relative to other available resources), cost-based, optimality-based, speed-based, impact-based, or the like. In some embodiments the hybrid computing allocation system is configured to perform time-division multiplexing between the quantum computing system 3800 and a traditional computing system. In embodiments, the hybrid computing allocation system may automatically track and report on the allocation of computational resources, the availability of computational resources, the cost of computational resources, and the like.

In embodiments, the quantum computing system 3800 may be leveraged for queue optimization for utilization of quantum computing resources, including context-based queue optimizations.

In embodiments, the quantum computing system 3800 may support quantum-computation-aware location-based data caching.

In embodiments, the quantum computing system 3800 may be leveraged for optimization of various system resources in the system of systems, including the optimization of quantum computing resources, traditional computing resources, energy resources, human resources, robotic fleet resources, smart container fleet resources, I/O bandwidth, storage resources, network bandwidth, attention resources, or the like.

The quantum computing system 3800 may be implemented where a complete range of capabilities are available to or as part of any configured service. Configured quantum computing services may be configured with subsets of these capabilities to perform specific predefined function, produce newly defined functions, or various combinations of both.

Figure 39:
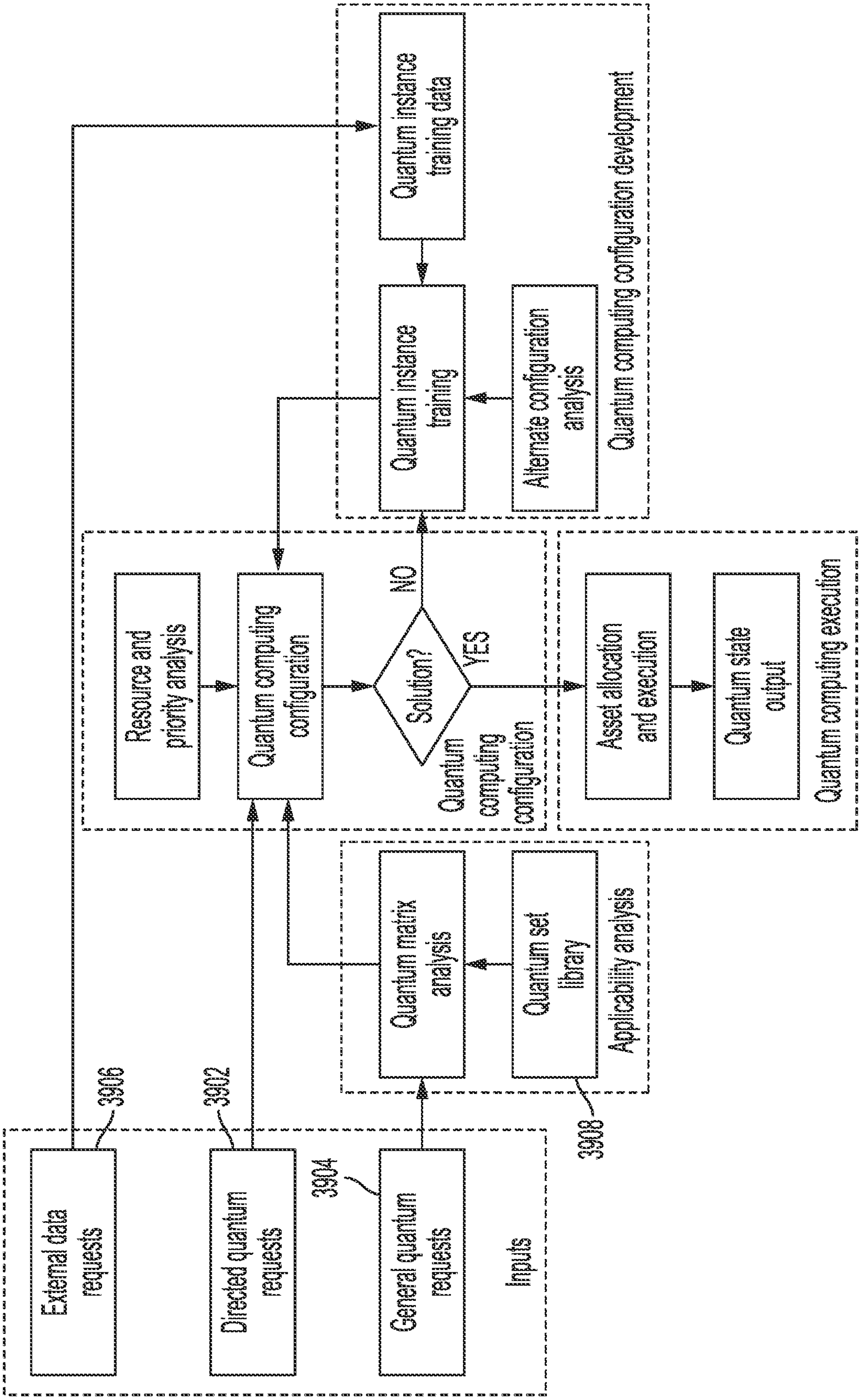
FIG. 39 illustrates quantum computing service request handling according to some embodiments of the present disclosure.

FIG. 39 illustrates quantum computing service request handling according to some embodiments of the present disclosure. A directed quantum computing request 3902 may come from one or more quantum-aware devices or stack of devices, where the request is for known application configured with specific quantum instance(s), quantum computing engine(s), or other quantum computing resources, and where data associated with the request may be preprocessed or otherwise optimized for use with quantum computing.

A general quantum computing request 3904 may come from any system in the system of systems or configured service, where the requestor has determined that quantum computing resources may provide additional value or other improved outcomes. Improved outcomes may also be suggested by the quantum computing service in association with some form of monitoring and analysis. For a general quantum computing request 3904, input data may not be structured or formatted as necessary for quantum computing.

In embodiments, external data requests 3906 may include any available data that may be necessary for training new quantum instances. The sources of such requests could be public data, sensors, ERP systems, and many others.

Incoming operating requests and associated data may be analyzed using a standardized approach that identifies one or more possible sets of known quantum instances, quantum computing engines, or other quantum computing resources that may be applied to perform the requested operation(s). Potential existing sets may be identified in the quantum set library 3908.

In embodiments, the quantum computing system 3800 includes a quantum computing configuration service 3810. The quantum computing configuration service may work alone or with the intelligence service 3834 to select a best available configuration using a resource and priority analysis that also includes the priority of the requestor. The quantum computing configuration service may provide a solution (YES) or determine that a new configuration is required (NO).

In one example, the requested set of quantum computing services may not exist in the quantum set library 3908. In this example, one or more new quantum instances must be developed (trained) with the intelligence service 3834 using available data. In embodiments, alternate configurations may be developed with assistance from the intelligence service 3834 to identify alternate ways to provide all or some of the requested quantum computing services until appropriate resources become available. For example, a quantum/traditional hybrid model may be possible that provides the requested service, but at a slower rate.

In embodiments, alternate configurations may be developed with assistance from the intelligence service 3834 to identify alternate and possibly temporary ways to provide all or some of the requested quantum computing services. For example, a hybrid quantum/traditional model may be possible that provides the requested service, but at a slower rate. This may also include a feedback learning loop to adjust services in real time or to improved stored library elements.

When a quantum computing configuration has been identified and available, it is allocated and programmed for execution and delivery of one or more quantum states (solutions).

Biology-Based Systems, Methods, Kits, and Apparatuses

Figure 40:
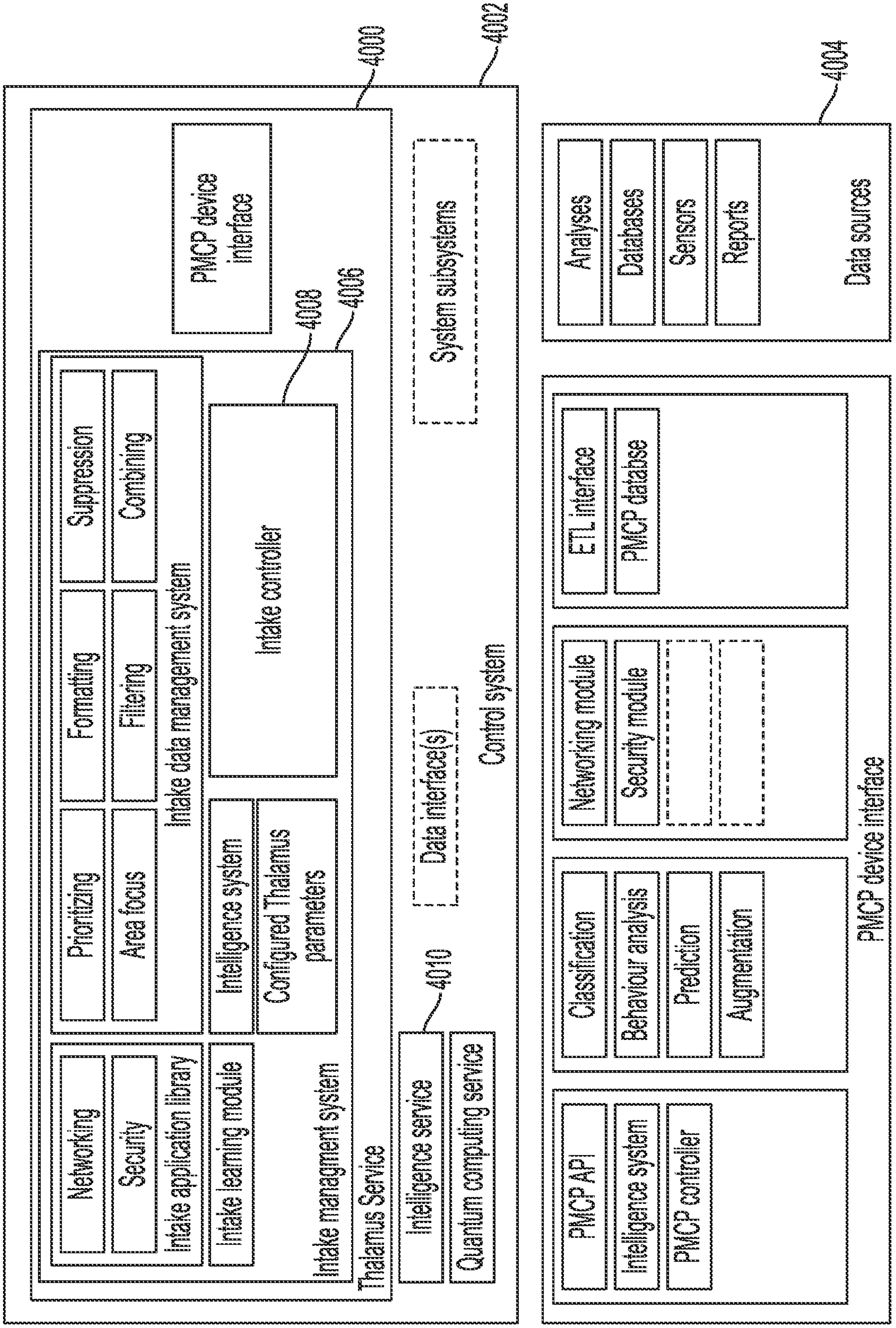
FIG. 40 is a diagrammatic view of a thalamus service and how it coordinates within the modules in accordance with the present disclosure.
Figure 41:
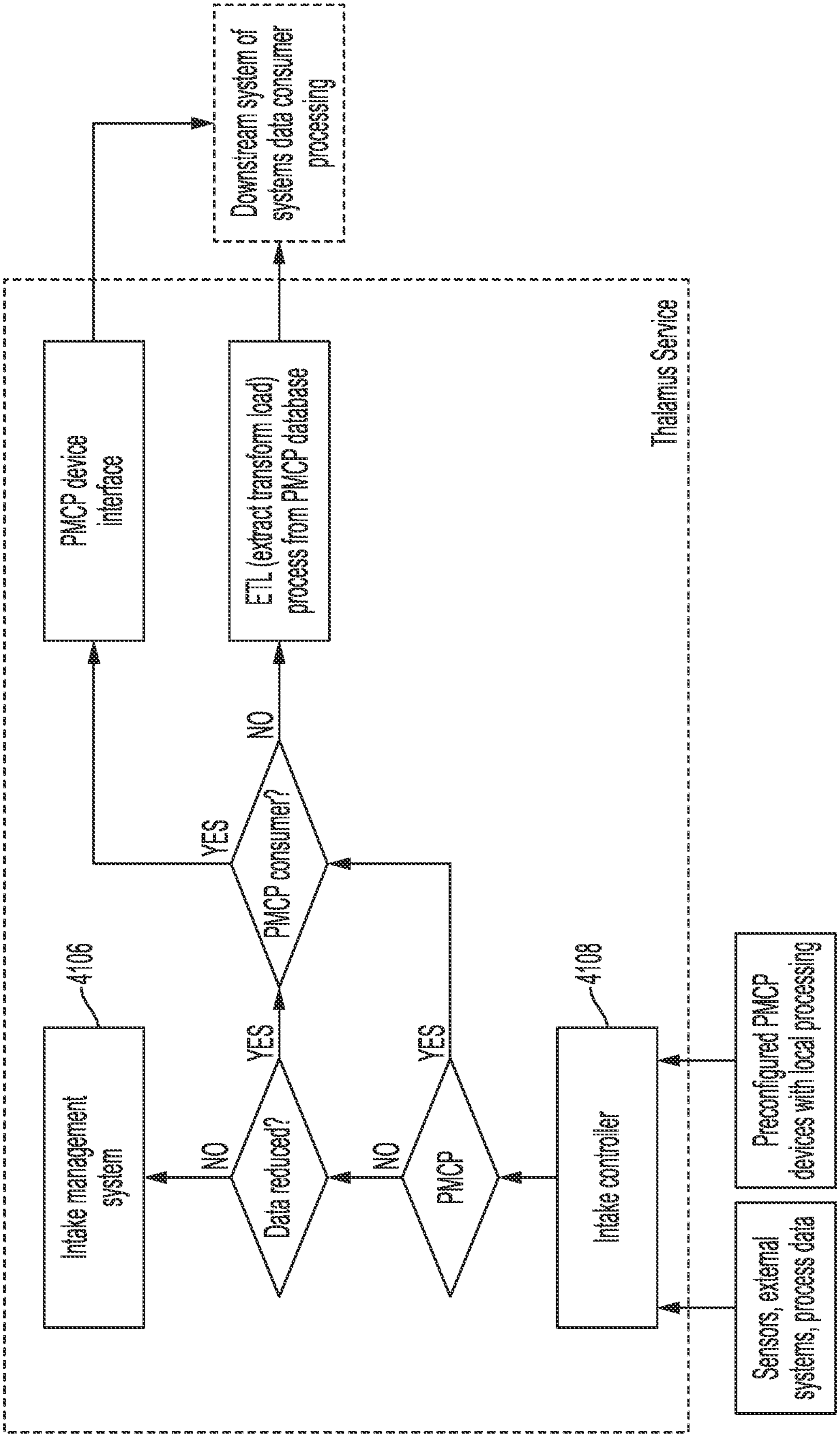
FIG. 41 is another diagrammatic view of a thalamus service and how it coordinates within the modules in accordance with the present disclosure.

FIGS. 40 and 41 together show a thalamus service 4000 and a set of input sensors streaming data from various sources across a system 4002 with its centrally-managed data sources 4004. The thalamus service 4000 filters the into the control system 4002 such that the control system is never overwhelmed by the total volume of information. In embodiments, the thalamus service 4000 provides an information suppression mechanism for information flows within the system. This mechanism monitors all data streams and strips away irrelevant data streams by ensuring that the maximum data flows from all input sensors are always constrained.

The thalamus service 4000 may be a gateway for all communication that responds to the prioritization of the control system 4002. The control system 4002 may decide to change the prioritization of the data streamed from the thalamus service 4000, for example, during a known fire in an isolated area, and the event may direct the thalamus service 4000 to continue to provide flame sensor information despite the fact that majority of this data is not unusual. The thalamus service 4000 may be an integral part of the overall system communication framework.

In embodiments, the thalamus service 4000 includes an intake management system 4006. The intake management system 4006 may be configured to receive and process multiple large datasets by converting them into data streams that are sized and organized for subsequent use by a central control system 4002 operating within one or more systems. For example, a robot may include vision and sensing systems that are used by its central control system 4002 to identify and move through an environment in real time. The intake management system 4006 can facilitate robot decision-making by parsing, filtering, classifying, or otherwise reducing the size and increasing the utility of multiple large datasets that would otherwise overwhelm the central control system 4002. In embodiments, the intake management system may include an intake controller 4008 that works with an intelligence service 4010 to evaluate incoming data and take actions-based evaluation results. Evaluations and actions may include specific instruction sets received by the thalamus service 4000, for example the use of a set of specific compression and prioritization tools stipulated within a "Networking" library module. In another example, thalamus service inputs may direct the use of specific filtering and suppression techniques. In a third example, thalamus service inputs may stipulate data filtering associated with an area of interest such as a certain type of financial transaction. The intake management system is also configured to recognize and manage datasets that are in a vectorized format such as PCMP, where they may be passed directly to central control, or alternatively deconstructed and processed separately. The intake management system 4006 may include a learning module that receives data from external sources that enables improvement and creation of application and data management library modules. In some cases, the intake management system may request external data to augment existing datasets.

In embodiments, the control system 4002 may direct the thalamus service 4000 to alter its filtering to provide more input from a set of specific sources. This indication more input is handled by the thalamus service 4000 by suppressing other information flows based to constrain the total data flows to within a volume the central control system can handle.

The thalamus service 4000 can operate by suppressing data based on several different factors, and in embodiments, the default factor maybe unusualness of the data. This unusualness is a constant monitoring of all input sensors and determining the unusualness of the data.

In some embodiments, the thalamus service 4000 may suppress data based on geospatial factors. The thalamus service 4000 may be aware of the geospatial location of all sensors and is able to look for unusual patterns in data based on geospatial context and suppress data accordingly.

In some embodiments, the thalamus service 4000 may suppress data based on temporal factors. Data can be suppressed temporally, for example, if the cadence of the data can be reduced such that the overall data stream is filtered to level that can be handled by the central processing unit.

In some embodiments, the thalamus service 4000 may suppress data based on contextual factors. In embodiments, context-based filtering is a filtering event in which the thalamus service 4000 is aware of some context-based event. In this context the filtering is made to suppress information flows not relating to the data from the event.

In embodiments, the control system 4002 can override the thalamus filtering and decide to focus on a completely different area for any specific reason.

In embodiments, the system may include a vector module. In embodiments, the vector module may be used to convert data to a vectorized format. In many examples, the conversion of a long sequence of oftentimes similar numbers into a vector, which may include short term future predictions, makes the communication both smaller in size and forward looking in nature. In embodiments, forecast methods may include: moving average; weighted moving average; Kalman filtering; exponential smoothing; autoregressive moving average (ARMA) (forecasts depend on past values of the variable being forecast, and on past prediction errors); autoregressive integrated moving average (ARIMA) (ARMA on the period-to-period change in the forecasted variable); extrapolation; linear prediction; trend estimation (predicting the variable as a linear or polynomial function of time); growth curve (e.g., statistics); and recurrent neural network.

In embodiments, the system may include a predictive model communication protocol (PMCP) system to support vector-based predictive models and a predictive model communication protocol (PMCP). Under the PMCP protocol, instead of traditional streams where individual data items are transmitted, vectors representing how the data is changing or what is the forecast trend in the data is communicated. The PMCP system may transmit actual model parameters and receiving units such that edge devices can apply the vector-based predictive models to determine future states. For example, each automated device in a network could train a regression model or a neural network, constantly fitting the data streams to current input data. All automated devices leveraging the PMCP system would be able to react in advance of events actually happening, rather than waiting for depletion of inventory for an item, for example, to occur. Continuing the example, the stateless automated device can react to the forecast future state and make the necessary adjustments, such as ordering more of the item.

In embodiments, the PMCP system enables communicating vectorized information and algorithms that allow vectorized information to be processed to refine the known information regarding a set of probability-based states. For example, the PMCP system may support communicating the vectorized information gathered at each point of a sensor reading but also adding algorithms that allow the information to be processed. Applied in an environment with large numbers of sensors with different accuracies and reliabilities, the probabilistic vector-based mechanism of the PMCP system allows large numbers, if not all, data streams to combine to produce refined models representing the current state, past states and likely future states of goods. Approximation methods may include importance sampling, and the resulting algorithm is known as a particle filter, condensation algorithm, or Monte Carlo localization.

In embodiments, the vector-based communication of the PMCP system allows future security events to be anticipated, for example, by simple edge node devices that are running in a semi-autonomous way. The edge devices may be responsible for building a set of forecast models showing trends in the data. The parameters of this set of forecast models may be transmitted using the PMCP system.

Security systems are constantly looking for vectors showing change in state, as unusual events tend to trigger multiple vectors to show unusual patterns. In a security setting, seeing multiple simultaneous unusual vectors may trigger escalation and a response by, for example, the control system. In addition, one of the major areas of communication security concern is around the protection of stored data, and in a vector-based system data does not need to be stored, and so the risk of data loss is simply removed.

In embodiments, PMCP data can be directly stored in a queryable database where the actual data is reconstructed dynamically in response to a query. In some embodiments, the PMCP data streams can be used to recreate the fine-grained data so they become part of an Extract Transform and Load (ETL) process.

In embodiments where there are edge devices with very limited capacities, additional edge communication devices can be added to convert the data into PMCP format. For example, to protect distributed medical equipment from hacking attempts many manufacturers will choose to not connect the device to any kind of network. To overcome this limitation, the medical equipment may be monitored using sensors, such as cameras, sound monitors, voltage detectors for power usage, chemical sniffers, and the like. Functional unit learning and other data techniques may be used to determine the actual usage of the medical equipment detached from the network functional unit.

Communication using vectorized data allows for a constant view of likely future states. This allows the future state to be communicated, allowing various entities to respond ahead of future state requirements without needing access to the fine-grained data.

In embodiments, the PMCP protocol can be used to communicate relevant information about production levels and future trends in production. This PMCP data feed, with its built-in data obfuscation allows real contextual information about production levels to be shared with consumers, regulators, and other entities without requiring sensitive data to be shared. For example, when choosing to purchase a new car, if there is an upcoming shortage of red paint then the consumer could be encouraged to choose a different color in order to maintain a desired delivery time. PMCP and vector data enables simple data informed interactive systems that user can apply without having to build enormously complex big data engines. As an example, an upstream manufacturer has an enormously complex task of coordinating many downstream consumption points. Through the use of PMCP, the manufacturer is able to provide real information to consumers without the need to store detailed data and build complex models.

In embodiments, edge device units may communicate via the PMCP system to show direction of movement and likely future positions. For example, a moving robot can communicate its likely track of future movement.

In embodiments, the PMCP system enables visual representations of vector-based data (e.g., via a user interface), highlighting of areas of concern without the need to process enormous volumes of data. The representation allows for the display of many monitored vector inputs. The user interface can then display information relating to the key items of interest, specifically vectors showing areas of unusual or troublesome movement. This mechanism allows sophisticated models that are built at the edge device edge nodes to feed into end user communications in a visually informative way.

Functional units produce a constant stream of "boring" data. By changing from producing data, to being monitored for problems, issues with the logistical modules are highlighted without the need for scrutiny of fine-grained data. In embodiments, the vectorizing process could constantly manage a predictive model showing future state. In the context of maintenance, these changes to the parameters in the predictive model are in and of themselves predictors of change in operational parameters, potentially indicating the need for maintenance. In embodiments, functional areas are not always designed to be connected, but by allowing for an external device to virtually monitor devices, functional areas that do not allow for connectivity can become part of the information flow in the goods. This concept extends to allow functional areas that have limited connectivity to be monitored effectively by embellishing their data streams with vectorized monitored information. Placing an automated device in the proximity of the functional unit that has limited or no connectivity allows capture of information from the devices without the requirement of connectivity. There is also potential to add training data capture functional units for these unconnected or limitedly connected functional areas. These training data capture functional units are typically quite expensive and can provide high quality monitoring data, which is used as an input into the proximity edge device monitoring device to provide data for supervised learning algorithms.

Oftentimes, locations are laden with electrical interference, causing fundamental challenges with communications. The traditional approach of streaming all the fine-grained data is dependent on the completeness of the data stream. For example, if an edge device was to go offline for 10 minutes, the streaming data and its information would be lost. With vectorized communication, the offline unit continues to refine the predictive model until the moment when it reconnects, which allows the updated model to be transmitted via the PMCP system.

In embodiments, systems and devices may be based on the PMCP protocol. For example, cameras and vision systems (e.g., liquid lens systems), user devices, sensors, robots, smart containers, and the like may use PMCP and/or vector-based communication. By using vector-based cameras, for example, only information relating to the movement of items is transmitted. This reduces the data volume and by its nature filters information about static items, showing only the changes in the images and focusing the data communication on elements of change. The overall shift in communication to communication of change is similar to how the human process of sight functions, where stationary items are not even communicated to the higher levels of the brain.

Radio Frequency Identification allows for massive volumes of mobile tags to be tracked in real-time. In embodiments, the movement of the tags may be communicated as vector information via the PMCP protocol, as this form of communication is naturally suited to handing information regarding the location of tag within the goods. Adding the ability to show future state of the location using predictive models that can use paths of prior movement allows the goods to change the fundamental communication mechanism to one where units consuming data streams are consuming information about the likely future state of the goods. In embodiments, each tagged item may be represented as a probability-based location matrix showing the likely probability of the tagged item being at a position in space. The communication of movement shows the transformation of the location probability matrix to a new set of probabilities. This probabilistic locational overview provides for constant modeling of areas of likely intersection of moving units and allows for refinement of the probabilistic view of the location of items. Moving to a vector-based probability matrix allows units to constantly handle the inherent uncertainty in the measurement of status of various items, entities, and the like. In embodiments, status includes, but is not limited to, location, temperature, movement and power consumption.

In embodiments, continuous connectivity is not required for continuous monitoring of sensor inputs in a PMCP-based communication system. For example, a mobile robotic device with a plurality of sensors will continue to build models and predictions of data streams while disconnected from the network, and upon reconnection, the updated models are communicated. Furthermore, other systems or devices that use input from the monitored system or device can apply the best known, typically last communicated, vector predictions to continue to maintain a probabilistic understanding of the states of the goods.

Conclusion

The background description is presented simply for context, and is not necessarily well-understood, routine, or conventional. Further, the background description is not an admission of what does or does not qualify as prior art. In fact, some or all of the background description may be work attributable to the named inventors that is otherwise unknown in the art.

Certain operations described herein include interpreting, receiving, and/or determining one or more values, parameters, inputs, data, or other information ("receiving data"). Operations to receive data include, without limitation: receiving data via a user input; receiving data over a network of any type; reading a data value from a memory location in communication with the receiving device; utilizing a default value as a received data value; estimating, calculating, or deriving a data value based on other information available to the receiving device; and/or updating any of these in response to a later received data value. In certain embodiments, a data value may be received by a first operation, and later updated by a second operation, as part of the receiving a data value. For example, when communications are down, intermittent, or interrupted, a first receiving operation may be performed, and when communications are restored an updated receiving operation may be performed.

Certain logical groupings of operations herein, for example methods or procedures of the current disclosure, are provided to illustrate aspects of the present disclosure. Operations described herein are schematically described and/or depicted, and operations may be combined, divided, re-ordered, added, or removed in a manner consistent with the disclosure herein. It is understood that the context of an operational description may require an ordering for one or more operations, and/or an order for one or more operations may be explicitly disclosed, but the order of operations should be understood broadly, where any equivalent grouping of operations to provide an equivalent outcome of operations is specifically contemplated herein. For example, if a value is used in one operational step, the determining of the value may be required before that operational step in certain contexts (e.g., where the time delay of data for an operation to achieve a certain effect is important), but may not be required before that operation step in other contexts (e.g., where usage of the value from a previous execution cycle of the operations would be sufficient for those purposes). Accordingly, in certain embodiments an order of operations and grouping of operations as described is explicitly contemplated herein, and in certain embodiments re-ordering, subdivision, and/or different grouping of operations is explicitly contemplated herein.

Physical (such as spatial and/or electrical) and functional relationships between elements (for example, between modules, circuit elements, semiconductor layers, etc.) are described using various terms. Unless explicitly described as being “direct,” when a relationship between first and second elements is described, that relationship encompasses both (i) a direct relationship where no other intervening elements are present between the first and second elements and (ii) an indirect relationship where one or more intervening elements are present between the first and second elements.

Example relationship terms include “adjoining,” “transmitting,” “receiving,” “connected,” “engaged,” “coupled,” “adjacent,” “next to,” “on top of,” “above,” “below,” “abutting,” and “disposed.”

The detailed description includes specific examples for illustration only, and not to limit the disclosure or its applicability. The examples are not intended to be an exhaustive list, but instead simply demonstrate possession by the inventors of the full scope of the currently presented and envisioned future claims. Variations, combinations, and equivalents of the examples are within the scope of the disclosure.

No language in the specification should be construed as indicating that any non-claimed element is essential or critical to the practice of the disclosure.

The term “exemplary” simply means “example” and does not indicate a best or preferred example.

The term “set” does not necessarily exclude the empty set—in other words, in some circumstances a “set” may have zero elements. The term “non-empty set” may be used to indicate exclusion of the empty set—that is, a non-empty set must have one or more elements.

The term “subset” does not necessarily require a proper subset. In other words, a “subset” of a first set may be coextensive with (equal to) the first set. Further, the term “subset” does not necessarily exclude the empty set—in some circumstances a “subset” may have zero elements.

The phrase “at least one of A, B, and C” should be construed to mean a logical (A OR B OR C), using a non-exclusive logical OR, and should not be construed to mean “at least one of A, at least one of B, and at least one of C.”

The use of the terms “a,” “an,” “the,” and similar referents in the context of describing the disclosure and claims encompasses both the singular and the plural, unless contradicted explicitly or by context.

Unless otherwise specified, the terms “comprising,” “having,” “with,” “including,” and “containing,” and their variants, are open-ended terms, meaning “including, but not limited to.”

Each publication referenced in this disclosure, including foreign and domestic patent applications and patents, is hereby incorporated by reference in its entirety.

Although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of multiple embodiments remain within the scope of this disclosure.

One or more elements (for example, steps within a method, instructions, actions, or operations) may be executed in a different order (and/or concurrently) without altering the principles of the present disclosure.

Unless technically infeasible, elements described as being in series may be implemented partially or fully in parallel. Similarly, unless technically infeasible, elements described as being in parallel may be implemented partially or fully in series.

While the disclosure describes structures corresponding to claimed elements, those elements do not necessarily invoke a means plus function interpretation unless they explicitly use the signifier “means for.”

While the drawings divide elements of the disclosure into different functional blocks or action blocks, these divisions are for illustration only. According to the principles of the present disclosure, functionality can be combined in other ways such that some or all functionality from multiple, separately depicted blocks can be implemented in a single functional block; similarly, functionality depicted in a single block may be separated into multiple blocks.

Unless explicitly stated as mutually exclusive, features depicted in different drawings can be combined consistent with the principles of the present disclosure.

In the drawings, reference numbers may be reused to identify identical elements or may simply identify elements that implement similar functionality.

Numbering or other labeling of instructions or method steps is done for convenient reference, not to indicate a fixed order.

In the drawings, the direction of an arrow, as indicated by the arrowhead, generally demonstrates the flow of information (such as data or instructions) that is of interest to the illustration. For example, when element A and element B exchange a variety of information, but information transmitted from element A to element B is relevant to the illustration, the arrow may point from element A to element B. This unidirectional arrow does not imply that no other information is transmitted from element B to element A. As just one example, for information sent from element A to element B, element B may send requests and/or acknowledgements to element A.

Unless otherwise indicated, recitations of ranges of values are merely intended to serve as a shorthand way of referring individually to each separate value falling within the range, and each separate value is hereby incorporated into the specification as if it were individually recited.

Special-Purpose Systems

A special-purpose system includes hardware and/or software and may be described in terms of an apparatus, a method, or a computer-readable medium. In various embodiments, functionality may be apportioned differently between software and hardware. For example, some functionality may be implemented by hardware in one embodiment and by software in another embodiment. Further, software may be encoded by hardware structures, and hardware may be defined by software, such as in software-defined networking or software-defined radio.

In this application, including the claims, the term module refers to a special-purpose system. The module may be implemented by one or more special-purpose systems. The one or more special-purpose systems may also implement some or all of the other modules.

In this application, including the claims, the term "module" may be replaced with the terms "controller" or "circuit."

In this application, including the claims, the term platform refers to one or more modules that offer a set of functions.

In this application, including the claims, the term system may be used interchangeably with module or with the term special-purpose system.

The special-purpose system may be directed or controlled by an operator. The special-purpose system may be hosted by one or more of assets owned by the operator, assets leased by the operator, and third-party assets. The assets may be referred to as a private, community, or hybrid cloud computing network or cloud computing environment.

For example, the special-purpose system may be partially or fully hosted by a third-party offering software as a service (SaaS), platform as a service (PaaS), and/or infrastructure as a service (IaaS).

The special-purpose system may be implemented using agile development and operations (DevOps) principles. In embodiments, some or all of the special-purpose system may be implemented in a multiple-environment architecture. For example, the multiple environments may include one or more production environments, one or more integration environments, one or more development environments, etc.

Device Examples

A special-purpose system may be partially or fully implemented using or by a mobile device. Examples of mobile devices include navigation devices, cell phones, smart phones, mobile phones, mobile personal digital assistants, palmtops, netbooks, pagers, electronic book readers, tablets, music players, etc.

A special-purpose system may be partially or fully implemented using or by a network device. Examples of network devices include switches, routers, firewalls, gateways, hubs, base stations, access points, repeaters, head-ends, user equipment, cell sites, antennas, towers, etc.

A special-purpose system may be partially or fully implemented using a computer having a variety of form factors and other characteristics. For example, the computer may be characterized as a personal computer, as a server, etc. The computer may be portable, as in the case of a laptop, netbook, etc. The computer may or may not have any output device, such as a monitor, line printer, liquid crystal display (LCD), light emitting diodes (LEDs), etc. The computer may or may not have any input device, such as a keyboard, mouse, touchpad, trackpad, computer vision system, barcode scanner, button array, etc. The computer may run a general-purpose operating system, such as the WINDOWS operating system from Microsoft Corporation, the MACOS operating system from Apple, Inc., or a variant of the LINUX operating system.

Examples of servers include a file server, print server, domain server, internet server, intranet server, cloud server, infrastructure-as-a-service server, platform-as-a-service server, web server, secondary server, host server, distributed server, failover server, and backup server.

Hardware

The term "hardware" encompasses components such as processing hardware, storage hardware, networking hardware, and other general-purpose and special-purpose components. Note that these are not mutually exclusive categories. For example, processing hardware may integrate storage hardware and vice versa.

Examples of a component are integrated circuits (ICs), application specific integrated circuit (ASICs), digital circuit elements, analog circuit elements, combinational logic circuits, gate arrays such as field programmable gate arrays (FPGAs), digital signal processors (DSPs), complex programmable logic devices (CPLDs), etc.

Multiple components of the hardware may be integrated, such as on a single die, in a single package, or on a single printed circuit board or logic board. For example, multiple components of the hardware may be implemented as a system-on-chip. A component, or a set of integrated components, may be referred to as a chip, chipset, chiplet, or chip stack.

Examples of a system-on-chip include a radio frequency (RF) system-on-chip, an artificial intelligence (AI) system-on-chip, a video processing system-on-chip, an organ-on-chip, a quantum algorithm system-on-chip, etc.

The hardware may integrate and/or receive signals from sensors. The sensors may allow observation and measurement of conditions including temperature, pressure, wear, light, humidity, deformation, expansion, contraction, deflection, bending, stress, strain, load-bearing, shrinkage, power, energy, mass, location, temperature, humidity, pressure, viscosity, liquid flow, chemical/gas presence, sound, and air quality. A sensor may include image and/or video capture in visible and/or non-visible (such as thermal) wavelengths, such as a charge-coupled device (CCD) or complementary metal-oxide semiconductor (CMOS) sensor.

Processing Hardware

Examples of processing hardware include a central processing unit (CPU), a graphics processing unit (GPU), an approximate computing processor, a quantum computing processor, a parallel computing processor, a neural network processor, a signal processor, a digital processor, a data processor, an embedded processor, a microprocessor, and a co-processor. The co-processor may provide additional processing functions and/or optimizations, such as for speed or power consumption. Examples of a co-processor include a math co-processor, a graphics co-processor, a communication co-processor, a video co-processor, and an artificial intelligence (AI) co-processor.

Processor Architecture

The processor may enable execution of multiple threads. These multiple threads may correspond to different programs. In various embodiments, a single program may be implemented as multiple threads by the programmer or may be decomposed into multiple threads by the processing hardware. The threads may be executed simultaneously to enhance the performance of the processor and to facilitate simultaneous operations of the application.

A processor may be implemented as a packaged semiconductor die. The die includes one or more processing cores and may include additional functional blocks, such as cache. In various embodiments, the processor may be implemented by multiple dies, which may be combined in a single package or packaged separately.

Networking Hardware

The networking hardware may include one or more interface circuits. In some examples, the interface circuit(s) may implement wired or wireless interfaces that connect, directly or indirectly, to one or more networks. Examples of networks include a cellular network, a local area network (LAN), a wireless personal area network (WPAN), a metropolitan area network (MAN), and/or a wide area network (WAN). The networks may include one or more of point-to-point and mesh technologies. Data transmitted or received by the networking components may traverse the same or different networks. Networks may be connected to each other over a WAN or point-to-point leased lines using technologies such as Multiprotocol Label Switching (MPLS) and virtual private networks (VPNs).

Examples of cellular networks include GSM, GPRS, 3G, 4G, 5G, LTE, and EVDO. The cellular network may be implemented using frequency division multiple access (FDMA) network or code division multiple access (CDMA) network.

Examples of a LAN are Institute of Electrical and Electronics Engineers (IEEE) Standard 802.11-2020 (also known as the WIFI wireless networking standard) and IEEE Standard 802.3-2018 (also known as the ETHERNET wired networking standard).

Examples of a WPAN include IEEE Standard 802.15.4, including the ZIGBEE standard from the ZigBee Alliance. Further examples of a WPAN include the BLUETOOTH wireless networking standard, including Core Specification versions 3.0, 4.0, 4.1, 4.2, 5.0, and 5.1 from the Bluetooth Special Interest Group (SIG).

A WAN may also be referred to as a distributed communications system (DCS). One example of a WAN is the internet.

Storage Hardware

Storage hardware is or includes a computer-readable medium. The term computer-readable medium, as used in this disclosure, encompasses both nonvolatile storage and volatile storage, such as dynamic random-access memory (DRAM). The term computer-readable medium only excludes transitory electrical or electromagnetic signals propagating through a medium (such as on a carrier wave). A computer-readable medium in this disclosure is therefore non-transitory and may also be considered tangible.

Examples

Examples of storage implemented by the storage hardware include a database (such as a relational database or a NoSQL database), a data store, a data lake, a column store, a data warehouse.

Example of storage hardware include nonvolatile memory devices, volatile memory devices, magnetic storage media, a storage area network (SAN), network-attached storage (NAS), optical storage media, printed media (such as bar codes and magnetic ink), and paper media (such as punch cards and paper tape). The storage hardware may include cache memory, which may be collocated with or integrated with processing hardware.

Storage hardware may have read-only, write-once, or read/write properties. Storage hardware may be random access or sequential access. Storage hardware may be location-addressable, file-addressable, and/or content-addressable.

Example of nonvolatile memory devices include flash memory (including NAND and NOR technologies), solid state drives (SSDs), an erasable programmable read-only memory device such as an electrically erasable programmable read-only memory (EEPROM) device, and a mask read-only memory device (ROM).

Example of volatile memory devices include processor registers and random-access memory (RAM), such as static RAM (SRAM), dynamic RAM (DRAM), synchronous DRAM (SDRAM), synchronous graphics RAM (SGRAM), and video RAM (VRAM).

Example of magnetic storage media include analog magnetic tape, digital magnetic tape, and rotating hard disk drive (HDDs).

Examples of optical storage media include a CD (such as a CD-R, CD-RW, or CD-ROM), a DVD, a Blu-ray disc, and an Ultra HD Blu-ray disc.

Examples of storage implemented by the storage hardware include a distributed ledger, such as a permissioned or permissionless blockchain.

Entities recording transactions, such as in a blockchain, may reach consensus using an algorithm such as proof-of-stake, proof-of-work, and proof-of-storage.

Elements of the present disclosure may be represented by or encoded as non-fungible tokens (NFTs). Ownership rights related to the non-fungible tokens may be recorded in or referenced by a distributed ledger.

Transactions initiated by or relevant to the present disclosure may use one or both of fiat currency and cryptocurrencies, examples of which include bitcoin and ether.

Some or all features of hardware may be defined using a language for hardware description, such as IEEE Standard 1364-2005 (commonly called "Verilog") and IEEE Standard 1076-2008 (commonly called "VHDL"). The hardware description language may be used to manufacture and/or program hardware.

A special-purpose system may be distributed across multiple different software and hardware entities. Communication within a special-purpose system and between special-purpose systems may be performed using networking hardware. The distribution may vary across embodiments and may vary over time. For example, the distribution may vary based on demand, with additional hardware and/or software entities invoked to handle higher demand. In various embodiments, a load balancer may direct requests to one of multiple instantiations of the special purpose system. The hardware and/or software entities may be physically distinct and/or may share some hardware and/or software, such as in a virtualized environment. Multiple hardware entities may be referred to as a server rack, server farm, data center, etc.

Software

Software includes instructions that are machine-readable and/or executable. Instructions may be logically grouped into programs, codes, methods, steps, actions, routines, functions, libraries, objects, classes, etc. Software may be stored by storage hardware or encoded in other hardware. Software encompasses (i) descriptive text to be parsed, such as HTML (hypertext markup language), XML (extensible markup language), and JSON (JavaScript Object Notation), (ii) assembly code, (iii) object code generated from source code by a compiler, (iv) source code for execution by an interpreter, (v) bytecode, (vi) source code for compilation and execution by a just-in-time compiler, etc. As examples only, source code may be written using syntax from languages including C, C++, JavaScript, Java, Python, R, etc.

Software also includes data. However, data and instructions are not mutually exclusive categories. In various embodiments, the instructions may be used as data in one or more operations. As another example, instructions may be derived from data.

The functional blocks and flowchart elements in this disclosure serve as software specifications, which can be translated into software by the routine work of a skilled technician or programmer.

Software may include and/or rely on firmware, processor microcode, an operating system (OS), a basic input/output system (BIOS), application programming interfaces (APIs), libraries such as dynamic-link libraries (DLLs), device drivers, hypervisors, user applications, background services, background applications, etc. Software includes native applications and web applications. For example, a web application may be served to a device through a browser using hypertext markup language 5th revision (HTML5).

Software may include artificial intelligence systems, which may include machine learning or other computational intelligence. For example, artificial intelligence may include one or more models used for one or more problem domains.

When presented with many data features, identification of a subset of features that are relevant to a problem domain may improve prediction accuracy, reduce storage space, and increase processing speed. This identification may be referred to as feature engineering. Feature engineering may be performed by users or may only be guided by users. In various implementations, a machine learning system may computationally identify relevant features, such as by performing singular value decomposition on the contributions of different features to outputs.

Examples of the models include recurrent neural networks (RNNs) such as long short-term memory (LSTM), deep learning models such as transformers, decision trees, support-vector machines, genetic algorithms, Bayesian networks, and regression analysis. Examples of systems based on a transformer model include bidirectional encoder representations from transformers (BERT) and generative pre-trained transformer (GPT).

Training a machine-learning model may include supervised learning (for example, based on labelled input data), unsupervised learning, and reinforcement learning. In various embodiments, a machine-learning model may be pre-trained by their operator or by a third party.

Problem domains include nearly any situation where structured data can be collected, and includes natural language processing (NLP), computer vision (CV), classification, image recognition, etc.

Architectures

Some or all of the software may run in a virtual environment rather than directly on hardware. The virtual environment may include a hypervisor, emulator, sandbox, container engine, etc. The software may be built as a virtual machine, a container, etc. Virtualized resources may be controlled using, for example, a DOCKER™ container platform, a pivotal cloud foundry (PCF) platform, etc.

In a client-server model, some of the software executes on first hardware identified functionally as a server, while other of the software executes on second hardware identified functionally as a client. The identity of the client and server is not fixed: for some functionality, the first hardware may act as the server while for other functionality, the first hardware may act as the client. In different embodiments and in different scenarios, functionality may be shifted between the client and the server. In one dynamic example, some functionality normally performed by the second hardware is shifted to the first hardware when the second hardware has less capability. In various embodiments, the term "local" may be used in place of "client," and the term "remote" may be used in place of "server."

Some or all of the software may be logically partitioned into microservices. Each microservice offers a reduced subset of functionality. In various embodiments, each microservice may be scaled independently depending on load, either by devoting more resources to the microservice or by instantiating more instances of the microservice. In various embodiments, functionality offered by one or more microservices may be combined with each other and/or with other software not adhering to a microservices model.

Some or all of the software may be arranged logically into layers. In a layered architecture, a second layer may be logically placed between a first layer and a third layer. The first layer and the third layer would then generally interact with the second layer and not with each other. In various embodiments, this is not strictly enforced—that is, some direct communication may occur between the first and third layers.

The invention claimed is:

1. An artificial-intelligence-based (AI-based) platform for enabling intelligent orchestration and management of power and energy, the AI-based platform comprising:
- an artificial intelligence system including,
  - memory hardware configured to store computer-executable instructions; and
  - processor hardware configured to execute the computer-executable instructions, wherein the computer-executable instructions-include,
    - performing an analysis of a pattern of energy associated with a charging plan for a set of electric vehicles, wherein the set of electric vehicles is at least partially independent of an electrical grid; and
    - outputting a set of operating parameters to provision at least one of energy generation, energy storage, or energy consumption to enable the charging plan,
- wherein,
  - the set of operating parameters is based on the analysis,
  - the enabling the charging plan includes automatically routing a first electric vehicle of the set of electric vehicles to a charging station that satisfies both an energy-related objective and an operational objective, and
  - the enabling the charging plan includes automatically routing a first distributed energy resource of a set of distributed energy resources to the charging station to deliver energy to the first electric vehicle.

2. The AI-based platform of claim 1, wherein at least one operating parameter in the set of operating parameters is a generation output level for a distributed energy generation resource.

3. The AI-based platform of claim 1, wherein at least one operating parameter in the set of operating parameters is a target storage level for a distributed energy storage resource.

4. The AI-based platform of claim 1, wherein at least one operating parameter in the set of operating parameters is a delivery timing for a distributed energy delivery resource.

5. The AI-based platform of claim 1, wherein:
- the artificial intelligence system is further configured to adapt a transport of data over at least one of a network or a communication system, and
- the adapting is based on at least one of:
  - a congestion condition,
  - a delay condition,
  - a latency condition,
  - a packet loss condition,
  - an error rate condition,
  - a cost of transport condition,
  - a quality-of-service (QOS) condition,
  - a usage condition,
  - a market factor condition, or
  - a user configuration condition.

6. The AI-based platform of claim 1, further comprising an adaptive energy digital twin that represents at least one of:
- an energy stakeholder entity,
- an energy distribution resource,
- a stakeholder information technology,
- a networking infrastructure entity, an energy-dependent stakeholder production facility,
a stakeholder transportation system,
a market condition, or
an energy usage priority condition.

7. The AI-based platform of claim 1, further comprising an adaptive energy digital twin that is configured to perform at least one of:
providing a visual indicator of energy consumption by at least one energy consumer,
providing an analytic indicator of energy consumption by at least one energy consumer,
filtering energy data,
highlighting energy data,
adjusting energy data,
generating a visual indicator of energy consumption by at least one of:
at least one machine,
at least one factory, or
at least one vehicle in a vehicle fleet, or
generating an analytic indicator of energy consumption by at least one of:
at least one machine,
at least one factory, or
at least one vehicle in a vehicle fleet.

8. The AI-based platform of claim 1, wherein the artificial intelligence system is further configured to perform at least one of:
extracting energy-related data,
detecting errors in energy-related data,
correcting errors in energy-related data,
transforming energy-related data,
converting energy-related data,
normalizing energy-related data,
cleansing energy-related data,
parsing energy-related data,
detecting patterns in energy-related data,
detecting content in energy-related data,
detecting objects in energy-related data,
compressing energy-related data,
streaming energy-related data,
filtering energy-related data,
loading energy-related data,
storing energy-related data,
routing energy-related data,
transporting energy-related data, or
maintaining security of energy-related data.

9. The AI-based platform of claim 1, wherein at least one operating parameter in the set of operating parameters is based on at least one of
a public data resource that includes at least one of:
a weather data resource,
a satellite data resource,
a census data resource,
a population data resource,
a demographic data resource,
a psychographic data resource,
a market data resource, or
an ecommerce data resource, or
an enterprise data resource that includes at least one of:
resource planning data,
sales data,
marketing data,
financial planning data,
demand planning data,
supply chain data,
procurement data,
pricing data,
customer data,
product data, or
operating data.

10. The AI-based platform of claim 1, wherein:
the artificial intelligence system is trained based on a training data set, and
the training data set is based on at least one of:
at least one human tag,
at least one human label,
at least one human interaction with a hardware system,
at least one human interaction with a software system,
at least one outcome,
at least one AI-generated training data sample,
a supervised learning training process,
a semi-supervised learning training process, or
a deep learning training process.

11. The AI-based platform of claim 1, wherein:
the artificial intelligence system is configured to orchestrate delivery of energy to at least one point of consumption, and
the delivery of the energy includes at least one of:
at least one fixed transmission line,
at least one instance of wireless energy transmission,
at least one delivery of fuel, or
at least one delivery of stored energy.

12. The AI-based platform of claim 1, wherein:
the artificial intelligence system is further configured to record, in at least one of a distributed ledger or a blockchain, an energy-related event, and
the energy-related event includes at least one of:
an energy purchase event,
an energy sale event,
a service charge associated with an energy purchase event,
a service charge associated with an energy sale event,
an energy consumption event,
an energy generation event,
an energy distribution event,
an energy storage event,
a carbon emission production event,
a carbon emission abatement event,
a renewable energy credit event,
a pollution production event, or
a pollution abatement event.

13. The AI-based platform of claim 1, wherein:
the artificial intelligence system is deployed in an off-grid environment, and
the off-grid environment includes at least one of:
an off-grid energy generation system,
an off-grid energy storage system, or
an off-grid energy mobilization system.

14. The AI-based platform of claim 1, wherein the artificial intelligence system is further configured to determine an environmental impact of at least one of a carbon generation or a carbon emission associated with the charging plan on an area that is associated with the charging plan.

15. The AI-based platform of claim 1, wherein the artificial intelligence system is further configured to evaluate a compliance of the charging plan with at least one of:
a carbon generation policy,
a carbon emissions policy, or
a set of labor standards associated with the charging plan.

16. The AI-based platform of claim 1, wherein the artificial intelligence system is further configured to adjust the set of operating parameters to provision at least one of energy generation, energy storage, or energy consumption associated with the charging plan based on at least one of:

a carbon generation policy,
a carbon emissions policy, or
a set of labor standards associated with the charging plan.

17. The AI-based platform of claim 1, wherein,
the artificial intelligence system is further configured to transmit a message to at least one edge device of a set of edge devices that is associated with the charging plan, and
the message includes a request to adjust at least one operation of the at least one edge device based on the set of operating parameters.

18. The AI-based platform of claim 1, wherein:
the artificial intelligence system is further configured to receive, from at least one edge device of a set of edge devices that are associated with the charging plan, an indicator of at least one of a current energy status or a predicted energy status of the at least one edge device, and
the set of operating parameters is based on the indicator.

19. The AI-based platform of claim 1, wherein,
the artificial intelligence system is further configured to determine the set of operating parameters based on an output of a digital twin that represents at least one edge device of a set of edge devices that is associated with the charging plan, and
the output of the digital twin indicates at least one of a current energy status or a predicted energy status of the at least one edge device.

20. The AI-based platform of claim 1, wherein:
the artificial intelligence system is further configured to orchestrate a set of modular, distributed energy systems to at least one of generate, store, or deliver energy, and
the orchestrating is based on the set of operating parameters and local demand requirements.

21. The AI-based platform of claim 1, further comprising:
a smart contract system configured to handle a set of smart contracts,
wherein the automatically routing the first distributed energy resource to the charging station is governed by at least one smart contract of the set of smart contracts.

22. The AI-based platform of claim 1, wherein the enabling the charging plan includes, in order to align arrival times of the first electric vehicle and the first distributed energy resource at the charging station, coordinating
(i) the automatically routing the first electric vehicle to the charging station and
(ii) the automatically routing the first distributed energy resource to the charging station.

23. A method of controlling an artificial-intelligence-based (AI-based) platform to enable intelligent orchestration and management of power and energy, the method comprising:
performing an analysis of a pattern of energy associated with a charging plan for a set of electric vehicles, wherein the set of electric vehicles is at least partially independent of an electrical grid;
outputting a set of operating parameters to provision at least one of energy generation, energy storage, or energy consumption to enable the charging plan, wherein the set of operating parameters is based on the analysis;
automatically routing a first electric vehicle of the set of electric vehicles to a charging station that satisfies both an energy-related objective and an operational objective; and
automatically routing a first distributed energy resource of a set of distributed energy resources to the charging station to deliver energy to the first electric vehicle.

24. The method of claim 23, wherein at least one operating parameter in the set of operating parameters is a generation output level for a distributed energy generation resource.

* * * * *